US007973571B2

(12) United States Patent
Sato et al.

(10) Patent No.: US 7,973,571 B2
(45) Date of Patent: Jul. 5, 2011

(54) MULTICHANNEL DRIVE CIRCUIT

(75) Inventors: Tatsumi Sato, Hayami-gun (JP); Kazuhiko Maki, Hayami-gun (JP); Toshiyuki Wada, Hayami-gun (JP); Takamasa Yanai, Hayami-gun (JP)

(73) Assignee: Hiji High-Tech Co., Ltd., Oita (JP)

( * ) Notice: Subject to any disclaimer, the term of this patent is extended or adjusted under 35 U.S.C. 154(b) by 272 days.

(21) Appl. No.: 11/660,977

(22) PCT Filed: Nov. 20, 2006

(86) PCT No.: PCT/JP2006/323084

§ 371 (c)(1), (2), (4) Date: Feb. 10, 2009

(87) PCT Pub. No.: WO2007/040285

PCT Pub. Date: Apr. 12, 2007

(65) Prior Publication Data

US 2009/0302898 A1 Dec. 10, 2009

(30) Foreign Application Priority Data

Feb. 15, 2006 (JP) ................................ 2006-038273
May 30, 2006 (WO) .................. PCT/JP2006/310753

(51) Int. Cl.
*H03B 1/00* (2006.01)

(52) U.S. Cl. ......................... 327/108; 327/111; 327/427

(58) Field of Classification Search .................. 327/108, 327/109, 111, 427, 434; 326/82, 83; 345/76, 345/80
See application file for complete search history.

(56) References Cited

U.S. PATENT DOCUMENTS 7,046,073 B2 * 5/2006 Mayama et al. .............. 327/434
7,586,469 B2 * 9/2009 Fujisawa et al. ................ 345/76
2005/0259050 A1 * 11/2005 Fujisawa et al. ................ 345/76

FOREIGN PATENT DOCUMENTS

| | | |
|---|---|---|
| JP | 11-42809 | 2/1999 |
| JP | 2000-39868 | 2/2000 |
| JP | 2001-138567 | 5/2001 |
| JP | 2003-66904 | 3/2003 |
| JP | 2004-29528 | 1/2004 |
| JP | 2004-181678 | 7/2004 |
| JP | 2004-258643 | 9/2004 |
| JP | 2004-312061 | 11/2004 |

OTHER PUBLICATIONS

Later publication of amended claims for WO 03/038797 A1; May 8, 2003; *English abstract is attached.*

* cited by examiner

*Primary Examiner* — Long Nguyen
(74) *Attorney, Agent, or Firm* — Edwards Angell Palmer & Dodge LLP

(57) ABSTRACT

The invention provides a multichannel drive circuit by which, even when there occurs a variation between channels in circuit characteristics of each channel including current source due to the semiconductor manufacturing process and the like, loads of each channel constituting a load array can be driven under conditions uniform between all the channels. The invention includes; an interchannel common connection line (5) for making conduction between respective current paths of each channel for connecting the respective current sources of each channel constituting a current source array (11) with respective input switches of each channel constituting an input switch array (13); and current blocking means (12) for blocking output current of the current source of that channel of the plurality of channels in which the input switch is in an OFF state from flowing into the interchannel common connection line.

17 Claims, 28 Drawing Sheets

Fig.27 -- Prior Art --

-- Prior Art --

MULTICHANNEL DRIVE CIRCUIT

TECHNICAL FIELD

The present invention relates to a multichannel drive circuit appropriate for driving of an arrayed load such as a horizontal pixel line of various types of flat panel displays or a printing dot line of printer head, and more particularly to a multichannel drive circuit by which, even when there is a variation in circuit characteristics between channels due to manufacturing process or the like, loads of each channel can be driven under uniform conditions.

BACKGROUND ART

There have hitherto been known multichannel drive circuits for driving an arrayed load (hereinafter referred to as a load array) such as a horizontal pixel line of various types of flat panel displays (for example, liquid crystal display, organic EL display) or a printing dot line of printer head (for example, refer to Patent Document 1).

A configuration diagram (positive drive type) showing an example of conventional multichannel drive circuit is illustrated in FIG. 27. Referring to FIG. 27, reference character 1 denotes a positive side (meaning higher potential side) power source line leading to a positive side (meaning higher potential side) power source VDD; 2 denotes a negative side (meaning lower potential side) power source line leading to a negative side (meaning lower potential side) power source VSS; 3 denotes a positive side bias line leading to a positive side bias power source VBH; $\mathbf{10}_k$ to $\mathbf{10}_{k+3}$ denote element circuits of each channel k to k+3; $\mathbf{11}_k$ to $\mathbf{11}_{k+3}$ denote current source transistors of each channel; $\mathbf{13}_k$ to $\mathbf{13}_{k+3}$ denote switch transistors of each channel for turning on/off supplying of electric power to load; $\mathbf{14}_k$ to $\mathbf{14}_{k+3}$ denote switch control signals of each channel; 11 denotes a current source array including a series of current source transistors $\mathbf{11}_k$ to $\mathbf{11}_{k+3}$; 13 denotes a switch array including a series of switch transistors $\mathbf{13}_k$ to $\mathbf{13}_{k+3}$; 30 denotes a bias power source circuit; 40 denotes a load array including a series of loads $\mathbf{40}_k$ to $\mathbf{40}_{k+3}$; $OUT_k$ to $OUT_{k+3}$ denote output terminals of each channel; and 100 denotes a multichannel drive circuit.

In the illustrated example, as the current source transistors $\mathbf{11}_k$ to $\mathbf{11}_{k+3}$ of each channel, there are used p-channel type MOSFETs each having the source terminal and gate terminal thereof connected respectively to the positive side power source line 1 and the positive channel, there are used p-channel type MOSFETs each having the drain terminal and source terminal thereof connected respectively to the output terminal $OUT_k$ to $OUT_{k+3}$ and the drain terminal of the current source transistors $\mathbf{11}_k$ to $\mathbf{11}_{k+3}$, and the gate terminal thereof having the switch control signal $\mathbf{14}_k$ to $\mathbf{14}_{k+3}$ inputted thereto.

As described above, this multichannel drive circuit 100 includes the current source array 11 including a plurality of the current source transistors $\mathbf{11}_k$ to $\mathbf{11}_{k+3}$ corresponding respectively to a plurality of the channels, and a switch array 13 including a plurality of the switch transistors $\mathbf{13}_k$ to $\mathbf{13}_{k+3}$ corresponding respectively to a plurality of the channels k to k+3; and electric power is supplied via the respective switch transistors $\mathbf{13}_k$ to $\mathbf{13}_{k+3}$ of each channel constituting the switch array 13 to the respective loads $\mathbf{40}_k$ to $\mathbf{40}_{k+3}$ of each channel constituting the load array 40 by the respective current source transistors $\mathbf{11}_k$ to $\mathbf{11}_{k+3}$ of each channel constituting the current source array 11.

And the loads $\mathbf{40}_k$ to $\mathbf{40}_{k+3}$ of each channel can be accurately driven according to the accuracy of the current source transistors $\mathbf{11}_k$ to $\mathbf{11}_{k+3}$ by properly setting the on/off period, the duty cycle and the like of the switch control signals $\mathbf{14}_k$ to $\mathbf{14}_{k+3}$ while supplying required current to the loads $\mathbf{40}_k$ to $\mathbf{40}_{k+3}$ of each channel. Here, when the logical state of the switch control signal $\mathbf{14}_k$ to $\mathbf{14}_{k+3}$ is "L", the switch transistor $\mathbf{13}_k$ to $\mathbf{13}_{k+3}$ changes to a conduction state (an ON state); when the logical state is "H", the switch transistor $\mathbf{13}_k$ to $\mathbf{13}_{k+3}$ changes to a non-conduction state (an OFF state).

In FIG. 27, for the convenience of explanation, of a plurality of the channels, only adjoining parts corresponding to four channels are shown; but, the number of channels can be arbitrarily varied in accordance with the number of loads constituting the load array 40. For example, when a horizontal pixel line of flat panel display is assumed as the load array 40, the number of channels is set to approximately 240 to 768 per one chip of LSI.

In the above described multichannel drive circuit, to precisely control the loads $\mathbf{40}_k$ to $\mathbf{40}_{k+3}$ of each channel constituting the load array 40, for example for gamma correction or the like, high-speed clock is needed for controlling the on/off timing of the switch control signals $\mathbf{14}_k$ to $\mathbf{14}_{k+3}$. Consequently, when only the duty cycle, period and the like of the switch control signals $\mathbf{14}_k$ to $\mathbf{14}_{k+3}$ are varied while the set current value of the current sources $\mathbf{11}_k$ to $\mathbf{11}_{k+3}$ of each channel remains temporally fixed, there are limits to precise control of the loads $\mathbf{40}_k$ to $\mathbf{40}_{k+3}$ of each channel.

Thus, there have also been known multichannel drive circuits which use a current source in which its set current value as time passes varies, as the current sources $\mathbf{11}_k$ to $\mathbf{11}_{k+3}$ of each channel constituting the current source array 11 (for example, refer to Patent Document 2).

In this multichannel drive circuit, current sources $\mathbf{11}_k$ to $\mathbf{11}_{k+3}$ of each channel are each constituted of: a plurality of unit current sources having a different weighting value such as one time, two times, quadruple or octuple; and unit switches made to lie respectively in outputs paths of the unit current sources. Output currents of the unit current sources selected via these unit switches are added to generate a desired set current value. As such, there is implemented a modulation type current source in which, when each unit switch turns on/off according to a programmed procedure as time passes, the set current value varies as time passes, while exhibiting a certain profile.

Accordingly, with the multichannel drive circuit using such a modulation type current source, the loads $\mathbf{40}_k$ to $\mathbf{40}_{k+3}$ of each channel can be precisely controlled without significantly speeding up the clock for controlling the timing of the switch control signals $\mathbf{14}_k$ to $\mathbf{14}_{k+3}$.

Patent Document 1: Japanese Patent Laid-Open No. 2004-29528

Patent Document 2: Japanese Patent Laid-Open No. 2000-39868

DISCLOSURE OF THE INVENTION

Problems to be Solved by the Invention

However, in the conventional multichannel drive circuit using the above described conventional current source or modulation type current source, there is given an advantage capable of driving the loads of all the channels under uniform conditions thanks to provision of a dedicated current source for each channel, whereas when the set current value itself of each current source is not uniform between the channels due to the semiconductor manufacturing process and the like, it is still difficult to drive the loads of all the channels under uniform conditions, thereby causing a problem.

The above problem will be more specifically described with reference to FIGS. 27 and 28. The output characteristics (ON-period being identical for all the channels) of the conventional multichannel drive circuit are illustrated in FIG. 28.

Here, in FIG. 27, assume that loads $\mathbf{40}_k$ to $\mathbf{40}_{k+3}$ of each channel constituting a load array 40 is a capacitive load and the value (capacitance value) thereof is identical. Also, in this case, assume that current source transistors $\mathbf{11}_k$ to $\mathbf{11}_{k+3}$ of each channel constituting a current source array 11 are a conventional current source in which its set value does not vary as time passes, and there is a variation in set current value $I\mathbf{11}_k$ to $I\mathbf{11}_{k+3}$ ascribable to the semiconductor manufacturing process.

In such state, when switch control signals $\mathbf{14}_k$ to $\mathbf{14}_{k+3}$ having a waveform illustrated in FIG. 28(*a*) are supplied to the gates of switch transistors $\mathbf{13}_k$ to $\mathbf{13}_{k+3}$ of each channel constituting a switch array 13, at the same time as when a time t1 when the logical state of the switch control signals $\mathbf{14}_k$ to $\mathbf{14}_{k+3}$ changes from "H" to "L" is reached, charging of the loads (capacitive load) $\mathbf{40}_k$ to $\mathbf{40}_{k+3}$ of each channel constituting the load array 40 is initiated and then continues until a time t2 when the logical state of the switch control signals $\mathbf{14}_k$ to $\mathbf{14}_{k+3}$ changes from "L" to "H" is reached.

At the same time as the initiation of charging, the potential of output terminals $OUT_k$ to $OUT_{k+3}$ of each channel rises drawing line having an inclination unique to each channel, and then reaches a value different between each channel at the same time when time t2 is reached. In this example, with regard to the amplitude of potential V of each channel, there is a relationship: $V (OUT_{k+1})>V (OUT_{k+3})>V (OUT_k)>V (OUT_{k+2})$.

In this case, if the loads $\mathbf{40}_k$ to $\mathbf{40}_{k+3}$ of each channel are, for example, a voltage-driven capacitive pixel, then the pixels of each channel perform a display operation at a different tone dependent on charging voltage, so a display irregularity emerges on the screen of display panel. That is, even if the capacitance value of pixel is uniform between the channels, a display irregularity ascribable to the multichannel drive circuit side emerges on the screen of display panel.

It will be easily understood that even if the loads $\mathbf{40}_k$ to $\mathbf{40}_{k+3}$ of each channel are a load of resistance properties or a load of diode properties, a variation between the channels occurs in a drive mode or an operating mode according to the load content.

As a typical measure for eliminating such a variation between the channels, there is used a method of increasing the size of the current source transistors $\mathbf{11}_k$ to $\mathbf{11}_{k+3}$ to suppress the variation, a method of adding a current detection circuit to correct output current (for example, refer to Japanese Patent Laid-Open No. 2003-218689) or other methods. However, if such a method is used, the chip size will increase when integrated into LSI, thereby causing an additional problem. Also, using such a method, the degree of variation can be reduced but the variation itself cannot be completely eliminated.

To address the above problem, the present invention has been devised and has an object to provide a multichannel drive circuit by which, even when there occurs a variation between channels in circuit characteristics of each channel including current source due to the semiconductor manufacturing process and the like, loads of each channel constituting a load array can be driven under conditions uniform between all the channels.

Other objects, operations and effects of the present invention will be easily understood by those skilled in the art by referring to the following description of the specification.

Means for Solving the Problems

To achieve the above object, a multichannel drive circuit according to the present invention has the following configuration.

That is, the multichannel drive circuit of the present invention includes: a current source array including a plurality of current sources corresponding respectively to a plurality of channels; and an input switch array including a plurality of input switches corresponding respectively to the plurality of channels, wherein electric power is supplied via the respective input switches of each channel constituting the input switch array to respective loads of each channel constituting a load array by the respective current sources of each channel constituting the current source array.

The multichannel load drive circuit is provided with: an interchannel common connection line for making conduction between respective current paths of each channel for connecting the respective current sources of each channel constituting the current source array with the respective input switches of each channel constituting the input switch array; and current blocking means for blocking output current of the current source of that channel of the plurality of channels in which the input switch is in an OFF state from flowing into the interchannel common connection line.

According to such a circuit configuration, if the resistance value of the interchannel common connection line is preliminarily set sufficiently low, the potential of the above described current paths of all the channels converges to a substantially identical value. As a result, the value of current flowing via the input switches of each channel into the loads of each channel is uniformized, in conjunction with the operation of the current blocking means, to a value obtained by averaging current values flowing in those current sources of all the channels in which the input switch is in an ON state at that moment. Accordingly, even though there is a variation between the channels in the value of current flowing in the current sources constituting the current source array due to the semiconductor manufacturing process and the like, the loads of all the channels can be driven by switch control signals of each channel under uniform conditions.

Further, according to such a circuit configuration, the current blocking means can be implemented with a relative small number of components. Consequently, when the circuit is integrated into LSI, the area occupied on the chip is not so large, thus allowing manufacturing at low cost.

Further, according to such a circuit configuration, conduction between the output terminals of each channel connected to the loads is made via the switches of those channels of each channel in which an ON state and the interchannel common connection line occurs, so current merging or current shunting is automatically performed at intersections between each current source and the interchannel common connection line so that the potential of these intersections becomes identical. As a result, even when there is a variation between the channels in the capacitance value of the respective loads constituting the load array, the charging current value of each channel is automatically adjusted, so the potential of the output terminals of each channel is also uniformized.

The multichannel drive circuit according to the present invention has many embodiments. As one embodiment, the following configuration can be used.

That is, the current source array includes: a positive side current source array including a plurality of positive side current sources corresponding respectively to the plurality of channels; and a negative side current source array including a plurality of negative side current sources corresponding respectively to the plurality of channels. The input switch array includes: a positive side input switch array including a plurality of positive side input switches corresponding respectively to the plurality of channels; and a negative side input switch array including a plurality of negative side input switches corresponding respectively to the plurality of channels.

Positive side supplying of electric power to the respective loads of each channel constituting the load array is performed via the respective positive side input switches of each channel constituting the positive side input switch array by the respective positive side current sources of each channel constituting the positive side current source array. Also, negative side supplying of electric power to the respective loads of each channel constituting the load array is performed via the respective negative side input switches of each channel constituting the negative side input switch by the respective negative side current sources of each channel constituting the negative side current source array.

The interchannel common connection line includes: a positive side interchannel common connection line for making conduction between respective current paths of each channel for connecting the respective positive side current sources of each channel constituting the positive side current source array with the respective positive side input switches of each channel constituting the positive side input switch array; and a negative side interchannel common connection line for making conduction between respective current paths of each channel for connecting the respective negative side current sources of each channel constituting the negative side current source array with the respective negative side input switches of each channel constituting the negative side input switch array.

The current blocking means includes: positive side current blocking means for blocking output current of the positive side current source of that channel of the plurality of channels in which the positive side input switch is in an OFF state from flowing into the interchannel common connection line; and negative side current blocking means for blocking output current of the negative side current source of that channel of the plurality of channels in which the negative side input switch is in an OFF state from flowing into the interchannel common connection line.

According to such a circuit configuration, when the positive side input switch array and the negative side input switch array are alternately turned on/off, currents alternately having a different polarity can be supplied to the loads of each channel. Accordingly, there is provided one appropriate for a load array driven by currents alternately having a different polarity, such as a horizontal pixel line of liquid crystal display panel.

Further, the interchannel common connection lines are provided in both the positive side and negative side, so the currents of both the positive side and negative side supplied to the load are uniformized between the channels. Accordingly, even when there is a variation between the channels in the value of current flowing in the current sources constituting the current source array of either the positive side or the negative side due to the semiconductor manufacturing process and the like, the loads of all the channels can be driven under uniform conditions by the switch control signals of each channel. Further, according to such a circuit configuration, the current blocking means of both the positive side and negative side can be implemented with a relatively small number of components. Consequently, when the circuit is integrated into LSI, the area occupied on the chip is not so large, thus allowing manufacturing at low cost.

As another embodiment of the multichannel drive circuit of the present invention, the following configuration can also be used.

That is, the loads of each channel constituting the load array are constituted of three pixels corresponding respectively to colors R, G and B. The current sources of each channel constituting the current source array are constituted of a current source for applying gamma correction to the R pixel, a current source for applying gamma correction to the G pixel, and a current source for applying gamma correction to the B pixel.

These current sources for applying gamma correction are usually constituted of: a plurality of unit current sources having a different weighting value such as one time, two times, quadruple or octuple; and unit switches made to lie respectively in the outputs paths of the unit current sources. Output currents of the unit current sources selected via these unit switches are added to generate a desired set current value. As such, there is implemented a modulation type current source in which, when each unit switch turns on/off according to a programmed procedure as time passes, the set current value varies as time passes, while exhibiting a certain profile.

The interchannel common connection line includes: a first interchannel common connection line for making connection between the current sources for applying gamma correction to the R pixels; a second interchannel common connection line for making connection between the current sources for applying gamma correction to the G pixels; a third interchannel common connection line for making connection between the current sources for applying gamma correction to the B pixels.

According to such a circuit configuration, the loads of each channel constituting the load array are constituted of three pixels corresponding respectively to colors R, G and B and at the same time, the current sources for applying gamma correction are provided for each RGB pixel. In this case, the interchannel common connection lines are provided for each RGB pixel, so pixel gamma correction can be applied on a per RGB pixel basis under conditions uniform between the channels.

As another embodiment of the multichannel drive circuit of the present invention, the following configuration can also be used.

That is, the current sources of each channel constituting the current array are constituted of a plurality of unit current sources having a different weighting value, and unit switches made to lie in respective outputs paths of the unit current sources; output currents of the unit current sources selected via these unit switches are added to generate a desired set current value, and at the same time, each unit switch turns on/off according to a programmed procedure as time passes, whereby there is implemented a modulation type current source in which the set current value varies as time passes, while exhibiting a certain profile. Further, the interchannel common connection line is constituted of a plurality of interchannel common connection lines, arranged for each weighting value, and making connection between the unit current sources having the same weighting value.

According to such a circuit configuration, when modulation type current sources are used as the current sources of each channel intending to reduce the clock rate, a variation in the unit current source between the channels arranged for each weighting value can be absorbed, thereby improving control accuracy.

It is noted that, in the present invention and each of the above described embodiments, various circuit configurations can be used as the current blocking means.

By way of example, a configuration may be made in which, when the input switch is in an OFF state, the current blocking means blocks current from flowing in the current path for connecting the current source with the interchannel common connection line.

When such a configuration is used, for example, another switch transistor is made to lie in the current path for connecting the current source transistor with the interchannel common connection line, and this switch transistor is made to operate in conjunction with the switch transistor acting as the input switch, whereby the desired configuration can be implemented.

The function of the current blocking means of the present invention can also be interpreted as one permitting the output current of the current source of that channel of the plurality of channels in which the input switch is in an ON state to flow into the interchannel common connection line, while blocking the output current of the current source of that channel of the plurality of channels in which the input switch is in an OFF state from flowing into the interchannel common connection line.

From this, it can be seen that the desired configuration of the above described current blocking means can also be implemented, for example when the current path for connecting the current source transistor with the input transistor, and the interchannel common connection line are isolated/separated from each other and at the same time, another switch transistor (supplementary transistor) is made to lie therebetween, and this supplementary transistor is made to operate in conjunction with the input transistor.

That is, according to such a circuit configuration, when the input transistor is in an ON state, the supplementary transistor also changes to an ON state, and thus conduction between the current path for connecting the current source transistor with the switch transistor and the interchannel common connection line is made, so the output current of the current source of that channel can flow into the interchannel common connection line. In contrast, when the input transistor is in an OFF state, the supplementary transistor also changes to an OFF state, and thus non-conduction between the current path for connecting the current source transistor with the switch transistor and the interchannel common connection line is made, so the output current of the current source of that channel cannot flow into the interchannel common connection line.

As another example, a configuration may be used in which, when the input switch is in an OFF state, the current blocking means disables the current source. When such a configuration is used, for example, separate switch transistors are made to lie respectively between the bias terminal of a transistor acting as the current source and the bias power source, and between the bias terminal thereof and the zero-bias power source, and these two supplementary transistors are made to interlock with the on/off operation of a switch transistor acting as the input switch to operate in an inverted manner, whereby the desired configuration can be implemented.

As still another example, a configuration may be used in which, when the input switch is in an OFF state, the current blocking means causes current flowing in the current source to bypass the input switch to be discharged. When such a configuration is used, for example, a discharging switch transistor and a discharging current source transistor are connected in series in the current path for bypassing the switch transistor acting as the input switch and at the same time, the input transistor and the discharging switch transistor are made to operate in an inverted manner, whereby the desired configuration can be implemented.

The multichannel drive circuit according to the present invention can be implemented as a semiconductor integrated device (LSI chip) including: a current source array including a plurality of current sources corresponding respectively to a plurality of channels; an external terminal array including a plurality of external terminals for connecting a load corresponding respectively to a plurality of channels; an input switch array including a plurality of input switches, made to lie between the current source array and the external terminal array, and corresponding respectively to the plurality of channels; an interchannel common connection line for making conduction between respective current paths of each channel connecting the respective current sources of each channel constituting the current source array and the respective input switches of each channel constituting the input switch array; and current blocking means for blocking output current of the current source of that channel of the plurality of channels in which the input switch is in an OFF state from flowing into the interchannel common connection line. In this case, the interchannel common connection line has a sufficiently large width, and a low-resistance metal substance such as aluminum is used as a material thereof.

According to such a configuration, there can be implemented the semiconductor integrated device which acts as a multichannel drive circuit with satisfactory uniformity between channels and at the same time, is small in chip area and imposes a relatively light burden of management for semiconductor manufacturing process, and can thus be manufactured at low cost.

In this case, when the semiconductor chip constituting the multichannel load drive circuit is housed in a predetermined package, the package may be provided with an external terminal for withdrawing the interchannel common connection line to the outside.

When the multichannel drive circuit is used, for example, as the source driver of a large flat display panel or the like, a plurality of semiconductor integrated devices (LSI chip) acting as the multichannel drive circuit are each assigned with respect to the whole horizontal scanning width of the panel. In this case, if an external terminal for withdrawing the interchannel common connection line to the outside is arranged in the package housing the semiconductor integrated device (LSI chip), only by connecting the external terminals of the adjoining LSI packages by use of an appropriate electric conductor, conduction between the interchannel common connection lines on the semiconductor chips housed in a series of the LSI packages can be made. Accordingly, load drive under uniform conditions is possible not only between the adjoining channels but also between the adjoining LSI packages.

Advantageous Effect of the Invention

According to the present invention, if the resistance value of the interchannel common connection line is preliminarily set sufficiently low, the potential of the above described current paths of all the channels converges to a substantially identical value. As a result, the value of current flowing via the input switches of each channel into the loads of each channel is uniformized, in conjunction with the operation of the current blocking means, to a value obtained by averaging current values flowing in those current sources of all the channels in which the input switch is in an ON state at that moment. Accordingly, even though there is a variation between the channels in the value of current flowing in the current sources constituting the current source array due to the semiconductor manufacturing process and the like, the loads of all the channels can be driven by switch control signals of each channel under uniform conditions.

Further, the current blocking means can be implemented with a relatively small number of components. Consequently, when the circuit is integrated into LSI, the area occupied on the chip is not so large, thus allowing manufacturing at low cost.

Further, according to such a circuit configuration, conduction between the output terminals of each channel connected to the loads is made via the interchannel common connection line and the switches of those channels of each channel in which an ON state occurs. Accordingly, current merging or current shunting is automatically performed at intersections between each current source and the interchannel common connection line so that the potential of these intersections becomes identical. As a result, even when there is a variation between the channels in the capacitance value of the respective loads constituting the load array, the charging current value of each channel is automatically adjusted, so the potential of the output terminals of each channel is also uniformized.

BEST MODE FOR CARRYING OUT THE INVENTION

One preferred embodiment of a multichannel drive circuit according to the present invention will be described below in detail with reference to the accompanying drawings.

A first embodiment (positive drive type) of the multichannel drive circuit according to the present invention is illustrated in FIG. 1. Referring to FIG. 1, reference character 1 denotes a positive side power source line leading to a positive side power source VDD; 2 denotes a negative side power source line leading to a negative side power source VSS; 3 denotes a positive side bias line leading to a positive side bias power source VBH; 5 denotes an interchannel common connection line being the gist of the present invention; $\mathbf{10}_k$ to $\mathbf{10}_{k+3}$ denote element circuits of each channel k to k+3; $\mathbf{11}_k$ to $\mathbf{11}_{k+3}$ denote current source transistors of each channel k to k+3; $\mathbf{12}_k$ to $\mathbf{12}_{k+3}$ denote current blocking switch transistors of each channel k to k+3 being the gist of the present invention; $\mathbf{13}_k$ to $\mathbf{13}_{k+3}$ denote switch transistors of each channel k to k+3 for turning on/off supplying of electric power to load; $\mathbf{14}_k$ to $\mathbf{14}_{k+3}$ denote switch control signals of each channel k to k+3; 11 denotes a current source array including a series of current source transistors $\mathbf{11}_k$ to $\mathbf{11}_{k+3}$; 13 denotes a switch array including a series of switch transistors $\mathbf{13}_k$ to $\mathbf{13}_{k+3}$; 30 denotes a bias power source circuit; 40 denotes a load array including a series of loads $\mathbf{40}_k$ to $\mathbf{40}_{k+3}$; $\mathrm{OUT}_k$ to $\mathrm{OUT}_{k+3}$ denote output terminals of each channel k to k+3; and 100 denotes a multichannel drive circuit.

In the illustrated example, as the current source transistors $\mathbf{11}_k$ to $\mathbf{11}_{k+3}$ of each channel, there are used p-channel type MOSFETs each having the source terminal and gate terminal thereof connected respectively to the positive side power source line 1 and the positive side bias line 3.

As the input switch transistors $\mathbf{13}_k$ to $\mathbf{13}_{k+3}$ of each channel, there are used p-channel type MOSFETs each having the drain terminal and source terminal thereof connected respectively to the output terminal $\mathrm{OUT}_k$ to $\mathrm{OUT}_{k+3}$ and the drain terminal of the current blocking switch transistors $\mathbf{12}_k$ to $\mathbf{12}_{k+3}$, and the gate terminal thereof having the switch control signal $\mathbf{14}_k$ to $\mathbf{14}_{k+3}$ inputted thereto.

As the current blocking switch transistors $\mathbf{12}_k$ to $\mathbf{12}_{k+3}$ of each channel, there are used p-channel type MOSFETs each having the source terminal and drain terminal thereof connected respectively to the drain terminal of the current source transistors $\mathbf{11}_k$ to $\mathbf{11}_{k+3}$ and the source terminal of the input switch transistors $\mathbf{13}_k$ to $\mathbf{13}_{k+3}$, and the gate terminal thereof having the switch control signal $\mathbf{14}_k$ to $\mathbf{14}_{k+3}$ inputted thereto.

As evident from FIG. 1, this multichannel drive circuit 100 includes the current source array 11 including a plurality of the current source transistors $\mathbf{11}_k$ to $\mathbf{11}_{k+3}$ corresponding respectively to a plurality of the channels k to k+3, and the switch array 13 including a plurality of the input switch transistors $\mathbf{13}_k$ to $\mathbf{13}_{k+3}$ corresponding respectively to a plurality of the channels k to k+3.

The basic operation is as follows. That is, electric power is supplied via the respective input switch transistors $\mathbf{13}_k$ to $\mathbf{13}_{k+3}$ of each channel constituting the input switch array 13 to the respective loads $\mathbf{40}_k$ to $\mathbf{40}_{k+3}$ of each channel constituting the load array 40 by the respective current source transistors $\mathbf{11}_k$ to $\mathbf{11}_{k+3}$ of each channel constituting the current source array 11. In this case, ON/OFF operation of the switch transistors $\mathbf{13}_k$ to $\mathbf{13}_{k+3}$ is controlled by the switch control signals $\mathbf{14}_k$ to $\mathbf{14}_{k+3}$ of each channel.

Conduction between the respective current paths for connecting the respective current source transistors $\mathbf{11}_k$ to $\mathbf{11}_{k+3}$ of each channel constituting the current source array with the respective input switch transistors $\mathbf{13}_k$ to $\mathbf{13}_{k+3}$ of each channel constituting the input switch array 13 is made via the interchannel common connection line 5 being the gist of the present invention.

Referring to FIG. 1, reference characters $\mathbf{5}_k$ to $\mathbf{5}_{k+3}$ denote a connection point between the above described current paths of each channel k to k+3 and the interchannel common connection line 5. When this circuit 100 is constructed as a semiconductor integrated circuit, the interchannel common connection line 5 is formed using a low-resistance metal substance such as aluminum, and considerations are given to conductor pattern configuration, such as increasing of line width, whereby the resistance value thereof can be sufficiently reduced. Accordingly, the connection points $\mathbf{5}_k$ to $\mathbf{5}_{k+3}$ of each channel are connected at low resistance by the interchannel common connection line 5, so the potential of these connection points $\mathbf{5}_k$ to $\mathbf{5}_{k+3}$ is adjusted to a substantially identical level.

In addition, this circuit 100 is provided with current blocking means for blocking output current of the current source transistor $\mathbf{11}_k$ to $\mathbf{11}_{k+3}$ of that channel of the plurality of channels k to k+3 in which the input switch transistor $\mathbf{13}_k$ to $\mathbf{13}_{k+3}$ is in an OFF state from flowing into the interchannel common connection line 5.

In this example, as the current blocking means, there are used the current blocking switch transistors $\mathbf{12}_k$ to $\mathbf{12}_{k+3}$ made to lie between the current source transistor $\mathbf{11}_k$ to $\mathbf{11}_{k+3}$ of each channel and the input switch transistors $\mathbf{13}_k$ to $\mathbf{13}_{k+3}$ of each channel.

The switch control signals $\mathbf{14}_k$ to $\mathbf{14}_{k+3}$ are supplied in parallel to the respective gate terminals of the input switch transistors $\mathbf{13}_k$ to $\mathbf{13}_{k+3}$ of each channel and to the respective gate terminals of the current blocking switch transistors $\mathbf{12}_k$ to $\mathbf{12}_{k+3}$. Accordingly, the input switch transistors $\mathbf{13}_k$ to $\mathbf{13}_{k+3}$ of each channel and the current blocking switch transistors $\mathbf{12}_k$ to $\mathbf{12}_{k+3}$ of each channel operate in conjunction with each other in an interlocked manner.

Consequently, when the input switch transistor $\mathbf{13}_k$ to $\mathbf{13}_{k+3}$ is in an ON (conduction) state, the current blocking switch transistor $\mathbf{12}_k$ to $\mathbf{12}_{k+3}$ is also in an ON state, so conduction between the current source transistor $\mathbf{11}_k$ to $\mathbf{11}_{k+3}$ and the interchannel common connection line 5 is secured. Meanwhile, when the input switch transistor $\mathbf{13}_k$ to $\mathbf{13}_{k+3}$ is in an OFF (non-conduction) state, the current blocking switch transistor $12_k$ to $12_{k+3}$ is also in an OFF state, and thus the output current of the current source transistor $11_k$ to $11_{k+3}$ of that channel is blocked from flowing into the interchannel common connection line 5.

Thanks to the above described operation of the current blocking means, the number of channels in which the flow from the current source into the interchannel common connection line occurs is identical at all times to the number of channels in which the flow via the switch transistor to the load occurs. Thus, irrespective of the change in the number of channels in which the input switch transistor is in an ON state, the value of current (interchannel average current value) flowing out from each channel into the loads is kept substantially constant at all times.

The operation of this circuit 100 will now be described in detail with reference to FIGS. 2 to 5. Here, assume that: the set current values of the current source transistors $11_k$ to $11_{k+3}$ of each channel constituting the current source array 11 are $I11_k$ to $I11_{k+3}$, respectively; and the values of load current flowing in the switch transistors $13_k$ to $13_{k+3}$ of each channel constituting the switch array 13 are $I13_k$ to $I13_{k+3}$, respectively. Also, assume that the set current values $I11_k$ to $I11_{k+3}$ of the current source transistors $11_k$ to $11_{k+3}$ of each channel are not completely identical due to a variation in characteristic (for example, threshold value, mobility or the like) between the current source transistors $11_k$ to $11_{k+3}$ ascribable to semiconductor manufacturing process and the like.

In this state, assume that the switch control signals $14_k$ to $14_{k+3}$ having the same waveform are supplied, as illustrated in FIG. 2, to the input switch transistors $13_k$ to $13_{k+3}$ of four channels k to k+3. These switch control signals $14_k$ to $14_{k+3}$ have the identical ON period (period "L" of the switch control signals $14_k$ to $14_{k+3}$), as illustrated in FIG. 2.

Then, when a time t1 is reached, the current blocking switch transistors $12_k$ to $12_{k+3}$ and the input switch transistors $13_k$ to $13_{k+3}$ in the respective channels k to k+3 turn on simultaneously, so load current having a given value $I13_k$ to $I13_{k+3}$ flows in the input switch transistors $13_k$ to $13_{k+3}$ of each channel.

In this case, in the case of the conventional art described above with reference to FIGS. 27 and 28, the interchannel common connection line 5 being the gist of the present invention is not present, so the values of load current $I13_k$ to $I13_{k+3}$ flowing in the input switch transistors $13_k$ to $13_{k+3}$ of each channel depend on the set current values $I11_k$ to $I11_{k+3}$ of current source transistors $11_k$ to $11_{k+3}$ of each channel. Accordingly, when there is a variation in the set current value $I11_k$ to $I11_{k+3}$ between the channels, there is also a variation in the value of load current $I13_k$ to $I13_{k+3}$ between the channels.

In contrast, in the inventive circuit 100, the interchannel common connection line 5 having a resistance value sufficiently reduced is included, so both ends of the respective current source transistors $11_k$ to $11_{k+3}$ of the four channels are short-circuited. More specifically, the source terminals of the current source transistors $11_k$ to $11_{k+3}$ are short-circuited via the positive side power source line 1, and the drain terminals thereof are short-circuited via the current blocking transistors $12_k$ to $12_{k+3}$ and the interchannel common connection line 5.

Therefore, these four current source transistors $11_k$ to $11_{k+3}$ can be considered equivalent to one large current source transistor having a set current value equal to the sum of the set current values $I11_k$ to $I11_{k+3}$.

Here, if it is assumed that the characteristic value (for example, capacitance value) of the loads $40_k$ to $40_{k+3}$ of each channel constituting the load array 40 is uniform, then current is shunted in a uniform manner from the one imaginary power source described above to the respective loads $40_k$ to $40_{k+3}$ of each channel. Thus, as indicated by the following formulas (1) and (2), the load current values $I13_k$ to $I13_{k+3}$ of each channel are uniformized to an average value Ia of the set current values $I11_k$ to $I11_{k+3}$ of the four current source transistors $11_k$ to $11_{k+3}$.

$$I13_k = I13_{k+1} = I13_{k+2} = I13_{k+3} = Ia \quad (1)$$

$$Ia = \{(I11_k)+(I11_{k+1})+(I11_{k+2})+(I11_{k+3})\}/4 \quad (2)$$

That is, even when there is a variation in the set current value $I11_k$ to $I11_{k-3}$ of the four current source transistors $I11_k$ to $I11_{k+3}$ between the channels, the load current values $13_k$ to $13_{k+3}$ of each channel are kept at a uniform value equal to the average current value Ia.

Consequently, as illustrated in FIG. 2, if the ON period (period "L" of the switch control signals $14_k$ to $14_{k+3}$) of the input switch transistors $13_k$ to $13_{k+3}$ of all the channels is identical, even if there is a variation in the set current value $I11_k$ to $I11_{k+3}$ of the current source transistors $11_k$ to $11_{k+3}$ of each channel, voltage (i.e., charging voltage) values $V_k$ to $V_{k+3}$ of the output terminals $OUT_k$ to $OUT_{k+3}$ of each channel rise in a linear fashion while exhibiting the same inclination and then at time t2, all the voltage values reach the same value.

Also, as illustrated in FIG. 3, even when the ON periods (period "L" of the switch control signals $14_k$ to $14_{k+3}$) of the input switch transistors $13_k$ to $13_{k+3}$ of all the channels are different from each other, because of the same reason, voltage (i.e., charging voltage) values $V_k$ to $V_{k+3}$ of the output terminals $OUT_k$ to $OUT_{k+3}$ of each channel rise in a linear fashion while exhibiting the same inclination. Accordingly, at time t2, potentials $V_k$ and $V_{k+2}$ of the output terminals $OUT_k$ and $OUT_{k+2}$ reach a intended value; at time t3, potential $V_{k+3}$ of the output terminal $OUT_{k+3}$ reaches a intended value; and at time t4, potentials $V_{k+1}$ of the output terminal $OUT_{k+1}$ reaches an intended value.

In this case, during the period from t1 to t2, the values of load current $I13_k$ to $I13_{k+3}$ of the four channels being in an ON state are expressed as follows.

$$I13_k = I13_{k+1} = I13_{k+2} = I13_{k+3} = Ia1$$

$$Ia1 = \{(I11_k)+(I11_{k+1})+(I11_{k+2})+(I11_{k+3})\}/4$$

Also, during the period from t2 to t3, the values of load current $I13_{k+1}$ and $I13_{k+3}$ of the two channels being in an ON state are expressed as follows.

$$I13_{k+1} = I13_{k+3} = Ia2$$

$$Ia2 = \{(I11_{k+1})+(I11_{k+3})\}/2$$

Also, during the period from t3 to t4, the value of load current $I13_{k+1}$ of the one channel being in an ON state is expressed as follows.

$$I13_{k+1} = I11_{k+1}$$

As such, according to the inventive circuit 100, even though there is a variation in the set current value $I11_k$ to $I11_{k+3}$ of the current source transistors $11_k$ to $11_{k+3}$ of each channel, the potentials of the output terminals $OUT_k$ to $OUT_{k+3}$ of each channel rise while exhibiting the identical line having a given inclination, and thus the loads $40_k$ to $40_{k+3}$ of each channel can be driven under uniform conditions. That is, if the ON periods (period "L" of the switch control signals $14_k$ to $14_{k+3}$) of the input switch transistors $13_k$ to $13_{k+3}$ are manipulated according to a given rule, even though no consideration is given to a variation of the current source transistors $11_k$ to $11_{k+3}$, the loads $40_k$ to $40_{k+3}$ of each channel can be accurately controlled according to an intended operating mode.

The voltage averaging action of the inventive circuit 100 will now be described. As described above, even if there is a variation in the set current value $I11_k$ to $I11_{k+3}$ of the current source transistors $11_k$ to $11_{k+3}$ of each channel, when the loads $40_k$ to $40_{k+3}$ of each channel constituting the load array 40 have a uniform value (capacitive value), as long as the ON period (period "L" of the switch control signals $14_k$ to $14_{k+3}$) of the input switch transistors $13_k$ to $13_{k+3}$ is identical, voltages $V_k$ to $V_{k+3}$ of the output terminals $OUT_k$ to $OUT_{k+3}$ of each channel become also identical.

In addition, in the inventive circuit 100, even when there is a variation not only in the set current value $I11_k$ to $I11_{k+3}$ of the current source transistors $11_k$ to $11_{k+3}$ of each channel but also in the load $40_k$ to $40_{k+3}$ of each channel constituting the load array 40, as long as the ON period (period "L" of the switch control signals $14_k$ to $14_{k+3}$) of the input switch transistors $13_k$ to $13_{k+3}$ is identical, voltages $V_k$ to $V_{k+3}$ of the output terminals $OUT_k$ to $OUT_{k+3}$ of each channel exhibit a substantially identical value (voltage averaging action).

A diagram of a circuit for verifying the voltage averaging action of the inventive multichannel drive circuit is illustrated in FIG. 4; and a view for explaining the voltage averaging action is illustrated in FIG. 5. Here, as illustrated in FIG. 4, assume that, of adjoining channels, the capacitance value of the load $40_k$ of the channel k is 125 pF, and the capacitance value of the load $40_{k+1}$ of the channel k+1 is 100 pF, and there is a relationship ($I11_k \leqq I11_{k+1}$) between the set current value $I11_k$ of the current source transistor $11_k$ of the channel k and the set current value $I11_{k+1}$ of the load $40_k$ of the channel k+1.

In this case, if a switch SW1 is in an OFF state (corresponding to the conventional technique), the output terminal $OUT_k$ of the channel k and the output terminal $OUT_{k+1}$ of the channel k+1 are completely isolated/separated. Accordingly, even if the ON period (period from time t1 to time t2) is identical, since there is the relationship ($I11_k \leqq I11_{k+1}$), a large potential difference occurs between the output terminal $OUT_k$ and output terminal $OUT_{k+1}$, as illustrated in FIG. 5.

In contrast, if the switch SW1 is in an ON state (corresponding to the inventive technique), conduction between the output terminal $OUT_k$ of the channel k and the output terminal $OUT_{k+1}$ of the channel k+1 is made via the switch transistors $13_k$ and $13_{k+3}$ and the interchannel common connection line 5. Accordingly, if the ON period (period from time t1 to time t2) is identical, even though there is the relationship ($I11_k \leqq I11_{k+1}$), adjusting current flows via the interchannel common connection line 5 between the two channels to cause the voltage averaging action to be taken. Consequently, as illustrated in FIG. 5, the potential difference between the output terminal $OUT_k$ and output terminal $OUT_{k+1}$ is significantly reduced and thus the two output terminals $OUT_k$ and $OUT_{k+1}$ has a substantially identical voltage.

A second embodiment (negative drive type) of the inventive multichannel drive circuit is illustrated in FIG. 6. Referring to FIG. 6, reference character 1 denotes a positive side power source line leading to a positive side power source VDD; 2 denotes a negative side power source line leading to a negative side power source VSS; 4 denotes a negative side bias line leading to a negative side bias power source VBL; 6 denotes an interchannel common connection line being the gist of the present invention; $10_k$ to $10_{k+3}$ denote element circuits of each channel k to k+3; $21_k$ to $21_{k+3}$ denote current source transistors of each channel k to k+3; $22_k$ to $22_{k+3}$ denote current blocking switch transistors of each channel k to k+3 being the gist of the present invention; $23_k$ to $23_{k+3}$ denote switch transistors of each channel k to k+3 for turning on/off supplying of electric power to load; $24_k$ to $24_{k+3}$ denote switch control signals of each channel k to k+3; 21 denotes a current source array including a series of current source transistors $21_k$ to $21_{k+3}$; 23 denotes a switch array including a series of switch transistors $23_k$ to $23_{k+3}$; 30 denotes a bias power source circuit; 40 denotes a load array including a series of loads $40_k$ to $40_{k+3}$; $OUT_k$ to $OUT_{k+3}$ denote output terminals of each channel k to k+3; and 100 denotes a multichannel drive circuit.

In the illustrated example, as the current source transistors $21_k$ to $21_{k+3}$ of each channel, there are used n-channel type MOSFETs each having the source terminal and gate terminal thereof connected respectively to the negative side power source line 2 and the negative side bias line 4.

As the input switch transistors $23_k$ to $23_{k+3}$ of each channel, there are used n-channel type MOSFETs each having the drain terminal and source terminal thereof connected respectively to the output terminal $OUT_k$ to $OUT_{k+3}$ and the drain terminal of the current blocking switch transistors $22_k$ to $22_{k+3}$, and the gate terminal thereof having inputted thereto the switch control signal $24_k$ to $24_{k+3}$.

As the current blocking switch transistors $22_k$ to $22_{k+3}$ of each channel, there are used n-channel type MOSFETs each having the source terminal and drain terminal thereof connected respectively to the drain terminal of the current source transistors $21_k$ to $21_{k+3}$ and the source terminal of the input switch transistors $23_k$ to $23_{k+3}$, and the gate terminal thereof having the switch control signal $24_k$ to $24_{k+3}$ inputted thereto.

As evident from FIG. 6, this multichannel drive circuit 100 includes the current source array 21 including a plurality of the current source transistors $21_k$ to $21_{k+3}$ corresponding respectively to a plurality of the channels k to k+3, and the input switch array 23 including a plurality of the input switch transistors $23_k$ to $23_{k+3}$ corresponding respectively to a plurality of the channels k to k+3.

The basic operation is as follows. That is, electric power is supplied via the respective input switch transistors $23_k$ to $23_{k+3}$ of each channel constituting the input switch array 23 to the respective loads $40_k$ to $40_{k+3}$ of each channel constituting the load array 40 by the respective current source transistors $21_k$ to $21_{k+3}$ of each channel constituting the current source array 21. In this case, ON/OFF operation of the switch transistors $23_k$ to $23_{k+3}$ is controlled by the switch control signals $24_k$ to $24_{k+3}$ of each channel.

The respective current paths for connecting the respective current source transistors $21_k$ to $21_{k+3}$ of each channel constituting the current source array with the respective input switch transistors $23_k$ to $23_{k+3}$ of each channel constituting the input switch array 23 are constructed so that conduction between them are made via the interchannel common connection line 6 being the gist of the present invention.

Referring to FIG. 6, reference characters $6_k$ to $6_{k+3}$ denote a connection point between the above described current paths of each channel k to k+3 and the interchannel common connection line 6. When this circuit 100 is constructed as a semiconductor integrated circuit, the interchannel common connection line 6 is formed using a low-resistance metal substance such as aluminum, and considerations are given to conductor pattern configuration, such as increasing of line width, whereby the resistance value thereof can be sufficiently reduced. Accordingly, the connection points $6_k$ to $6_{k+3}$ of each channel are connected at low resistance by the interchannel common connection line 6, so the potentials of these connection points $6_k$ to $6_{k+3}$ are adjusted to a substantially identical level.

In addition, this circuit 100 is provided with current blocking means for blocking output current of the current source transistor $21_k$ to $21_{k+3}$ of that channel of the plurality of channels k to k+3 in which the input switch transistor 23$_k$ to 23$_{k+3}$ is in an OFF state from flowing into the interchannel common connection line 6.

In this example, as the current blocking means, there are used the current blocking switch transistors 22$_k$ to 22$_{k+3}$ made to lie between the current source transistor 21$_k$ to 21$_{k+3}$ of each channel and the input switch transistors 23$_k$ to 23$_{k+3}$ of each channel.

The switch control signals 24$_k$ to 24$_{k+3}$ are supplied in parallel to the respective gate terminals of the input switch transistors 23$_k$ to 23$_{k+3}$ of each channel and to the respective gate terminals of the current blocking switch transistors 22$_k$ to 22$_{k+3}$. Accordingly, the input switch transistors 23$_k$ to 23$_{k+3}$ of each channel and the current blocking switch transistors 22$_k$ to 22$_{k+3}$ of each channel operate in conjunction with each other in an interlocked manner.

Consequently, when the input switch transistor 23$_k$ to 23$_{k+3}$ is in an ON (conduction) state, the current blocking switch transistor 22$_k$ to 22$_{k+3}$ is also in an ON state, so conduction between the current source transistor 21$_k$ to 21$_{k+3}$ and the interchannel common connection line 6 is secured. Meanwhile, when the input switch transistor 23$_k$ to 23$_{k+3}$ is in an OFF (non-conduction) state, the current blocking switch transistor 22$_k$ to 22$_{k+3}$ is also in an OFF state, and thus the output current of the current source transistor 21$_k$ to 21$_{k+3}$ of that channel is blocked from flowing into the interchannel common connection line 6.

Thanks to the above described operation of the current blocking means, the number of channels in which the flow from the current source into the interchannel common connection line occurs is identical at all times to the number of channels in which the flow via the switch transistor into the load occurs. Thus, irrespective of the change in the number of channels in which the input switch transistor is in an ON state, the value of current (interchannel average current value) flowing out from each channel into the loads is kept substantially constant at all times.

Except that the channel type of transistor is different, the operation and effect of the second embodiment of the inventive circuit described above is substantially similar to that of the first embodiment of the inventive circuit described above with reference to FIGS. 1 to 5, and hence repeated explanation thereof is omitted.

A third embodiment (bipolar drive type) of the inventive multichannel drive circuit is illustrated in FIG. 7. Referring to FIG. 7, reference character 1 denotes a positive side power source line leading to a positive side power source VDD; 2 denotes a negative side power source line leading to a negative side power source VSS; 3 denotes a positive side bias line leading to a positive side bias power source VBH; 4 denotes a negative side bias line leading to a negative side bias power source VBL; 5*a* denotes a positive side interchannel common connection line being the gist of the present invention; 6*a* denotes a negative side interchannel common connection line being the gist of the present invention; 10$_k$ to 10$_{k+3}$ denote element circuits of each channel k to k+3.

Also, reference characters 11$_k$ to 11$_{k+3}$ denote positive side current source transistors of each channel k to k+3; 12$_k$ to 12$_{k+3}$ denote positive side current blocking switch transistors of each channel k to k+3 being the gist of the present invention; 13$_k$ to 13$_{k+3}$ denote positive side switch transistors of each channel k to k+3 for turning on/off supplying of electric power to load; 14$_k$ to 14$_{k+3}$ denote positive side switch control signals of each channel k to k+3; 11*a* denotes a positive side current source array including a series of positive side current source transistors 11$_k$ to 11$_{k+3}$; 13*a* denotes a positive side switch array including a series of positive side switch transistors 13$_k$ to 13$_{k+3}$.

Also, reference characters 21$_k$ to 21$_{k+3}$ denote negative side current source transistors of each channel k to k+3; 22$_k$ to 22$_{k+3}$ denote negative side current blocking switch transistors of each channel k to k+3 being the gist of the present invention; 23$_k$ to 23$_{k+3}$ denote negative side switch transistors of each channel k to k+3 for turning on/off supplying of electric power to load; 24$_k$ to 24$_{k+3}$ denote negative side switch control signals of each channel k to k+3; 21*a* denotes a negative side current source array including a series of negative side current source transistors 21$_k$ to 21$_{k+3}$; 23*a* denotes a negative side switch array including a series of negative side switch transistors 23$_k$ to 23$_{k+3}$.

In addition, reference character 30 denotes a bias power source circuit; 40 denotes a load array including a series of loads 40$_k$ to 40$_{k+3}$; OUT$_k$ to OUT$_{k+3}$ denote output terminals of each channel k to k+3; and 100 denotes a multichannel drive circuit.

In the illustrated example, as the positive side current source transistors 11$_k$ to 11$_{k+3}$ of each channel, there are used p-channel type MOSFETs each having the source terminal and gate terminal thereof connected respectively to the positive side power source line 1 and the positive side bias line 3.

As the positive side input switch transistors 13$_k$ to 13$_{k+3}$ of each channel, there are used p-channel type MOSFETs each having the drain terminal and source terminal thereof connected respectively to the output terminal OUT$_k$ to OUT$_{k+3}$ and the drain terminal of the current blocking positive side switch transistors 12$_k$ to 12$_{k+3}$, and the gate terminal thereof having the switch control signal 14$_k$ to 14$_{k+3}$ inputted thereto.

As the current blocking positive side switch transistors 12$_k$ to 12$_{k+3}$ of each channel, there are used p-channel type MOSFETs each having the source terminal and drain terminal thereof connected respectively to the drain terminal of the current source transistors 11$_k$ to 11$_{k+3}$ and the source terminal of the input switch transistors 13$_k$ to 13$_{k+3}$, and the gate terminal thereof having the positive side switch control signal 14$_k$ to 14$_{k+3}$ inputted thereto.

As the negative side current source transistors 21$_k$ to 21$_{k+3}$ of each channel, there are used n-channel type MOSFETs each having the source terminal and gate terminal thereof connected respectively to the negative side power source line 2 and the negative side bias line 4.

As the negative side input switch transistors 23$_k$ to 23$_{k+3}$ of each channel, there are used n-channel type MOSFETs each having the drain terminal and source terminal thereof connected respectively to the output terminal OUT$_k$ to OUT$_{k+3}$ and the drain terminal of the positive side negative side switch transistors 22$_k$ to 22$_{k+3}$, and the gate terminal thereof having the switch control signal 24$_k$ to 24$_{k+3}$ inputted thereto.

As the current blocking negative side switch transistors 22$_k$ to 22$_{k+3}$ of each channel, there are used n-channel type MOSFETs each having the source terminal and drain terminal thereof connected respectively to the drain terminal of the negative side current source transistors 21$_k$ to 21$_{k+3}$ and the source terminal of the input switch transistors 23$_k$ to 23$_{k+3}$, and the gate terminal thereof having the negative side switch control signal 24$_k$ to 24$_{k+3}$ inputted thereto.

As evident from FIG. 7, this multichannel drive circuit 100 includes, as the current source array, the positive side current source array 11*a* including a plurality of the positive side current source transistors 11$_k$ to 11$_{k+3}$ corresponding respectively to a plurality of the channels k to k+3, and the negative side current source array 21*a* including a plurality of the negative side current source transistors $\mathbf{21}_k$ to $\mathbf{21}_{k+3}$ corresponding respectively to a plurality of the channels.

The input switch array includes: the positive side input switch array 13*a* including a plurality of the positive side input switch transistors $\mathbf{14}_k$ to $\mathbf{14}_{k+3}$ corresponding respectively to a plurality of the channels; and the negative side input switch array 23*a* including a plurality of the negative side input switch transistors $\mathbf{23}_k$ to $\mathbf{23}_{k+3}$ corresponding respectively to a plurality of the channels.

Positive side electric power is supplied via the respective positive side input switch transistors $\mathbf{13}_k$ to $\mathbf{13}_{k+3}$ of each channel constituting the positive side input switch array 11*a* to the respective loads $\mathbf{40}_k$ to $\mathbf{40}_{k+3}$ of each channel constituting the load array 40 by the respective positive side current source transistors $\mathbf{11}_k$ to $\mathbf{11}_{k+3}$ of each channel constituting the positive side current source array 11*a*; and negative side electric power is supplied via the respective negative side input switch transistors $\mathbf{23}_k$ to $\mathbf{23}_{k+3}$ of each channel constituting the negative side input switch array 23*a* to the respective loads $\mathbf{40}_k$ to $\mathbf{40}_{k+3}$ of each channel constituting the load array 40 by the respective negative side current source transistors $\mathbf{21}_k$ to $\mathbf{21}_{k+3}$ of each channel constituting the negative side current source array 21*a*.

The interchannel common connection line includes: a positive side interchannel common connection line 5*a* for making conduction between current paths of each channel for connecting the respective positive side current sources transistors $\mathbf{11}_k$ to $\mathbf{11}_{k+3}$ of each channel constituting the positive side current source array 11*a* with the respective positive side input switches transistors $\mathbf{13}_k$ to $\mathbf{13}_{k+3}$ of each channel constituting the positive side input switch array 13*a*; and a negative side interchannel common connection line 6*a* for making conduction between current paths of each channel for connecting the respective negative side current sources transistors $\mathbf{21}_k$ to $\mathbf{21}_{k+3}$ of each channel constituting the negative side current source array 21*a* with the respective negative side input switches transistors $\mathbf{23}_k$ to $\mathbf{23}_{k+3}$ of each channel constituting the negative side input switch array 23*a*.

Referring to FIG. 7, reference characters $\mathbf{5}a_k$ to $\mathbf{5}a_{k+3}$ denote a connection point between the positive side interchannel common connection line 5*a* and the current paths of each channel, respectively; and reference characters $\mathbf{6}a_k$ to $\mathbf{6}a_{k+3}$ denote a connection point between the negative side interchannel common connection line 6*a* and the current paths of each channel, respectively.

The current blocking means includes: positive side current blocking means for blocking output current of the positive side current source transistor $\mathbf{11}_k$ to $\mathbf{11}_{k+3}$ of that channel of the plurality of channels in which the positive side input switch transistor $\mathbf{13}_k$ to $\mathbf{13}_{k+3}$ is in an OFF state from flowing into the positive side interchannel common connection line 5*a*; and negative side current blocking means for blocking output current of the negative side current source transistor $\mathbf{21}_k$ to $\mathbf{21}_{k+3}$ of that channel of the plurality of channels in which the negative side input switch transistor $\mathbf{24}_k$ to $\mathbf{24}_{k+3}$ is in an OFF state from flowing into the negative side interchannel common connection line.

In this example, as the positive side current blocking means, there are used the positive side current blocking switch transistors $\mathbf{12}_k$ to $\mathbf{12}_{k+3}$ made to lie between the positive side current source transistor $\mathbf{11}_k$ to $\mathbf{11}_{k+3}$ of each channel and the positive side input switch transistors $\mathbf{13}_k$ to $\mathbf{13}_{k+3}$ of each channel; as the negative side current blocking means, there are used the negative side current blocking switch transistors $\mathbf{22}_k$ to $\mathbf{22}_{k+3}$ made to lie between the negative side current source transistor $\mathbf{21}_k$ to $\mathbf{21}_{k+3}$ of each channel and the negative side input switch transistors $\mathbf{23}_k$ to $\mathbf{23}_{k+3}$ of each channel.

The positive side switch control signals $\mathbf{14}_k$ to $\mathbf{14}_{k+3}$ are supplied in parallel to the respective gate terminals of the positive side input switch transistors $\mathbf{13}_k$ to $\mathbf{13}_{k+3}$ of each channel and to the respective gate terminals of the current blocking switch transistors $\mathbf{12}_k$ to $\mathbf{12}_{k+3}$. Accordingly, the positive side input switch transistors $\mathbf{13}_k$ to $\mathbf{13}_{k+3}$ of each channel and the positive side current blocking switch transistors $\mathbf{12}_k$ to $\mathbf{12}_{k+3}$ of each channel operate in conjunction with each other in an interlocked manner.

Consequently, when the positive side input switch transistor $\mathbf{13}_k$ to $\mathbf{13}_{k+3}$ is in an ON (conduction) state, the positive side current blocking switch transistor $\mathbf{12}_k$ to $\mathbf{12}_{k+3}$ is also in an ON state, so conduction between the positive side current source transistor $\mathbf{11}_k$ to $\mathbf{11}_{k+3}$ and the interchannel common connection line 5*a* is secured. Meanwhile, when the positive side input switch transistor $\mathbf{13}_k$ to $\mathbf{13}_{k+3}$ is in an OFF (non-conduction) state, the positive side current blocking switch transistor $\mathbf{12}_k$ to $\mathbf{12}_{k+3}$ is also in an OFF state, and thus the output current of the positive side current source transistor $\mathbf{11}_k$ to $\mathbf{11}_{k+3}$ of that channel is blocked from flowing into the interchannel common connection line 5*a*.

The negative side switch control signals $\mathbf{24}_k$ to $\mathbf{24}_{k+3}$ are supplied in parallel to the respective gate terminals of the negative side input switch transistors $\mathbf{23}_k$ to $\mathbf{23}_{k+3}$ of each channel and to the respective gate terminals of the negative side current blocking switch transistors $\mathbf{22}_k$ to $\mathbf{22}_{k+3}$. Accordingly, the negative side input switch transistors $\mathbf{23}_k$ to $\mathbf{23}_{k+3}$ of each channel and the negative side current blocking switch transistors $\mathbf{22}_k$ to $\mathbf{22}_{k+3}$ of each channel operate in conjunction with each other in an interlocked manner.

Consequently, when the negative side input switch transistor $\mathbf{23}_k$ to $\mathbf{23}_{k+3}$ is in an ON (conduction) state, the negative side current blocking switch transistor $\mathbf{22}_k$ to $\mathbf{22}_{k+3}$ is also in an ON state, so conduction between the negative side current source transistor $\mathbf{21}_k$ to $\mathbf{21}_{k+3}$ and the interchannel common connection line 6*a* is secured. Meanwhile, when the negative side input switch transistor $\mathbf{23}_k$ to $\mathbf{23}_{k+3}$ is in an OFF (non-conduction) state, the negative side current blocking switch transistor $\mathbf{22}_k$ to $\mathbf{22}_{k+3}$ is also in an OFF state, and thus the output current of the negative side current source transistor $\mathbf{21}_k$ to $\mathbf{21}_{k+3}$ of that channel is blocked from flowing into the interchannel common connection line 6*a*.

Thanks to the above described operation of the current blocking means, the number of channels in which the flow from the current source into the interchannel common connection line occurs is identical at all times to the number of channels in which the flow via the switch transistor into the load occurs. Thus, irrespective of the change in the number of channels in which the input switch transistor is in an ON state, the value of current (interchannel average current value) flowing out from each channel into the loads is kept substantially constant at all times.

Except for being bipolar drive type, the operation and effect of the third embodiment of the inventive circuit described above is substantially similar to that of the first embodiment of the inventive circuit described above with reference to FIGS. 1 to 5, and hence repeated explanation thereof is omitted.

A fourth embodiment (a variation of bipolar drive type) of the inventive multichannel drive circuit is illustrated in FIG. 8. In FIG. 8, the same reference characters are applied to constituent parts having the same configuration as those of the third embodiment illustrated in FIG. 7, and an explanation thereof is omitted.

This fourth embodiment is characterized in that, when the input switch is in an OFF state, positive side and negative side current blocking means are configured to disable the current source. More specifically, in this example, positive side switch transistors 15$_k$ to 15$_{k+3}$ are connected between the gate terminal of the positive side current source transistors 11$_k$ to 11$_{k+3}$ of each channel and the positive side bias power source line 3. Similarly, positive side switch transistors 16$_k$ to 16$_{k+3}$ are connected between the positive side current source transistors 11$_k$ to 11$_{k+3}$ of each channel and the positive side power source line 1.

The positive side switch control signals 14$_k$ to 14$_{k+3}$ of each channel are directly connected to the gate terminals of the positive side switch transistors 15$_k$ to 15$_{k+3}$; and the positive side switch control signals 14$_k$ to 14$_{k+3}$ of each channel are connected to the gate terminals of the positive side switch transistors 16$_k$ to 16$_{k+3}$ after having been inverted by inverters 17$_k$ to 17$_{k+3}$.

Accordingly, in ON period where the positive side switch control signal 14$_k$ to 14$_{k+3}$ indicates an "L" state, the positive side input switch transistor 13$_k$ to 13$_{k+3}$ and the positive side bias switch transistor 15$_k$ to 15$_{k+3}$ are both in an ON state, and the positive side cutoff switch transistor 16$_k$ to 16$_{k+3}$ is in an OFF state, whereby positive side supplying of electric power to load is normally performed.

In contrast, in OFF period where the positive side switch control signal 14$_k$ to 14$_{k+3}$ indicates an "H" state, the positive side input switch transistor 13$_k$ to 13$_{k+3}$ and the positive side bias switch transistor 15$_k$ to 15$_{k+3}$ are both in an OFF state, whereas the positive side cutoff switch transistor 16$_k$ to 16$_{k+3}$ is in an ON state, and thus the positive side current source transistors 11$_k$ to 11$_{k+3}$ are changed to a cutoff state, i.e., disabled, whereby current flowing from the positive side current source transistors 11$_k$ to 11$_{k+3}$ into the positive side interchannel common connection line 5*a* is blocked.

Similarly, negative side switch transistors 25$_k$ to 25$_{k+3}$ are connected between the gate terminal of the negative side current source transistors 21$_k$ to 21$_{k+3}$ of each channel and the negative side bias power source line 2. Similarly, negative side switch transistors 26$_k$ to 26$_{k+3}$ are connected between the negative side current source transistors 21$_k$ to 21$_{k+3}$ of each channel and the negative side power source line 2.

The negative side switch control signals 24$_k$ to 24$_{k+3}$ of each channel are directly connected to the gate terminals of the negative side switch transistors 25$_k$ to 25$_{k+3}$; and the negative side switch control signals 24$_k$ to 24$_{k+3}$ of each channel are connected to the gate terminals of the negative side switch transistors 26$_k$ to 26$_{k+3}$ after having been inverted by inverters 27$_k$ to 27$_{k+3}$.

Accordingly, in ON period where the negative side switch control signal 14$_k$ to 14$_{k+3}$ indicates an "H" state, the negative side input switch transistor 23$_k$ to 23$_{k+3}$ and the negative side bias switch transistor 25$_k$ to 25$_{k+3}$ are both in an ON state, and the negative side cutoff switch transistor 26$_k$ to 26$_{k+3}$ is in an OFF state, whereby negative side supplying of electric power to load is normally performed.

In contrast, in OFF period where the negative side switch control signal 24$_k$ to 24$_{k+3}$ indicates an "L" state, the negative side input switch transistor 23$_k$ to 23$_{k+3}$ and the negative side bias switch transistor 25$_k$ to 25$_{k+3}$ are both in an OFF state, whereas the negative side cutoff switch transistor 26$_k$ to 26$_{k+3}$ is in an ON state, and thus the negative side current source transistors 21$_k$ to 21$_{k+3}$ are changed to a cutoff state, i.e., disabled, whereby current flowing from the negative side current source transistors 21$_k$ to 21$_{k+3}$ into the negative side interchannel common connection line 6*a* is blocked.

A fifth embodiment (a variation of positive drive type) of the inventive multichannel drive circuit is illustrated in FIG. 9. In FIG. 9, the same reference characters are applied to constituent parts having the same configuration as those of the first embodiment described above with reference to FIG. 1, and an explanation thereof is omitted.

This fifth embodiment is characterized in that, when the input switch is in an OFF state, current flowing in the current source is made to bypass the input switch to be discharged.

More specifically, as illustrated in FIG. 9, current discharging switch transistors 18$_k$ to 18$_{k+3}$ and dummy load current source transistors 19$_k$ to 19$_{k+3}$ are connected in series between the interchannel common connection line 5 and the negative side power source line 2 in each channel. These transistors 18$_k$ to 18$_{k+3}$ and 19$_k$ to 19$_{k+3}$ are each composed of an n-channel type MOSFET. Switch control signals 14$_k$ to 14$_{k+3}$ of each channel are supplied to the gate terminals of the current discharging switch transistors 18$_k$ to 18$_{k+3}$.

Accordingly, in ON period where the switch control signals indicate an "L" state, the input switch transistors 13$_k$ to 13$_{k+3}$ of each channel are in an ON state, whereas the current discharging switch transistors 18$_k$ to 18$_{k+3}$ are in an OFF state, whereby supplying of electric power to load is normally performed.

In contrast, in OFF period where the switch control signals 14$_k$ to 14$_{k+3}$ indicate an "H" state, the input switch transistors 13$_k$ to 13$_{k+3}$ of each channel are in an OFF state, whereas the current discharging switch transistors 18$_k$ to 18$_{k+3}$ are in an ON state, whereby current from the current source transistors 11$_k$ to 11$_{k+3}$ of each channel are discharged via the current source transistors 19$_k$ to 19$_{k+3}$ acting as the dummy load into the negative side power source line 2.

The set current value of the current source transistors 19$_k$ to 19$_{k+3}$ is set substantially equal to that of the original source transistors 11$_k$ to 11$_{k+3}$. Also, the connection points between the current discharging switch transistors 18$_k$ to 18$_{k+3}$ and the current source transistors 19$_k$ to 19$_{k+3}$ acting as the dummy load in each channel is connected via another interchannel common connection line 7.

Accordingly, in OFF period where the switch control signal 14$_k$ to 14$_{k+3}$ indicates an "H" state, current having a value equal to the set current value of the current source transistor 11$_k$ to 11$_{k+3}$ bypasses the input switch transistor 13$_k$ to 13$_{k+3}$ and is then discharged to the negative side power source line 2. Consequently, flowing from the source transistor 11$_k$ to 11$_{k+3}$ into the interchannel common connection line practically occurs; however, since discharging of current occurs in the channel itself, even when there is a channel in which electric power is being supplied to load, that current value is kept at a constant value.

A sixth embodiment (a variation of bipolar drive type) of the inventive multichannel drive circuit is illustrated in FIG. 10. In FIG. 10, the same reference characters are applied to constituent parts having the same configuration as those of the third embodiment described above with reference to FIG. 7, and an explanation thereof is omitted.

This sixth embodiment is characterized in that, as the positive side current source and negative side current source, there is used a modulation type current source in which the set current value changes stepwise as time passes.

More specifically, as illustrated in FIG. 10, positive side modulation type current sources (17$_k$, 17$_{k+1}$) of each channel constituting a positive side current source array 17 are each constituted of: a plurality of (in this example, three) unit current power sources (171$_k$, 171$_{k+1}$), (172$_k$, 172$_{k+1}$), (173$_k$, 173$_{k+1}$) having a different weighting value; and unit switches (174$_k$, 174$_{k+1}$), (175$_k$, 175$_{k+1}$), (176$_k$, 176$_{k+1}$) made to lie in respective output paths of the unit current power sources. Output currents of the unit current power sources selected via the unit switches are added to generate a desired set current value.

Connected to the gate terminals of the unit switches (174$_k$, 174$_{k+1}$), (175$_k$, 175$_{k+1}$), (176$_k$, 176$_{k+1}$) of each channel in the positive side are NAND gates (177$_k$, 177$_{k+1}$), (178$_k$, 178$_{k+1}$), (179$_k$, 179$_{k+1}$). Supplied to one input terminal of the NAND gates are positive side switch control signals (14$_k$, 14$_{k+1}$); supplied to another input terminal are positive side weighting selection signals BP1, BP2 and BP3.

As described later, the positive side modulation type current sources (17$_k$, 17$_{k+1}$) are configured so that when the respective unit switches turn on/off according to a programmed procedure, the set current value varies as time passes, while exhibiting a certain profile based on the positive side switch control signals (14$_k$, 14$_{k+1}$) and the positive side weighting selection signals BP1, BP2 and BP3.

Similarly, current sources (27$_k$, 27$_{k+1}$) of each channel constituting a negative side current source array 27 are each constituted of a plurality of (in this example, three) unit current power sources (271$_k$, 271$_{k+1}$), (272$_k$, 272$_{k+1}$), (273$_k$, 273$_{k+1}$) having a different weighting value, and unit switches (274$_k$, 274$_{k+1}$), (275$_k$, 275$_{k+1}$), (276$_k$, 276$_{k+1}$) made to lie in respective output paths of the unit current sources. Output currents of the unit current sources selected via the unit switches are added to generate a desired set current value.

Connected to the gate terminals of the unit switches (274$_k$, 274$_{k+1}$), (275$_k$, 275$_{k+1}$), (276$_k$, 276$_{k+1}$) of each channel in the negative side are NOR gates (277$_k$, 277$_{k+1}$), (278$_k$, 278$_{k+1}$), (279$_k$, 279$_{k+1}$). Supplied to one input terminal of the NOR gates are negative side switch control signals (24$_k$, 24$_{k+1}$); supplied to another input terminal are negative side weighting selection signals BN1, BN2 and BN3.

As described later, the negative side modulation type current sources (27$_k$, 27$_{k+1}$) are configured so that when the respective unit switches turn on/off according to a programmed procedure, the set current value varies as time passes, while exhibiting a certain profile based on the negative side switch control signals (24$_k$, 24$_{k+1}$) and the negative side weighting selection signals BN1, BN2 and BN3.

According to the six embodiment, the positive side modulation type current sources (17$_k$, 17$_{k+1}$) of each channel are connected via a positive side interchannel common connection line 5*a* being the gist of the present invention. Also, the negative side modulation type current sources (27$_k$, 27$_{k+1}$) of each channel are connected via a negative side interchannel common connection line 6*a* being the gist of the present invention. Accordingly, bipolar drive of load under conditions uniform between the channels is guaranteed.

Referring to FIG. 10, reference characters 70$_k$, 70$_{k+1}$ denote a pre-charge analog switches. These analog switches (70$_k$, 70$_{k+1}$) are turned on/off by a pair of switch control signals (71$_k$, 71$_{k+1}$), (72$_k$, 72$_{k+1}$). These analog switches (70$_k$, 70$_{k+1}$) are connected between a pre-charge power source line 8 leading to a pre-charge power source Vx and output terminals (OUT$_k$, OUT$_{k+1}$) of each channel. Accordingly, when the analog switches (70$_k$, 70$_{k+1}$) turn on, the output terminals (OUT$_k$, OUT$_{k+1}$) of each channel is instantly pre-charged to the pre-charge voltage Vx.

The analog switches (70$_k$, 70$_{k+1}$) turn on only for a short length of time immediately before the start of positive side charging operation and immediately before the start of negative side charging operation. Accordingly, the potential of the output terminals (OUT$_k$, OUT$_{k+1}$) of each channel is pre-set to a predetermined pre-charge voltage Vx immediately before the start of positive side charge and immediately before the start of negative side charge, and thus charge is initiated at the identical voltage in both the positive side and negative side. The pre-charge analog switches (70$_k$, 70$_{k+1}$) can also be used in the third embodiment and fourth embodiment described above.

Further, the circuit 100 illustrated in FIG. 10 has been designed so as to be used for the horizontal pixel line of liquid crystal display panel; particularly, the positive side and negative side modulation type current sources (17$_k$, 17$_{k+1}$), (27$_k$, 27$_{k+1}$) play a role of performing gamma curve correction.

A relationship between applied voltage, tone DATA and current source output (modulation type current source output) is illustrated in FIG. 12. In this example, as illustrated in FIG. 12(*a*), the gamma curve is divided into a plurality of tone sections in which the fact that the inclination is substantially identical, is taken in consideration; and respective gamma curves of each tone section are approximated to lines having an inclination (inclinations 1 to 7) substantially identical to that of the respective gamma curves. And, as illustrated in FIG. 12(*d*), the output current of the modulation type current source varies stepwise as time passes, so that charging voltage lines corresponding to the approximated lines of each tone sections can be obtained at the output terminals OUT$_k$ and OUT$_{k+1}$ of each channel. The control for generating such a current source output waveform is implemented by the above described positive side weighting selection signals BP1, BP2, BP3 and negative side weighting selection signals BN1, BN2, BN3.

As illustrated in FIG. 12(*c*), the positive side and negative side input transistor switch of each channel (13$_k$, 13$_{k+1}$), (23$_k$, 23$_{k+1}$) turns on only during a period corresponding to a given tone data (DATA). Accordingly, a drive voltage with gamma curve corrected is supplied to each channel of a horizontal pixel line of liquid crystal display panel.

A peripheral circuit of the six embodiment of the multi-channel drive circuit according to the present invention is illustrated in a block diagram of FIG. 11. Referring to FIG. 11, reference numeral 201 denotes a 10-bit data latch; 202 a 10-bit counter; 203 a 10-bit comparator; 204 a level conversion circuit; 205 a memory; 206 a change point comparator; 207 a liquid crystal panel.

The operation of this circuit will be briefly described below. Tone data inputted to the 10-bit data latch 201$_1$ is compared by the 10-bit comparator 203$_1$ with time data of 1024 counted by the 10-bit counter 202. The 10-bit comparator 203$_1$ continues to output a continuous signal via the level conversion circuit 204$_1$ to the drive circuit 17$_1$, 27$_1$ until the two data agree with each other. The level conversion circuit 204$_1$ acts as an interface between the 10-bit comparator 203$_1$ and the drive circuits 17$_1$, 27$_1$ and performs voltage level conversion (IN_A and IN_B denote a signal for controlling polarity selection of the drive circuit). Meanwhile, preliminarily stored in the memory 205 is information on which current is to be flowed at a given period of the period of 0 to 1023 so that an adaptation to the gamma characteristics of the liquid crystal panel 207 is made (for example, referring to FIG. 10, added current of the unit current source 173*k* and unit current source 172*k* is made to flow for data 00 to 04 of the counter 202, and only the unit current source 171*k* is made to flow for data 05 to 10 of the counter 202). The change point comparator 206 reads current value data from the memory 205 in accordance with count data of the 10-bit counter 202 and sends the read current value data (BP1 to 3, BN1 to 3) to the drive circuit 17$_1$, 27$_1$, whereby the modulation type current source output is implemented.

An exemplary configuration in which the whole circuit is constituted of a plurality of IC chips is illustrated in FIG. 13.

In this example, the whole multichannel drive circuit acting as the source driver circuit of a display panel is constituted of a plurality of IC chips; only three IC chips $\mathbf{101}_{k-1}$, $\mathbf{101}_{k}$, $\mathbf{101}_{k+1}$ of the plurality of IC chips are illustrated here.

Arranged in the interior of each IC chip $\mathbf{101}_{k-1}$, $\mathbf{101}_{k}$, $\mathbf{101}_{k+1}$ is an interchannel common connection line 5 formed of low resistance metal substance such as aluminum. The right side end of each interchannel common connection line 5 is extracted to a right side terminal pad PDR; the left side end of each interchannel common connection line 5 is extracted to a left side terminal pad PDL.

Conduction between the left side terminal pad PDL of the IC chip $\mathbf{101}_{k}$ and the right side terminal pad PDR of the IC chip $\mathbf{101}_{k-1}$ adjoining in the left side of the IC chip $\mathbf{101}_{k}$ is made via an appropriate connection conductor 50; conduction between the right side terminal pad PDR of the IC chip $\mathbf{101}_{k}$ and the left side terminal pad PDL of the IC chip $\mathbf{101}_{k+1}$ adjoining in the right side of the IC chip $\mathbf{101}_{k}$ is made via an appropriate connection conductor 50.

Accordingly, the interchannel common connection lines 5 in a series of the adjoining IC chips are connected with each other. Thus, the operation and effect of the present invention is achieved not only with respect to a variation between channels but also with respect to a variation between chips.

A seventh embodiment (a variation of bipolar drive type) of the inventive multichannel drive circuit is illustrated in FIG. 14. In FIG. 14, the same reference characters are applied to constituent parts having the same configuration as those of the sixth embodiment described above with reference to FIG. 10, and an explanation thereof is omitted.

This seventh embodiment is characterized in that, the positive side and negative side modulation type current sources are formed so as to have a different characteristic for each color RGB and at the same time, three interchannel common connection lines for making connection between these modulation type current sources for each color RGB are arranged for each of the positive side and negative side.

More specifically, of pairs of positive and negative modulation type current sources ($\mathbf{17}_{k}$, $\mathbf{27}_{k}$) to ($\mathbf{17}_{k+5}$, $\mathbf{27}_{k+5}$), the pairs ($\mathbf{17}_{k}$, $\mathbf{27}_{k}$) to ($\mathbf{17}_{k+3}$, $\mathbf{27}_{k+3}$) are used for R (red), the pairs ($\mathbf{17}_{k+1}$, $\mathbf{27}_{k+1}$) to ($\mathbf{17}_{k+4}$, $\mathbf{27}_{k+4}$) are used for G (green), and the pairs ($\mathbf{17}_{k+2}$, $\mathbf{27}_{k+2}$) to ($\mathbf{17}_{k+5}$, $\mathbf{27}_{k+5}$) are used for B (blue).

Common connection between the positive side modulation type current sources ($\mathbf{17}_{k}$, $\mathbf{17}_{k+3}$, . . . ) for R (red) is made via a positive side interchannel common connection line 5R for R (red); common connection between the positive side modulation type current sources ($\mathbf{17}_{k+1}$, $\mathbf{17}_{k+4}$, . . . ) for G (green) is made via a positive side interchannel common connection line 5G for G (green); common connection between the positive side modulation type current sources ($\mathbf{17}_{k+2}$, $\mathbf{17}_{k+5}$, . . . ) for B (blue) is made via a positive side interchannel common connection line 5B for B (blue).

Also, common connection between the negative side modulation type current sources ($\mathbf{27}_{k}$, $\mathbf{27}_{k+3}$, . . . ) for R (red) is made via a negative side interchannel common connection line 6R for R (red); common connection between the negative side modulation type current sources ($\mathbf{27}_{k+1}$, $\mathbf{27}_{k+4}$, . . . ) for G (green) is made via a negative side interchannel common connection line 6G for G (green); connection between the negative side modulation type current sources ($\mathbf{27}_{k+2}$, $\mathbf{27}_{k+5}$, . . . ) for B (blue) is made via a negative side interchannel common connection line 6B for B (blue).

Here, as illustrated in FIG. 15, the modulation type current source for R (red), the modulation type current source for G (green) and the modulation type current source for B (blue) are formed corresponding respectively to gamma correction curves of a different characteristic.

Consequently, according to the seventh embodiment, in addition to that gamma correction can be made for each color RGB, a variation between the channels dedicated to color red, a variation between the channels dedicated to color green, and a variation between the channels dedicated to color blue are eliminated, and thus a uniform drive mode can be implemented.

In this case, when the whole circuit 100 is constituted of a plurality of IC chips, as illustrated in FIG. 16, conduction between terminal pad lines (PDR11, PDR12, PDR13, PDR21, PDR22, PDR23), (PDL11, PDL12, PDL13, PDL21, PDL22, PDL23) corresponding respectively to the connection lines (5R, 5G, 5B), (6R, 6G, 6B) arranged in the corresponding ends of the adjoining IC chips $\mathbf{101}_{k}$, $\mathbf{101}_{k+1}$ may be made via appropriate connection conductors (511, 512, 513, 521, 522, 523).

A layout of the connection terminal between chips is illustrated in FIGS. 17 and 18. Illustrated in FIG. 17 is a case where the package is TCP (tape carrier package) or COF (chip on film); illustrated in FIG. 18 is a case where the package is plastic or ceramic.

Referring to FIGS. 17 and 18, reference character 101 denotes an LSI chip; 102 a package; Tp an external terminal for extracting the positive side interchannel common connection line to the outside; Tn an external terminal for extracting the negative side interchannel common connection line to the outside: 50*p* a connection conductor for making conduction between the terminals Tp of adjoining packages; 50*n* a connection conductor for making conduction between the terminals Tn of adjoining packages.

According to such a configuration, when the external terminals Tp, Tn exposed to the outside of the package 102 are connected by use of appropriate connection conductors, the positive side and negative side interchannel common connection lines of the multichannel drive circuits (in this example, a bipolar drive type) arranged in the package 102 are connected in series, whereby the connected interchannel common connection lines can be made to have the same potential. Thus, when a plurality of the IC ships are connected in series to construct the multichannel drive circuit, wiring between the interchannel common connection lines is facilitated.

Finally, several exemplary applications of the multichannel drive circuit 100 according to the present invention will be described with reference to FIGS. 19 to 21.

In FIG. 19, there is illustrated an example where the first embodiment of the multichannel drive circuit of the present invention is applied to an organic EL panel. In FIG. 19, of lines composed of a series of organic EL pixels {(40 $\mathbf{1}_{k}$), (40 $\mathbf{1}_{k+1}$), (40 $\mathbf{1}_{k+2}$), (40 $\mathbf{1}_{k+3}$)}, {(40 $\mathbf{2}_{k}$), (40 $\mathbf{2}_{k+1}$), (40 $\mathbf{2}_{k+2}$), (40 $\mathbf{2}_{k+3}$)} . . . , one selected by switches (SW1, SW2, . . . ) arranged in a scanning driver 60 corresponds to the load array referred to in the present invention.

An exemplary application of the multichannel drive circuit of the present invention to a TFT liquid crystal panel of the third embodiment is illustrated in FIG. 20. In FIG. 20, reference character 2C denotes a liquid crystal element constituting one pixel. It is noted that, in FIG. 20, the pre-charge circuits such as pre-charge analog switches are omitted in the interest of space. In this example, a line composed of a series of horizontal liquid crystal pixels can be bipolar-driven.

An exemplary application of the multichannel drive circuit of the present invention to an organic EL panel of the fifth embodiment is illustrated in FIG. 21. In FIG. 21, reference characters $\mathbf{40}_{k}$, $\mathbf{40}_{k+1}$ denote an organic EL element corresponding to one pixel.

In this example, as the current sources of each channel, there are used modulation type current sources and at the same time, of unit current sources (211$_k$, 211$_{k+1}$), (212$_k$, 212$_{k+1}$), (213$_k$, 213$_{k+1}$) arranged for each weighting value constituting respective modulation type current sources, those having the same weighting value are connected with each other via interchannel common connection lines 81, 82, 83, respectively.

Consequently, according to this example, in regard to the current sources of each weighting value constituting the respective modulation type current sources, a variation between the channels is eliminated, and thus a uniform drive mode between the channels can be implemented.

As evident from the above description of embodiments, the present invention is characterized chiefly by including: an interchannel common connection line for making conduction between current paths of each channel for connecting the respective current sources of each channel constituting the current source array with the respective input switches of each channel constituting the input switch array; and current blocking means for blocking output current of the current source of that channel of the plurality of channels in which the input switch is in an OFF state from flowing into the interchannel common connection line.

Here, the function of "current blocking means" can also be interpreted as one permitting the output current of the current source of that channel of the plurality of channels in which the input switch is in an ON state to flow into the interchannel common connection line, while blocking the output current of the current source of that channel of the plurality of channels in which the input switch is in an OFF state from flowing into the interchannel common connection line.

From this, the above described first embodiment (FIG. 1), second embodiment (FIG. 6), third embodiment (FIG. 7), fourth embodiment (FIG. 8) and sixth embodiment (FIG. 10) can be varied as follows.

A variation of the first embodiment is partly illustrated in FIG. 22. In FIG. 22, the same reference characters are applied to constituent parts having the same configuration as those of the first embodiment, and an explanation thereof is omitted. As illustrated in FIG. 22, in this example, the current path for connecting the current source transistor 11$_k$ with the input transistor 13$_k$ is isolated/separated from the interchannel common connection line 5*b* and at the same time, another switch transistor (supplementary transistor) 81$_k$ is made to lie between them (82$_k$, 83$_k$), and this supplementary transistor 81$_k$ is made to operate in conjunction with the input transistor 13$_k$, whereby the above described current blocking means is implemented.

That is, according to this circuit configuration, when the input transistor 13$_k$ is in an ON state, the supplementary transistor 81$_k$ also changes to an ON state, and thus conduction between the current path for connecting the current source transistor 11$_k$ with the input transistor 13$_k$ and the interchannel common connection line 5*b* is made, so the output current I11$_k$ of the current source 11$_k$ of that channel can flow into the interchannel common connection line 5*b*. In contrast, when the input transistor 13$_k$ is in an OFF state, the supplementary transistor also changes to an OFF state, and thus non-conduction between the current path for connecting the current source transistor 11$_k$ with the input transistor 13$_k$ and the interchannel common connection line 5*b* is made, so the output current I11$_k$ of the current source 11$_k$ of that channel cannot flow into the interchannel common connection line 5*b*.

A variation of the second embodiment is partly illustrated in FIG. 23. In FIG. 23, the same reference characters are applied to constituent parts having the same configuration as those of the second embodiment, and an explanation thereof is omitted. As illustrated in FIG. 23, in this example, the current path for connecting the current source transistor 21$_k$ with the input transistor 23$_k$ is isolated/separated from the interchannel common connection line 6*b* and at the same time, another switch transistor (supplementary transistor) 84$_k$ is made to lie between them (85$_k$, 86$_k$), and this supplementary transistor 84$_k$ is made to operate in conjunction with the input transistor 23$_k$, whereby the above described current blocking means is implemented.

That is, according to this circuit configuration, when the input transistor 23$_k$ is in an ON state, the supplementary transistor 84$_k$ also changes to an ON state, and thus conduction between the current path for connecting the current source transistor 21$_k$ with the input transistor 23$_k$ and the interchannel common connection line 6*b* is made, so the output current I21$_k$ of the current source 21$_k$ of that channel can flow into the interchannel common connection line 6*b*. In contrast, when the input transistor 23$_k$ is in an OFF state, the supplementary transistor 84$_k$ also changes to an OFF state, and thus non-conduction between the current path for connecting the current source transistor 21$_k$ with the input transistor 23$_k$ and the interchannel common connection line 6*b* is made, so the output current I21$_k$ of the current source 21$_k$ of that channel cannot flow into the interchannel common connection line 6*b*.

A variation of the third embodiment is partly illustrated in FIG. 24. In FIG. 24, the same reference characters are applied to constituent parts having the same configuration as those of the third embodiment, and an explanation thereof is omitted. As illustrated in FIG. 24, in this example, the positive side and negative side parts of the above described current blocking means are configured as follows.

That is, concerning the positive side, the current path for connecting the current source transistor 11$_k$ with the input transistor 13$_k$ is isolated/separated from the interchannel common connection line 5*b* and at the same time, another switch transistor (supplementary transistor) 81$_k$ is made to lie between them (82$_k$, 83$_k$) and this supplementary transistor 81$_k$ is made to operate in conjunction with the input transistor 13$_k$, whereby the current blocking means is implemented. Also, concerning the negative side, the current path for connecting the current source transistor 21$_k$ with the input transistor 23$_k$ is isolated/separated from the interchannel common connection line 6*b* and at the same time, another switch transistor (supplementary transistor) 84$_k$ is made to lie between them (85$_k$, 86$_k$), and this supplementary transistor 84$_k$ is made to operate in conjunction with the input transistor 23$_k$, whereby the current blocking means is implemented.

That is, according to this circuit configuration, the input transistors 13$_k$ and 23$_k$ turn on/off alternately. When the input transistor 13$_k$ is in an ON state, the supplementary transistor 81$_k$ also changes to an ON state, and thus conduction between the current path for connecting the current source transistor 11$_k$ with the input transistor 13$_k$ and the interchannel common connection line 5*b* is made, so the output current I11$_k$ of the current source 11$_k$ of that channel can flow into the interchannel common connection line 5*b*. In contrast, when the input transistor 13$_k$ is in an OFF state, the supplementary transistor 81$_k$ also changes to an OFF state, and thus non-conduction between the current path for connecting the current source transistor 11$_k$ with the input transistor 13$_k$ and the interchannel common connection line 5*b* is made, so the output current I11$_k$ of the current source 11$_k$ of that channel cannot flow into the interchannel common connection line 5*b*. When the input transistor 23$_k$ is in an ON state, the supplementary transistor 84$_k$ also changes to an ON state, and thus conduction between the current path for connecting the current source transistor

21$_k$ with the input transistor 23$_k$ and the interchannel common connection line 6*b* is made, so the output current I21$_k$ of the current source 21$_k$ of that channel can flow into the interchannel common connection line 6*b*. In contrast, when the input transistor 23$_k$ is in an OFF state, the supplementary transistor 84$_k$ also changes to an OFF state, and thus non-conduction between the current path for connecting the current source transistor 21$_k$ with the input transistor 23$_k$ and the interchannel common connection line 6*b* is made, so the output current I21$_k$ of the current source 21$_k$ of that channel cannot flow into the interchannel common connection line 6*b*.

A variation of the fourth embodiment is partly illustrated in FIG. 25. In FIG. 25, the same reference characters are applied to constituent parts having the same configuration as those of the fourth embodiment, and an explanation thereof is omitted. As illustrated in FIG. 25, in this example, the positive side and negative side parts of the above described current blocking means are configured as follows.

That is, concerning the positive side, the current path for connecting the current source transistor 11$_k$ with the input transistor 13$_k$ is isolated/separated from the interchannel common connection line 5*b* and at the same time, another switch transistor (supplementary transistor) 81$_k$ is made to lie between them (82$_k$, 83$_k$) and this supplementary transistor 81$_k$ is made to operate in conjunction with the input transistor 13$_k$, whereby the current blocking means is implemented. Also, concerning the negative side, the current path for connecting the current source transistor 21$_k$ with the input transistor 23$_k$ is isolated/separated from the interchannel common connection line 6*b* and at the same time, another switch transistor (supplementary transistor) 84$_k$ is made to lie between them (85$_k$, 86$_k$), and this supplementary transistor 84$_k$ is made to operate in conjunction with the input transistor 23$_k$, whereby the current blocking means is implemented.

That is, according to this circuit configuration, the input transistors 13$_k$ and 23$_k$ turn on/off alternately. When the input transistor 13$_k$ is in an ON state, the supplementary transistor 81$_k$ also changes to an ON state, and thus conduction between the current path for connecting the current source transistor 11$_k$ with the input transistor 13$_k$ and the interchannel common connection line 5*b* is made, so the output current I11$_k$ of the current source 11$_k$ of that channel can flow into the interchannel common connection line 5*b*. In contrast, when the input transistor 13$_k$ is in an OFF state, the supplementary transistor 81$_k$ also changes to an OFF state, and thus non-conduction between the current path for connecting the current source transistor 11$_k$ with the input transistor 13$_k$ and the interchannel common connection line 5*b* is made, so the output current I11$_k$ of the current source 11$_k$ of that channel cannot flow into the interchannel common connection line 5*b*. When the input transistor 23$_k$ is in an ON state, the supplementary transistor 84$_k$ also changes to an ON state, and thus conduction between the current path for connecting the current source transistor 21$_k$ with the input transistor 23$_k$ and the interchannel common connection line 6*b* is made, so the output current I21$_k$ of the current source 21$_k$ of that channel can flow into the interchannel common connection line 6*b*. In contrast, when the input transistor 23$_k$ is in an OFF state, the supplementary transistor 84$_k$ also changes to an OFF state, and thus non-conduction between the current path for connecting the current source transistor 21$_k$ with the input transistor 23$_k$ and the interchannel common connection line 6*b* is made, so the output current I21$_k$ of the current source 21$_k$ of that channel cannot flow into the interchannel common connection line 6*b*.

A variation of the sixth embodiment is partly illustrated in FIG. 26. In FIG. 26, the same reference characters are applied to constituent parts having the same configuration as those of the sixth embodiment, and an explanation thereof is omitted. As illustrated in FIG. 26, in this example, the positive side and negative side parts of the above described current blocking means are configured as follows.

That is, concerning the positive side, the current paths for connecting the current source transistors 171$_k$, 172$_k$, 173$_k$ with the input transistors 174$_k$, 175$_k$, 176$_k$ are isolated/separated from the interchannel common connection line 5*b* and at the same time, other switch transistors (supplementary transistors) 170-1$_k$, 170-2$_k$, 170-3$_k$ are made to lie therebetween and these supplementary transistors 170-1$_k$, 170-2$_k$, 170-3$_k$ are made to operate in conjunction with the input transistors 174$_k$, 175$_k$, 176$_k$, whereby the current blocking means is implemented. Also, concerning the negative side, the current paths for connecting the current source transistors 271$_k$, 272$_k$, 273$_k$ with the input transistors 274$_k$, 275$_k$, 276$_k$ are isolated/separated from the interchannel common connection line 6*b* and at the same time, other switch transistors (supplementary transistors) 270-1$_k$, 270-2$_k$, 270-3$_k$ are made to lie therebetween, and these supplementary transistors 270-1$_k$, 270-2$_k$, 270-3$_k$ are made to operate in conjunction with the input transistors 274$_k$, 275$_k$, 276$_k$, whereby the current blocking means is implemented.

That is, according to this circuit configuration, the input transistors 174$_k$, 175$_k$, 176$_k$ and 274$_k$, 275$_k$, 276$_k$ turn on/off alternately. When the input transistors 174$_k$, 175$_k$, 176$_k$ are in an ON state, the supplementary transistors 170-1$_k$, 170-2$_k$, 170-3$_k$ also change to an ON state, and thus conduction between the current paths for connecting the current source transistors 171$_k$, 172$_k$, 173$_k$ with the input transistors 174$_k$, 175$_k$, 176$_k$ and the interchannel common connection line 5*b* is made, so the output current of the current sources 171$_k$, 172$_k$, 173$_k$ of that channel can flow into the interchannel common connection line 5*b*. In contrast, when the input transistors 174$_k$, 175$_k$, 176$_k$ are in an OFF state, the supplementary transistors 170-1$_k$, 170-2$_k$, 170-3$_k$ also change to an OFF state, and thus non-conduction between the current paths for connecting the current source transistors 171$_k$, 172$_k$, 173$_k$ with the input transistors 174$_k$, 175$_k$, 176$_k$ and the interchannel common connection line 5*b* is made, so the output current of the current sources 171$_k$, 172$_k$, 173$_k$ of that channel cannot flow into the interchannel common connection line 5*b*.

When the input transistors 274$_k$, 275$_k$, 276$_k$ are in an ON state, the supplementary transistors 270-1$_k$, 270-2$_k$, 270-3$_k$ also change to an ON state, and thus conduction between the current paths for connecting the current source transistors 271$_k$, 272$_k$, 273$_k$ with the input transistors 274$_k$, 275$_k$, 276$_k$ and the interchannel common connection line 6*b* is made, so the output current of the current sources 271$_k$, 272$_k$, 273$_k$ of that channel can flow into the interchannel common connection line 6*b*. In contrast, when the input transistor 274$_k$, 275$_k$, 276$_k$ is in an OFF state, the supplementary transistor 270-1$_k$, 270-2$_k$, 270-3$_k$ also changes to an OFF state, and thus non-conduction between the current paths for connecting the current source transistors 271$_k$, 272$_k$, 273$_k$ with the input transistors 274$_k$, 275$_k$, 276$_k$ and the interchannel common connection line 6*b* is made, so the output current of the current sources 271$_k$, 272$_k$, 273$_k$ of that channel cannot flow into the interchannel common connection line 6*b*.

INDUSTRIAL APPLICABILITY

According to the present invention, it is possible to provide a multichannel drive circuit by which, even when there occurs a variation between channels in circuit characteristics of each channel including current source due to the semiconductor manufacturing process and the like, loads of each channel constituting a load array can be driven under conditions uniform between all channels. Such a multichannel drive circuit is used to drive an arrayed load such as a horizontal pixel line of various types of flat panel displays (for example, liquid crystal display or organic EL display) or a printing dot line of printer head.

DESCRIPTION OF SYMBOLS

Figure 1:
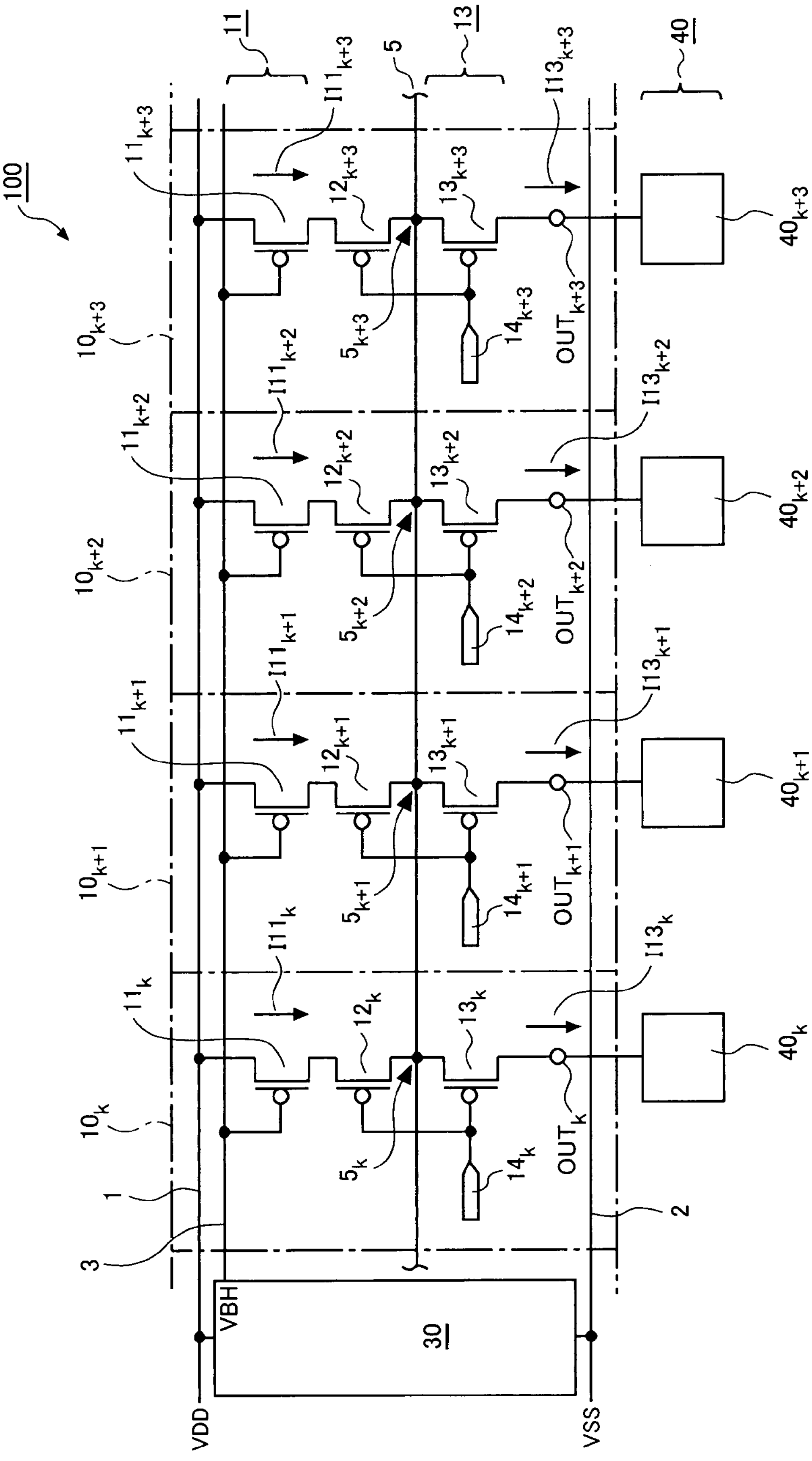
FIG. 1 is a configuration diagram of a first embodiment (positive drive type) of a multichannel drive circuit according to the present invention.
Figure 2:
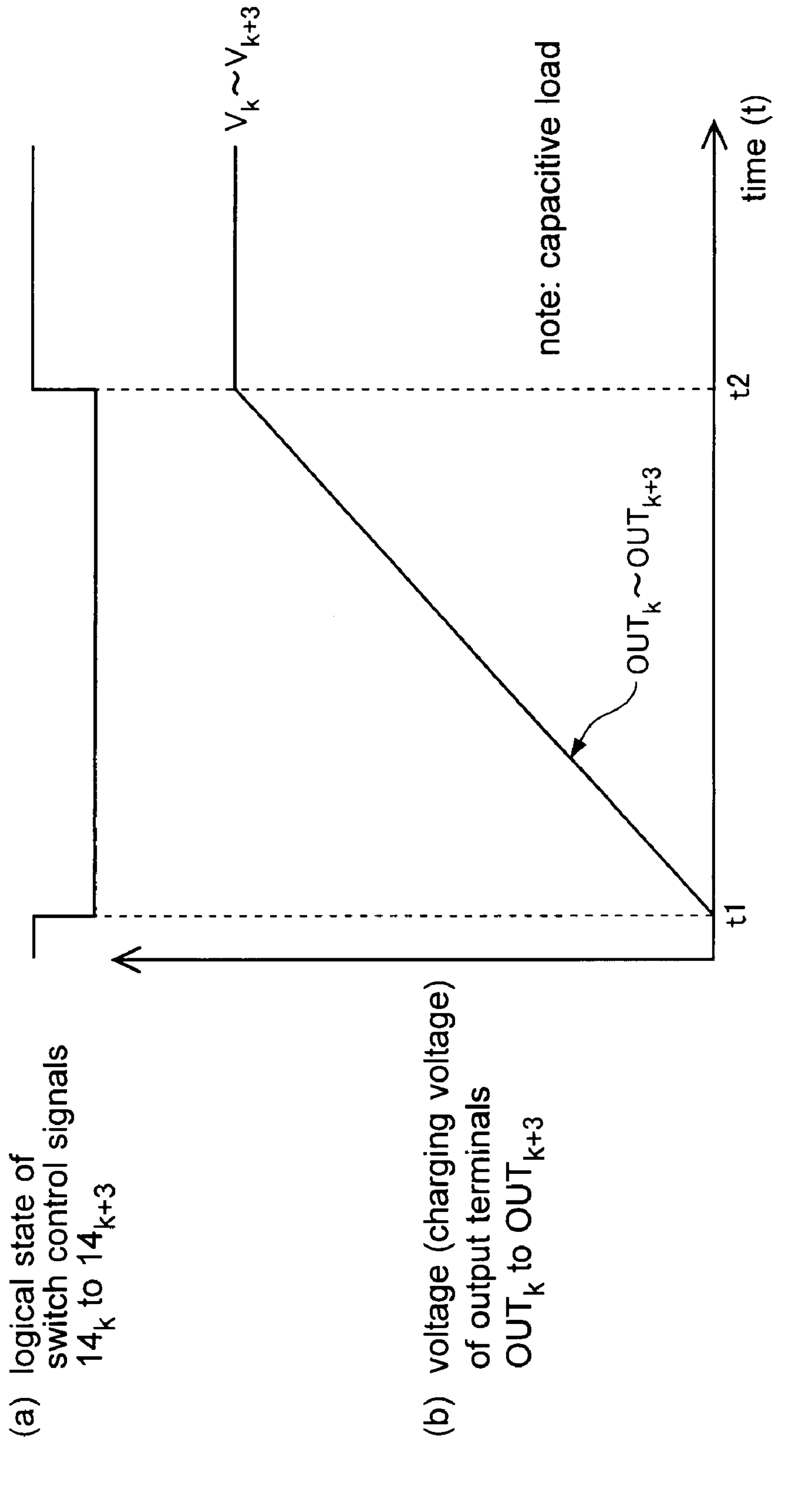
FIG. 2 is a view illustrating output characteristics (ON-period being identical for all the channels) of the multichannel drive circuit according to the present invention.
Figure 3:
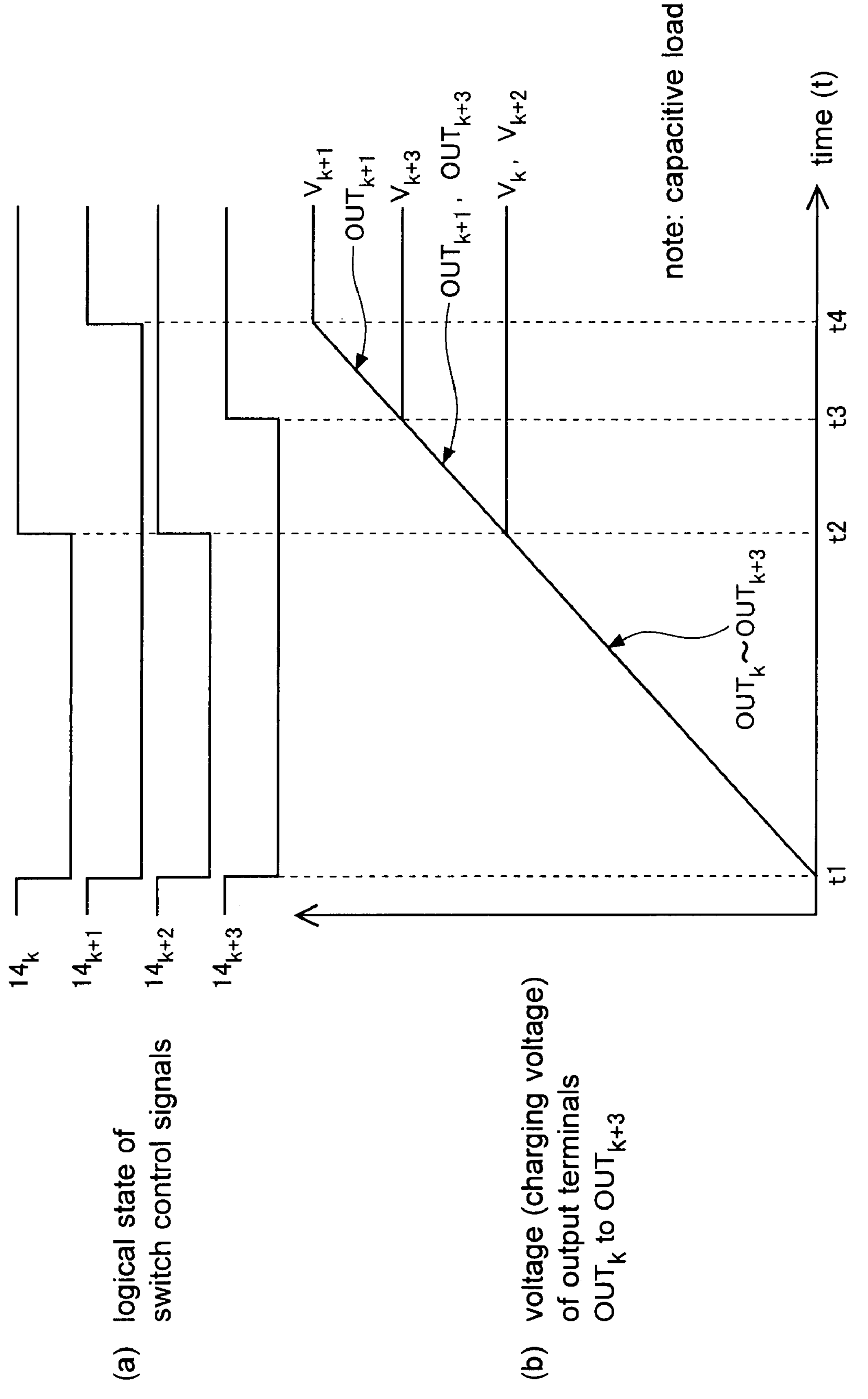
FIG. 3 is a view illustrating output characteristics (ON-period being different between all the channels) of the multichannel drive circuit according to the present invention.
Figure 4:
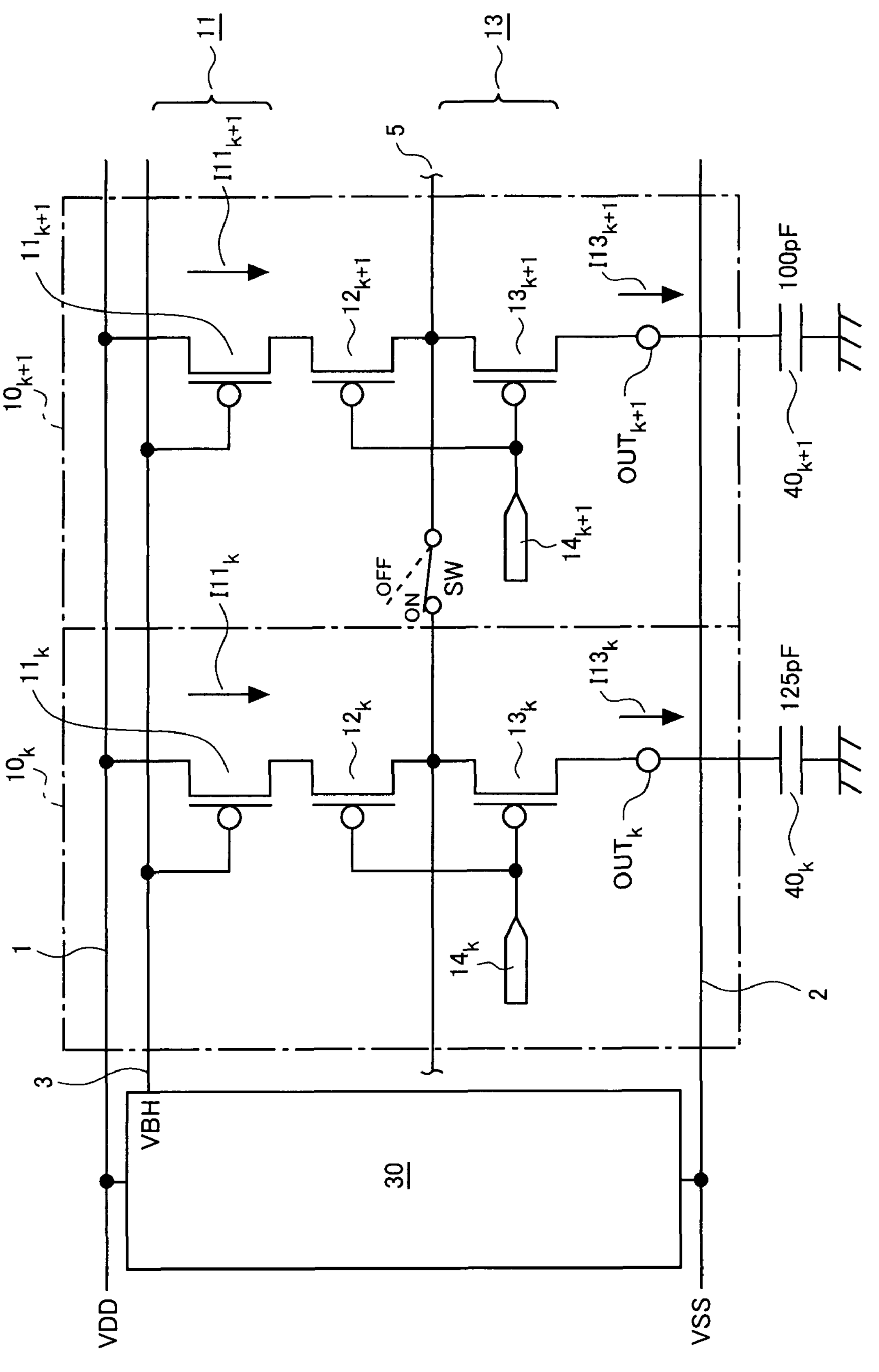
FIG. 4 is a view of a circuit for verifying the voltage averaging action of the multichannel drive circuit according to the present invention.
Figure 5:
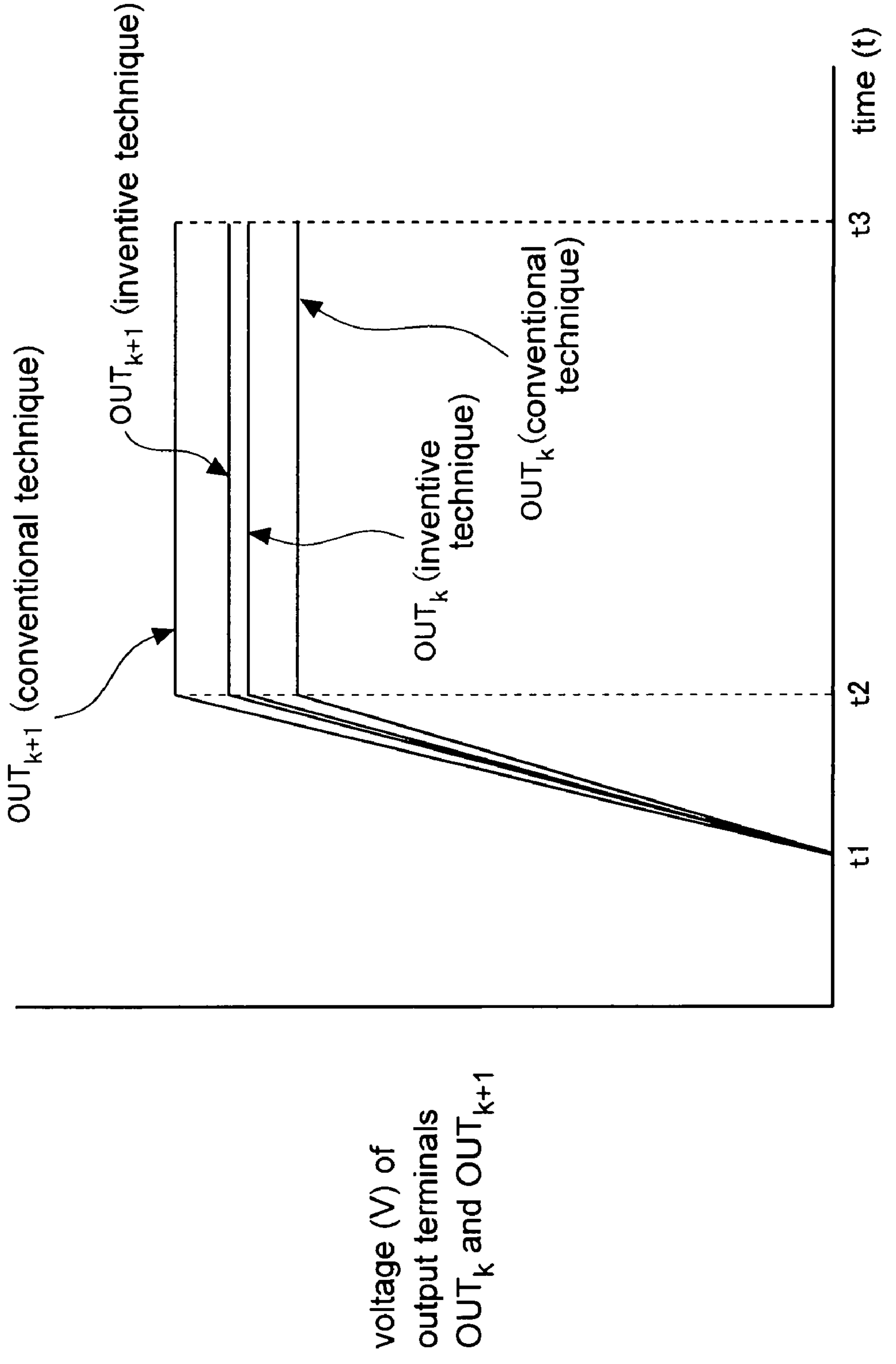
FIG. 5 is a view for explaining the voltage averaging action of the multichannel drive circuit according to the present invention.
Figure 6:
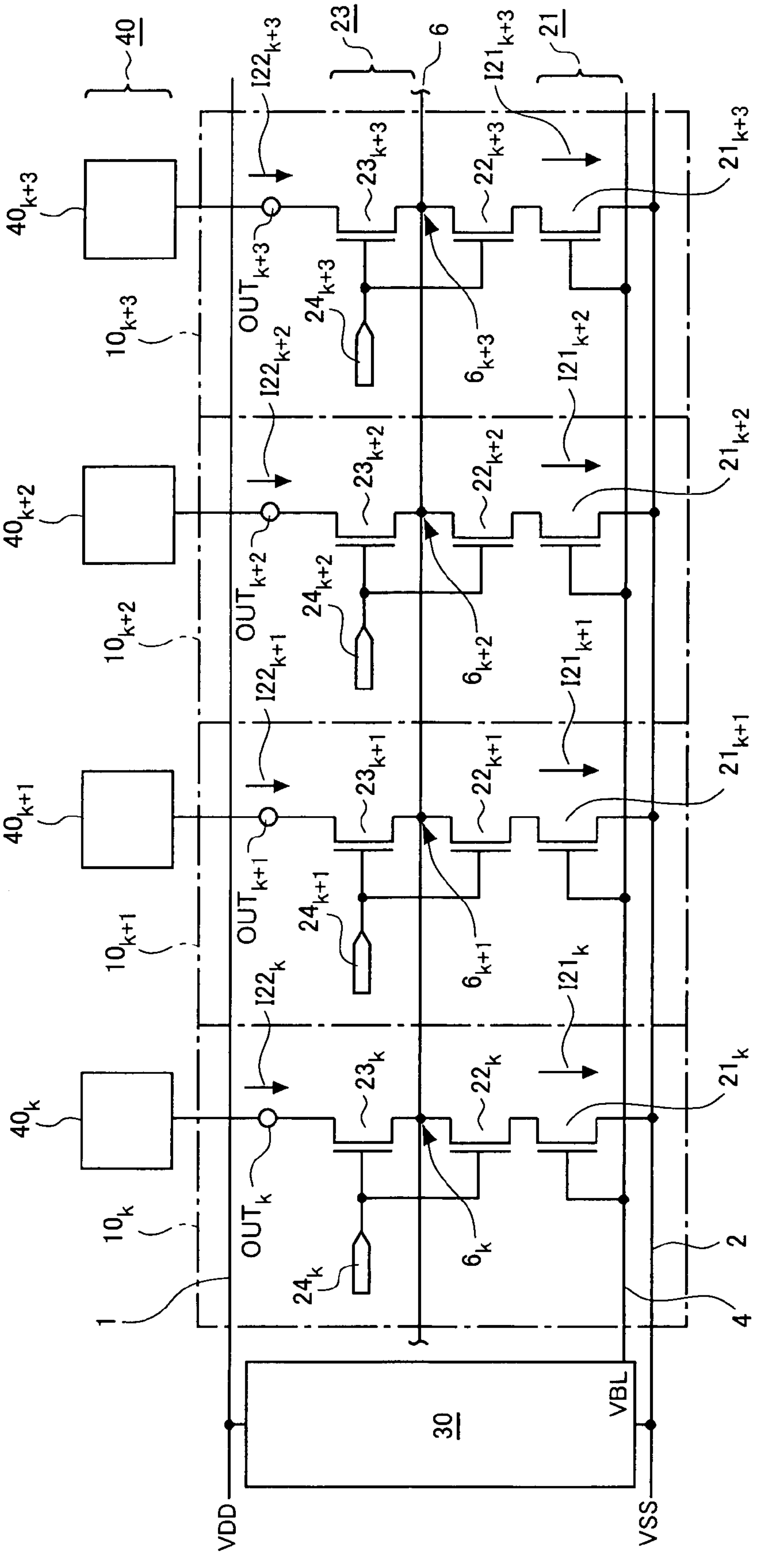
FIG. 6 is a configuration diagram of a second embodiment (negative drive type) of the multichannel drive circuit according to the present invention.
Figure 7:
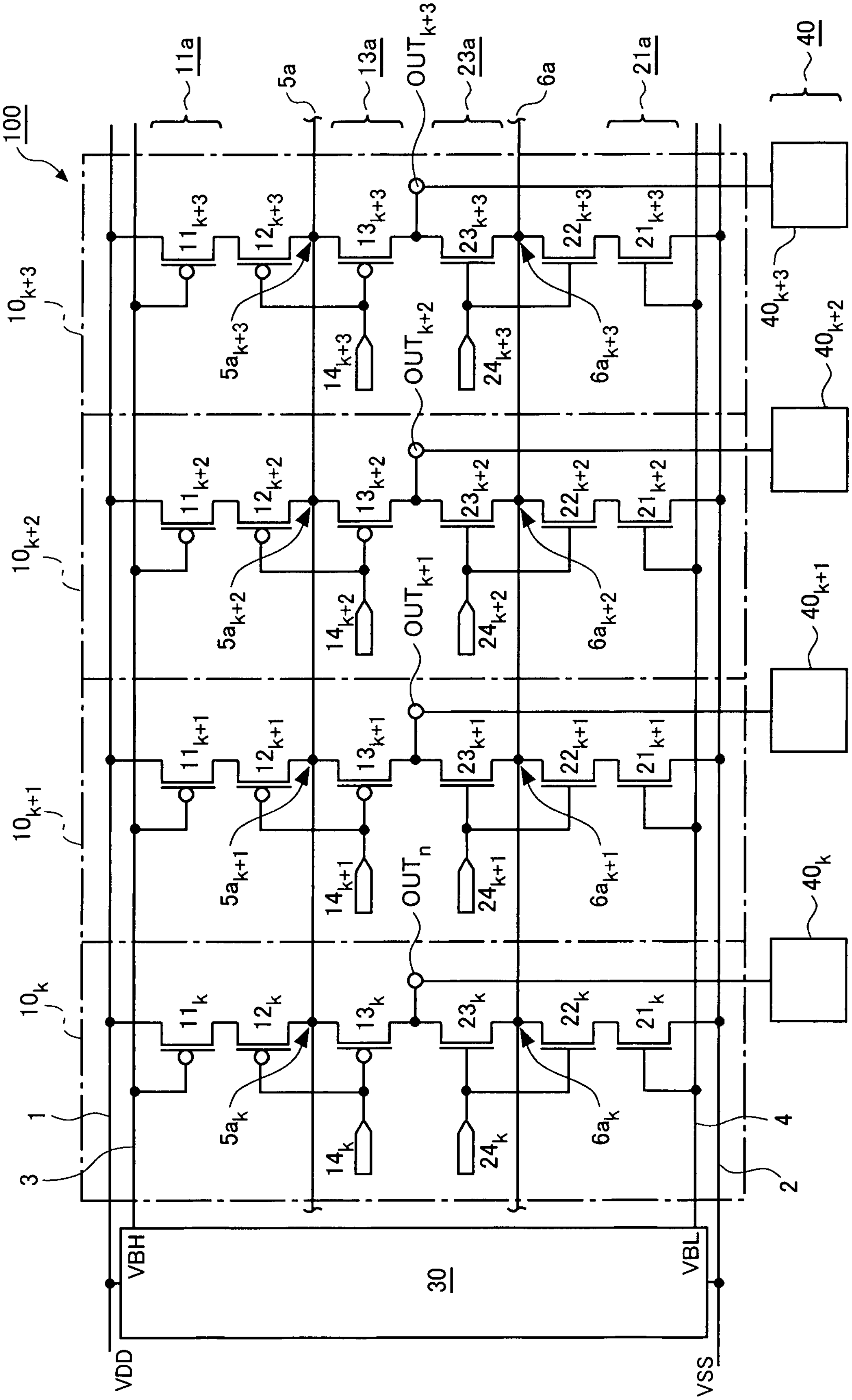
FIG. 7 is a configuration diagram of a third embodiment (bipolar drive type) of the multichannel drive circuit according to the present invention.
Figure 8:
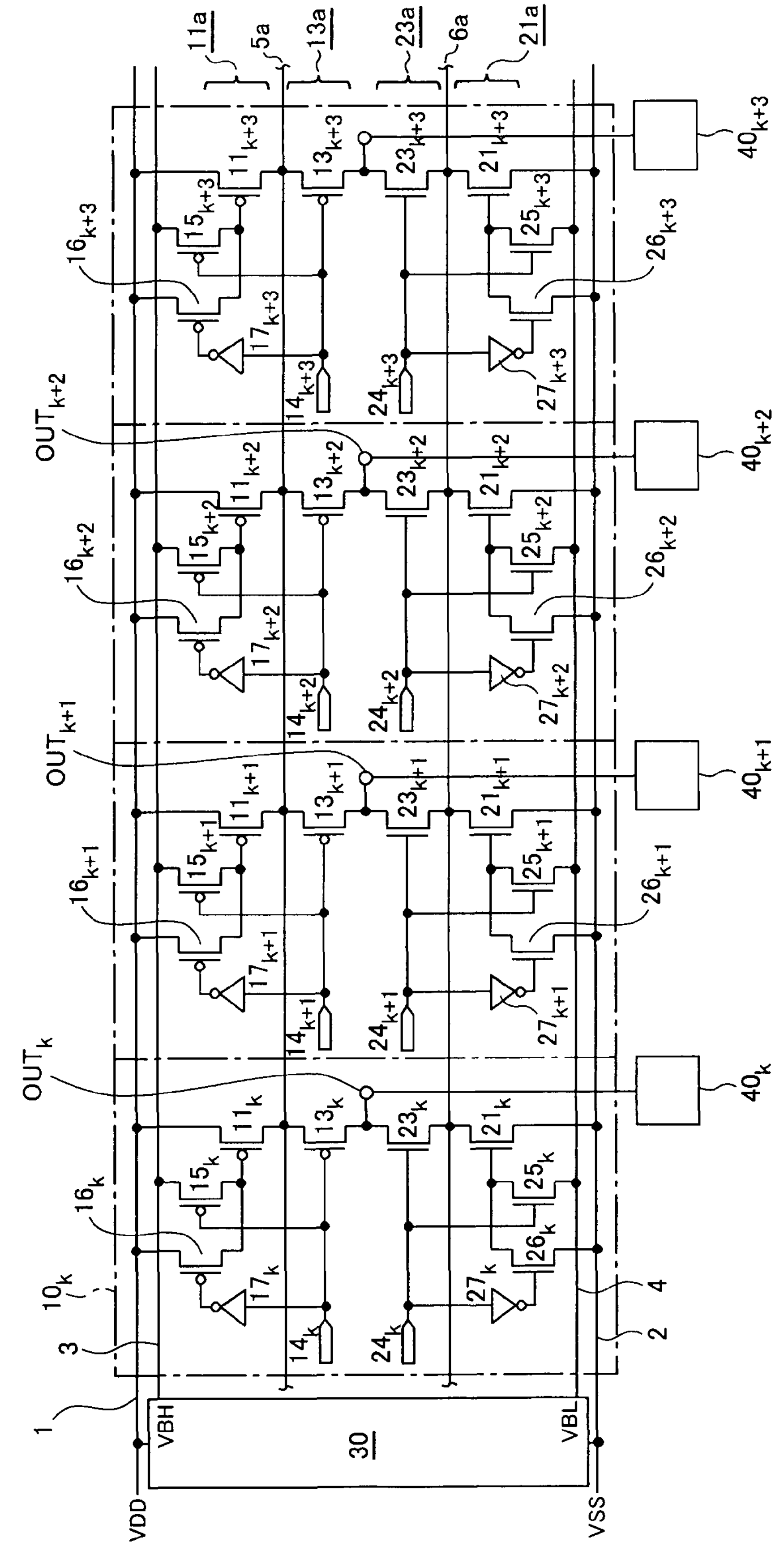
FIG. 8 is a configuration diagram of a fourth embodiment (a variation of the bipolar drive type) of the multichannel drive circuit according to the present invention.
Figure 9:
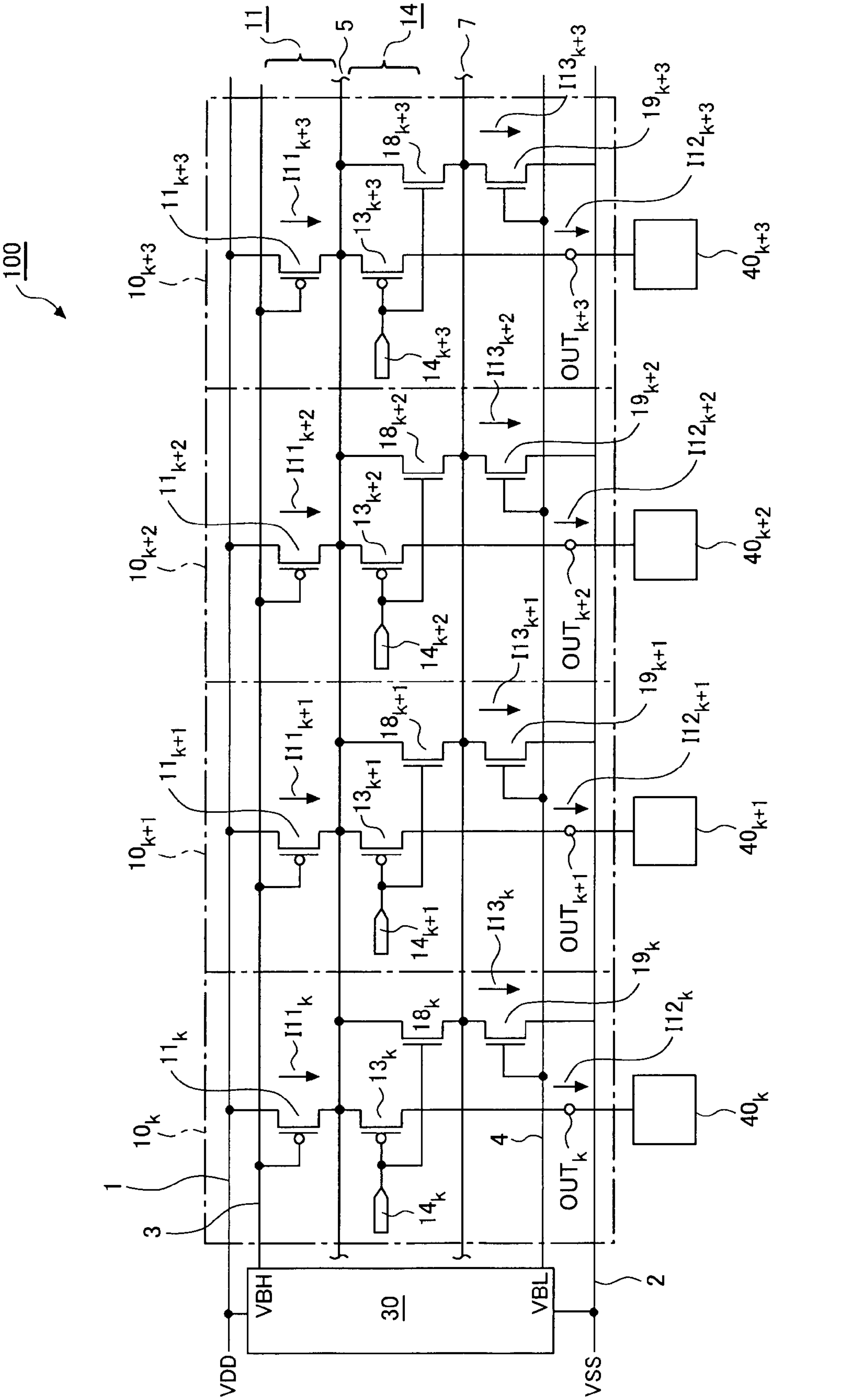
FIG. 9 is a configuration diagram of a fifth embodiment (a variation of the positive drive type) of the multichannel drive circuit according to the present invention.
Figure 10:
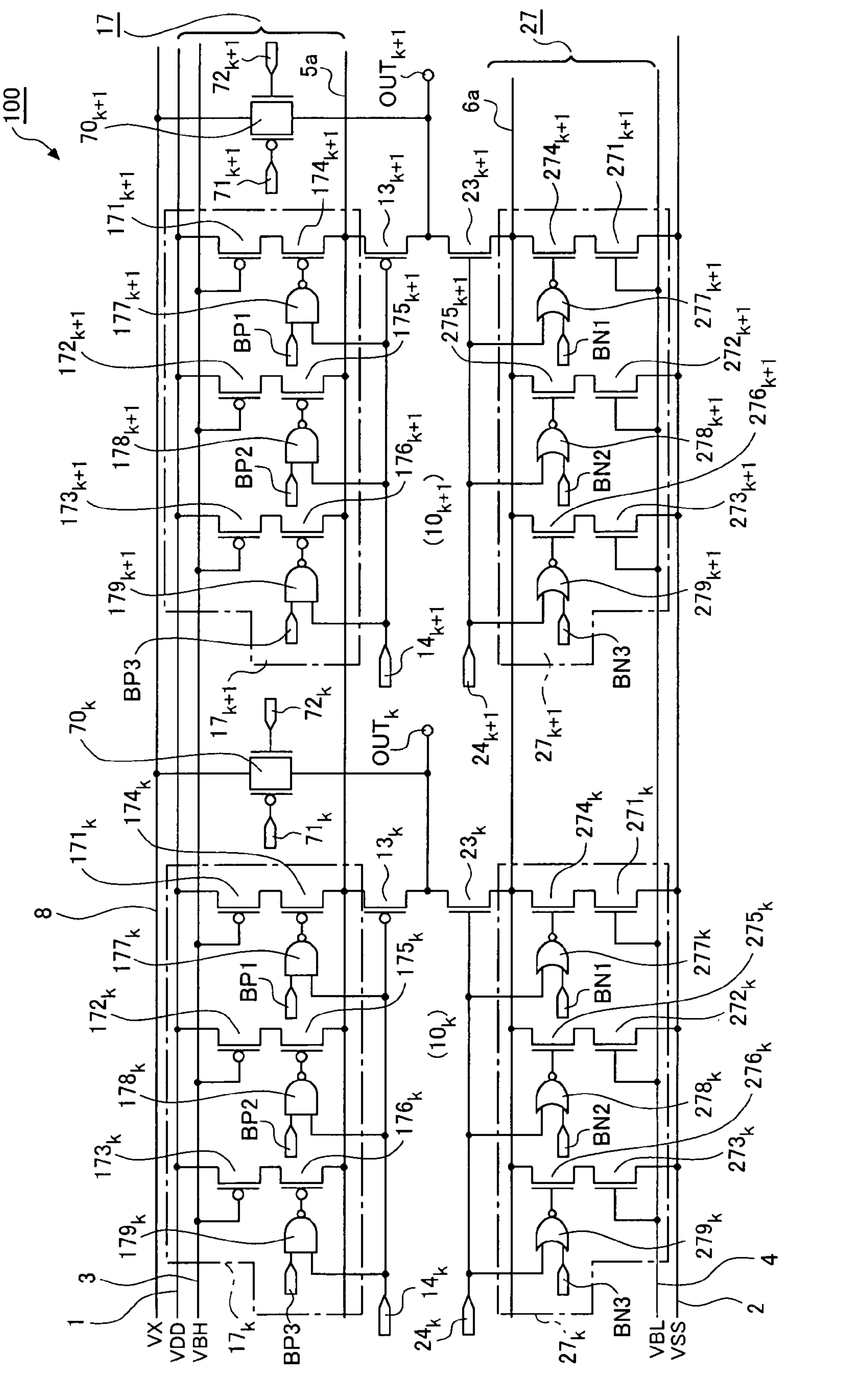
FIG. 10 is a configuration diagram of a sixth embodiment (a variation of the bipolar drive type) of the multichannel drive circuit according to the present invention.
Figure 11:
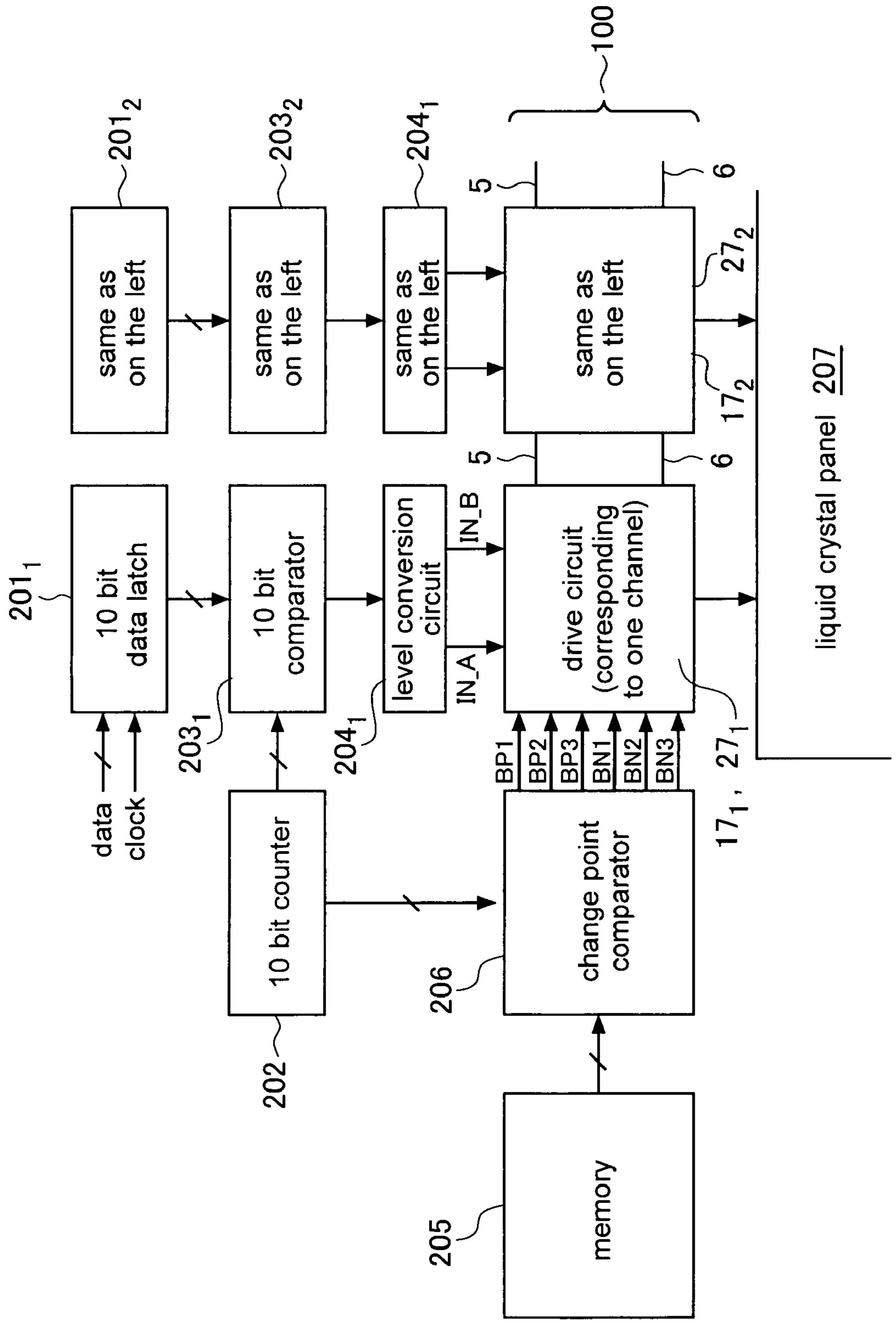
FIG. 11 is a view illustrating a peripheral circuit of the sixth embodiment of the multichannel drive circuit according to the present invention.
Figure 12:
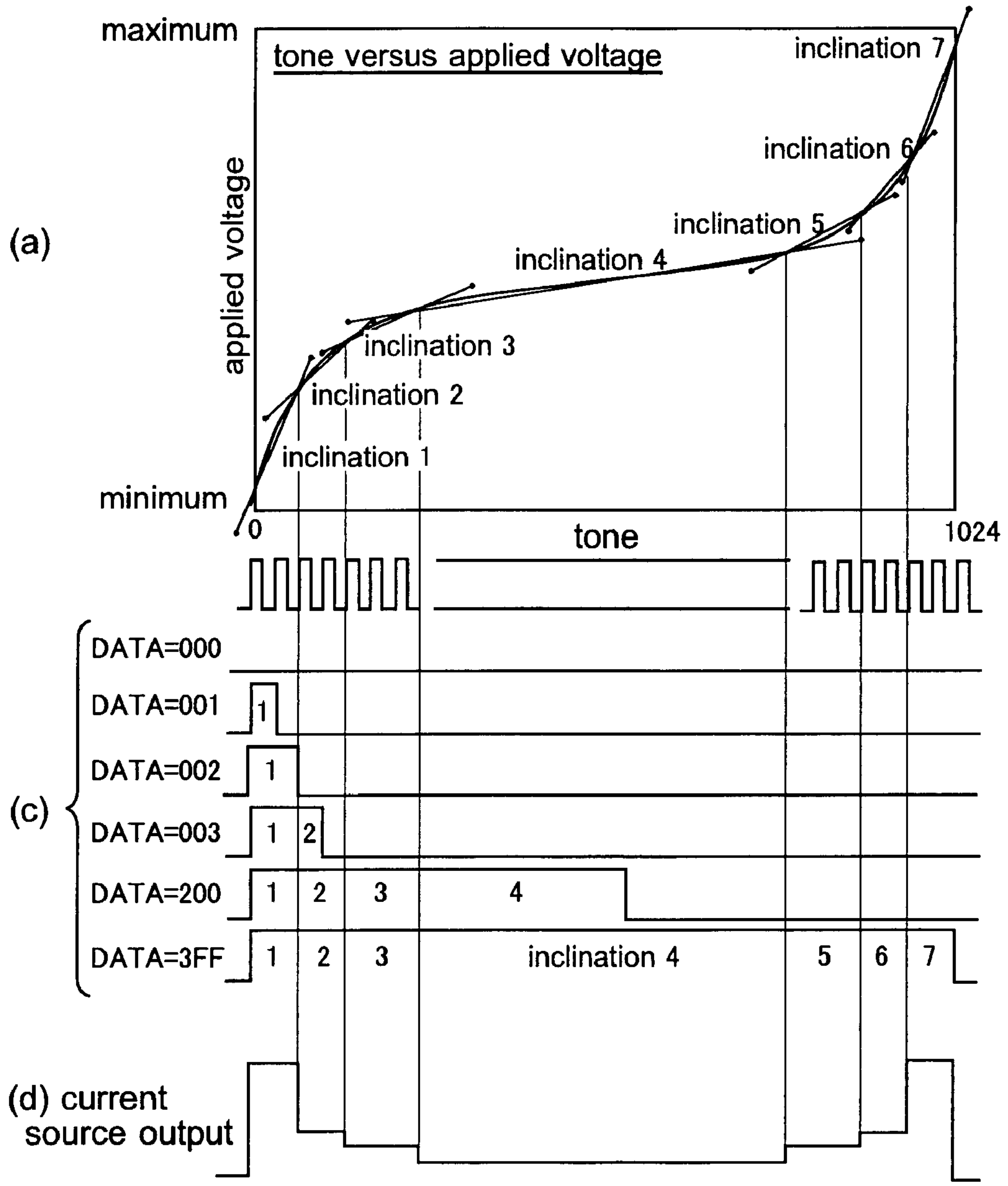
FIG. 12 is a view illustrating a relationship between applied voltage, tone DATA and current source output.
Figure 13:
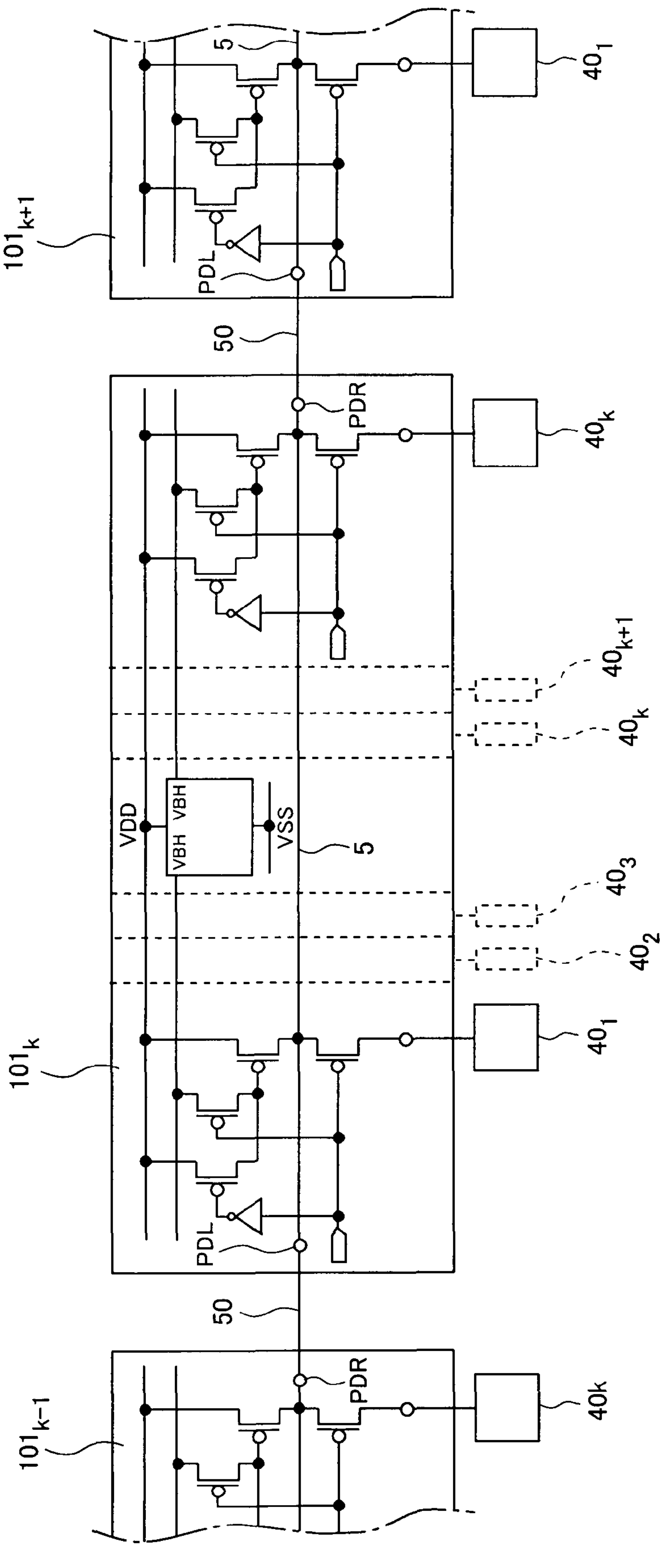
FIG. 13 is a view illustrating an example where the whole circuit is constituted of a plurality of IC chips.
Figure 14:
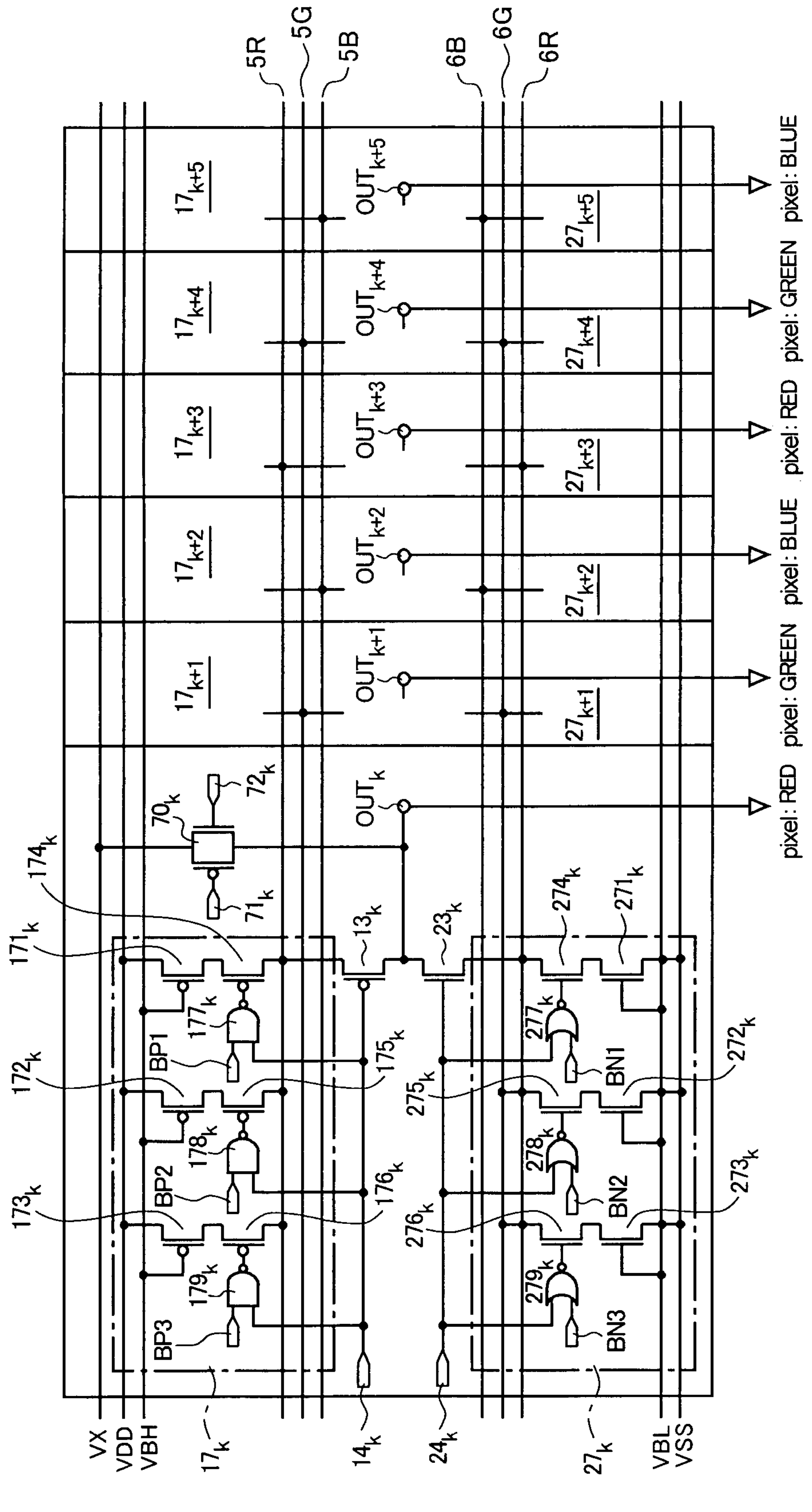
FIG. 14 is a configuration diagram of a seventh embodiment (a variation of the bipolar drive type) of the multichannel drive circuit according to the present invention.
Figure 15:
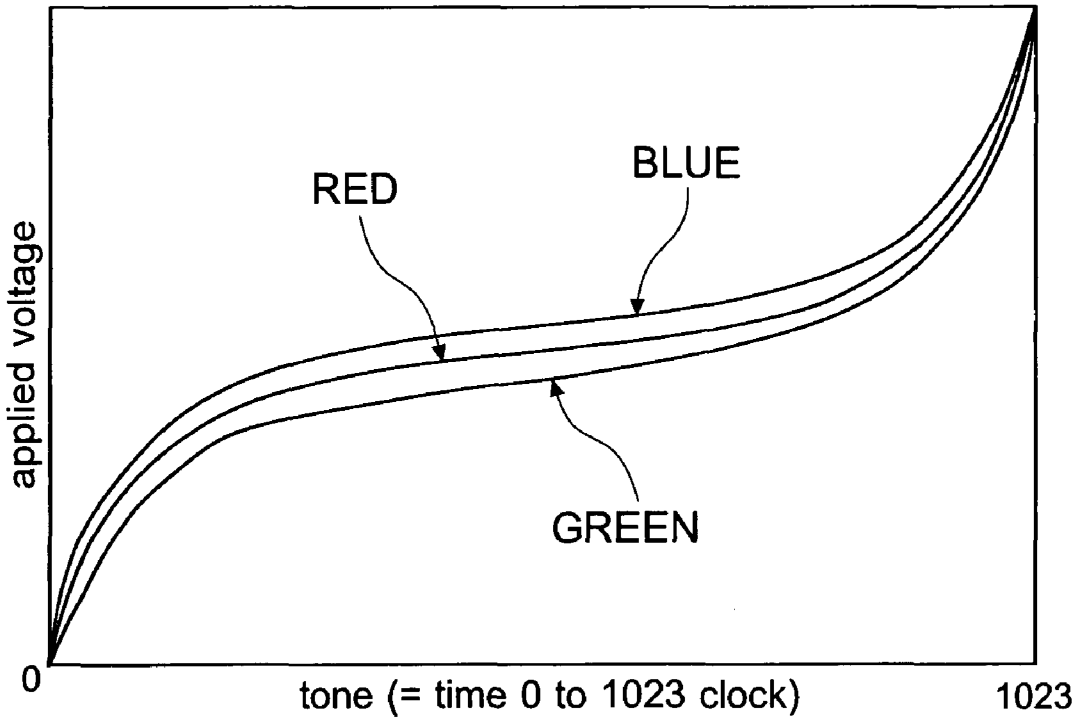
FIG. 15 is a graph illustrating a relationship between tone and applied voltage for each color of RGB.
Figure 16:
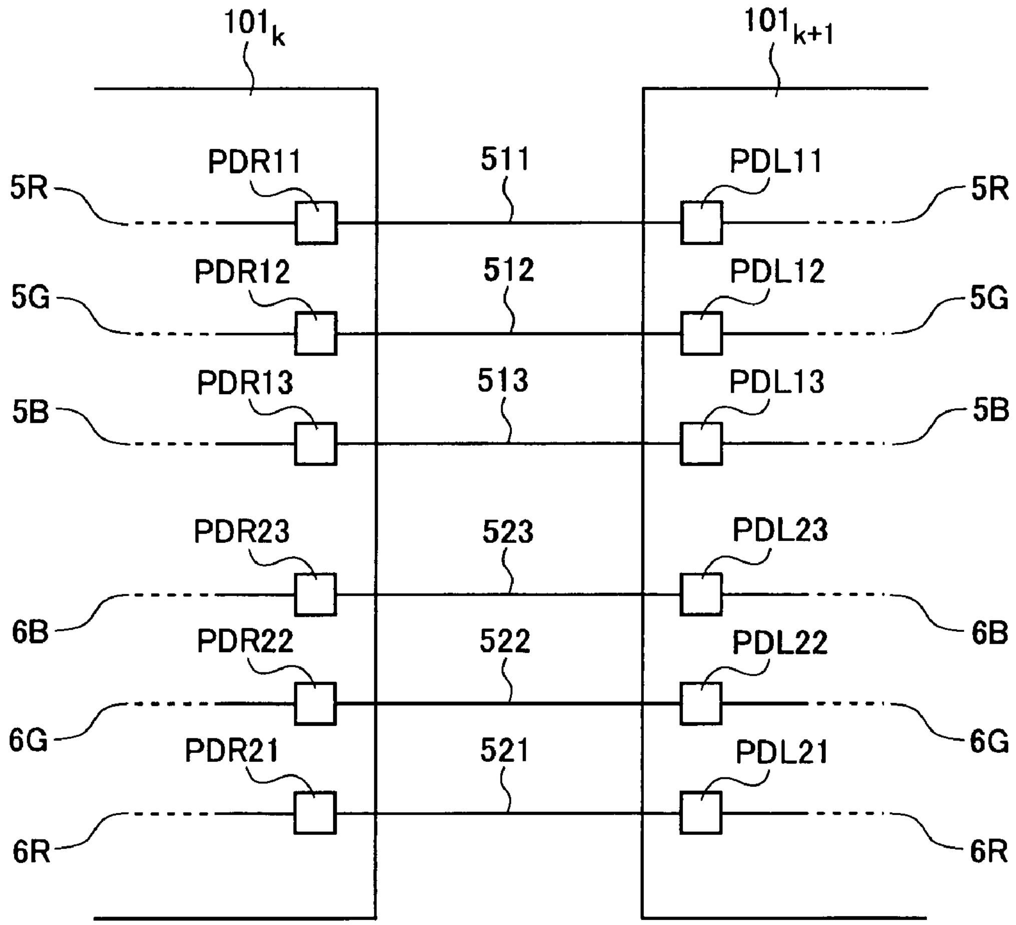
FIG. 16 is a view for explaining connection between chips in a case where there is a difference of gamma characteristic between colors RGB.
Figure 17:
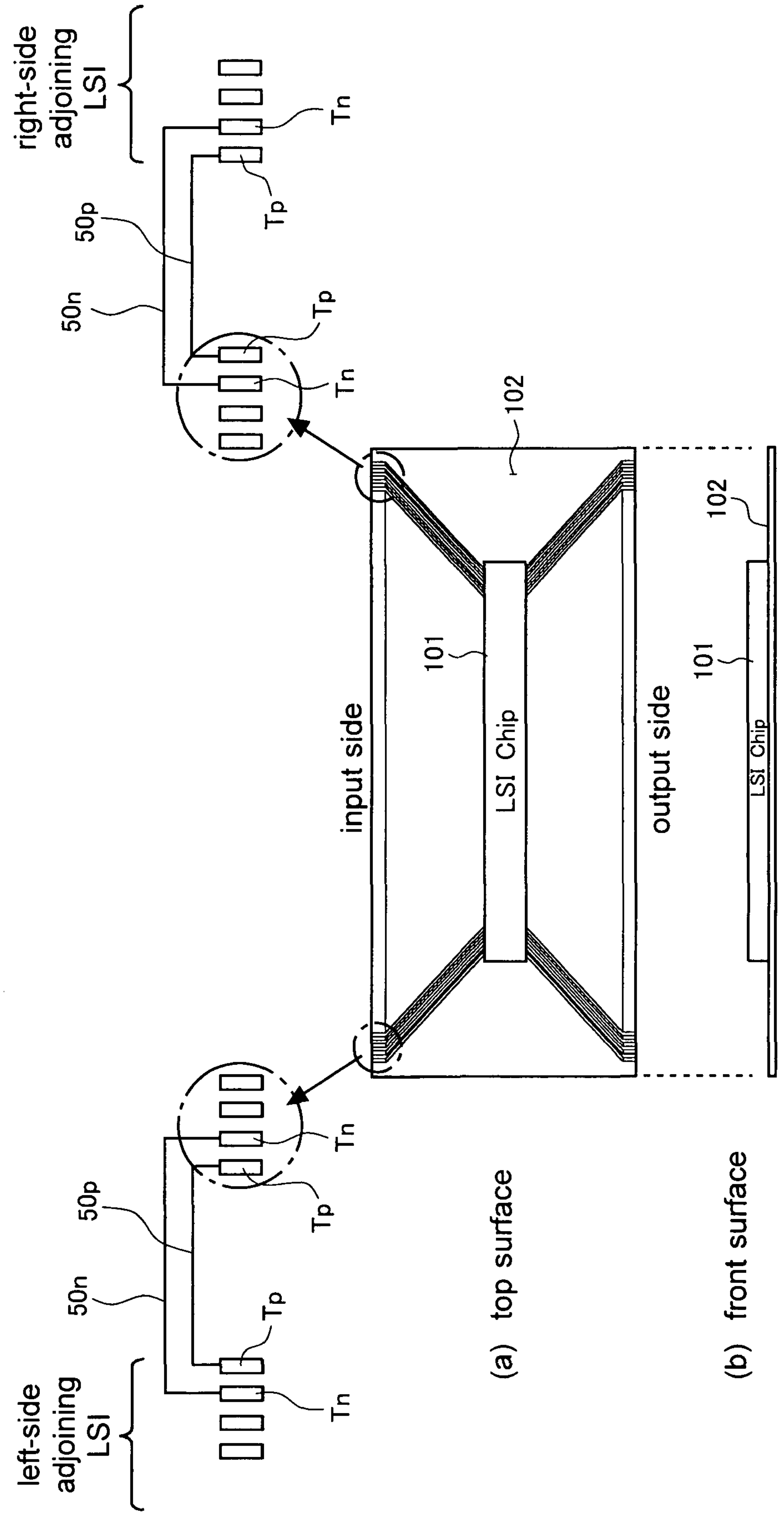
FIG. 17 is a view illustrating a layout of connection terminals between chips (in a case where the package is TCP or COP)
Figure 18:
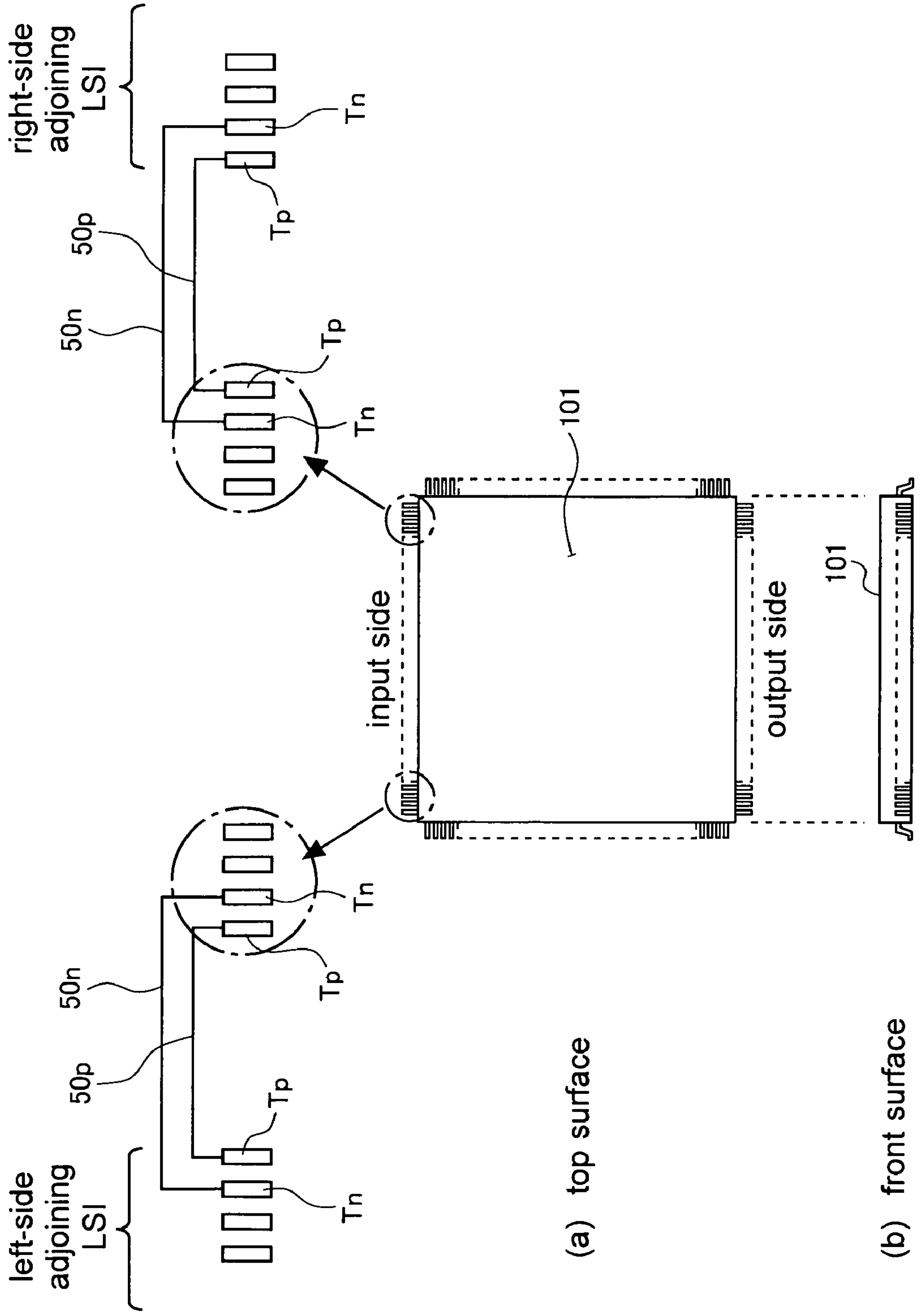
FIG. 18 is a view illustrating a layout of connection terminals between chips (in a case where the package is plastic or ceramic)
Figure 19:
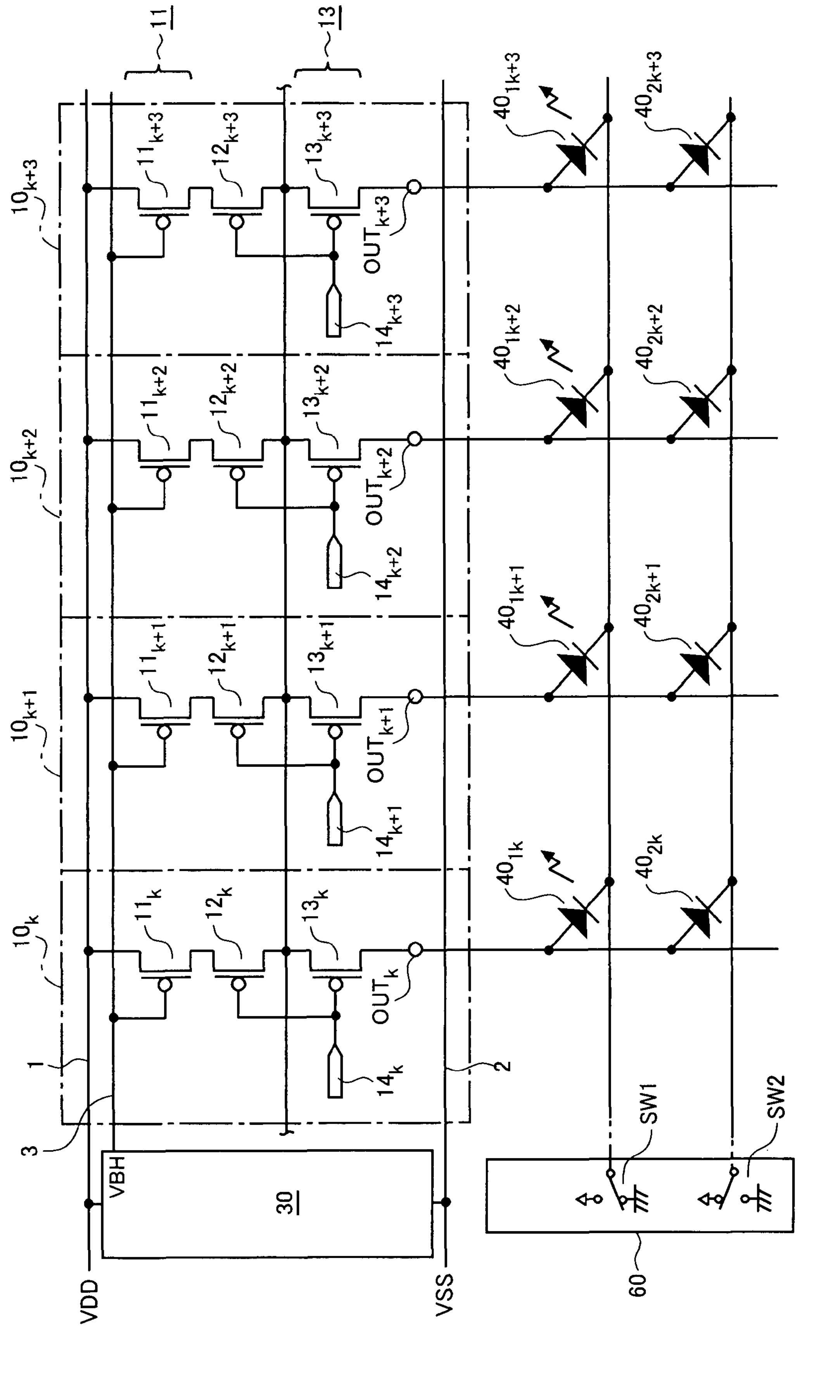
FIG. 19 is a view illustrating an example where the first embodiment of the multichannel drive circuit of the present invention is applied to an organic EL panel.
Figure 20:
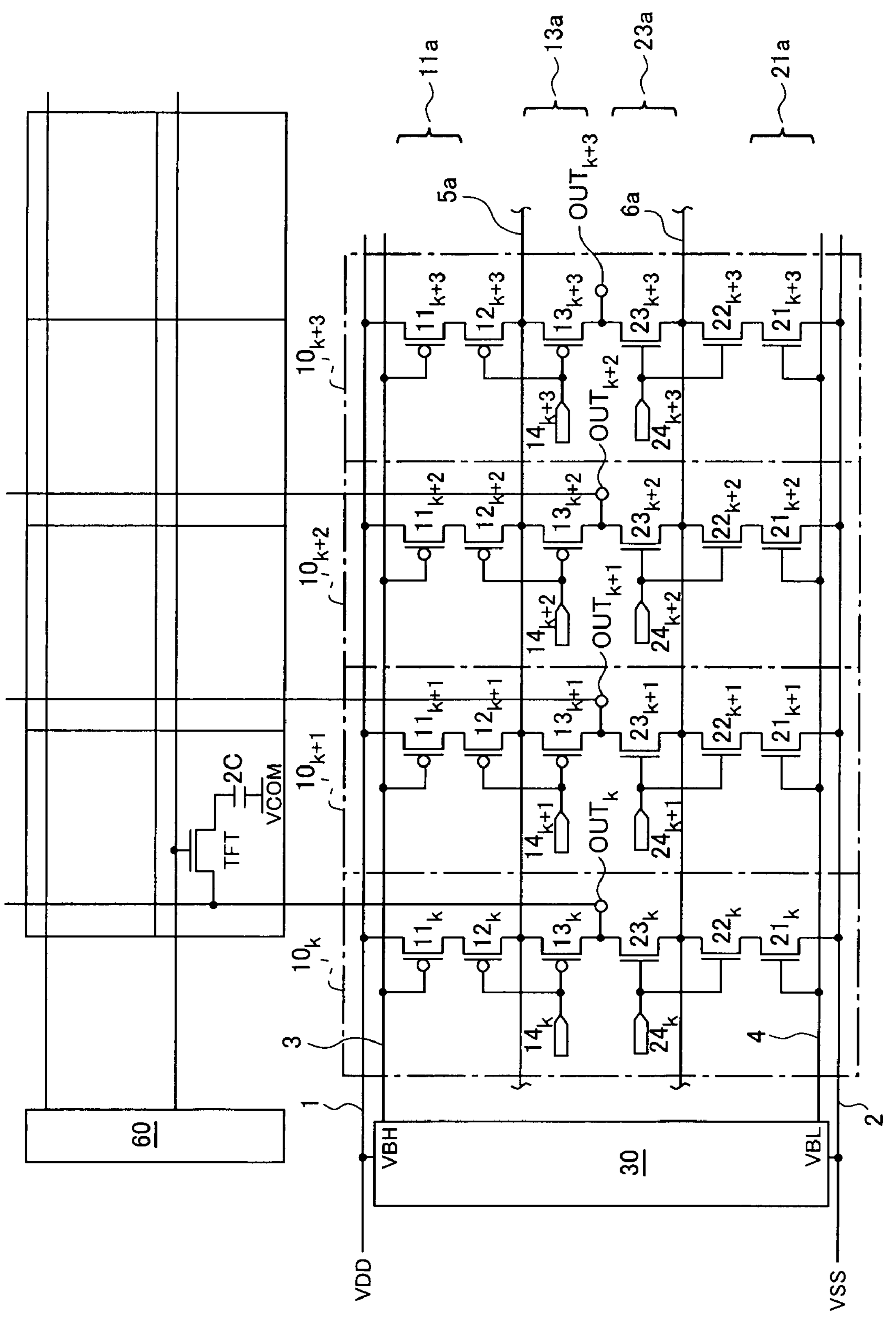
FIG. 20 is a view illustrating an example where the third embodiment of the multichannel drive circuit of the present invention is applied to a TFT liquid crystal panel.
Figure 21:
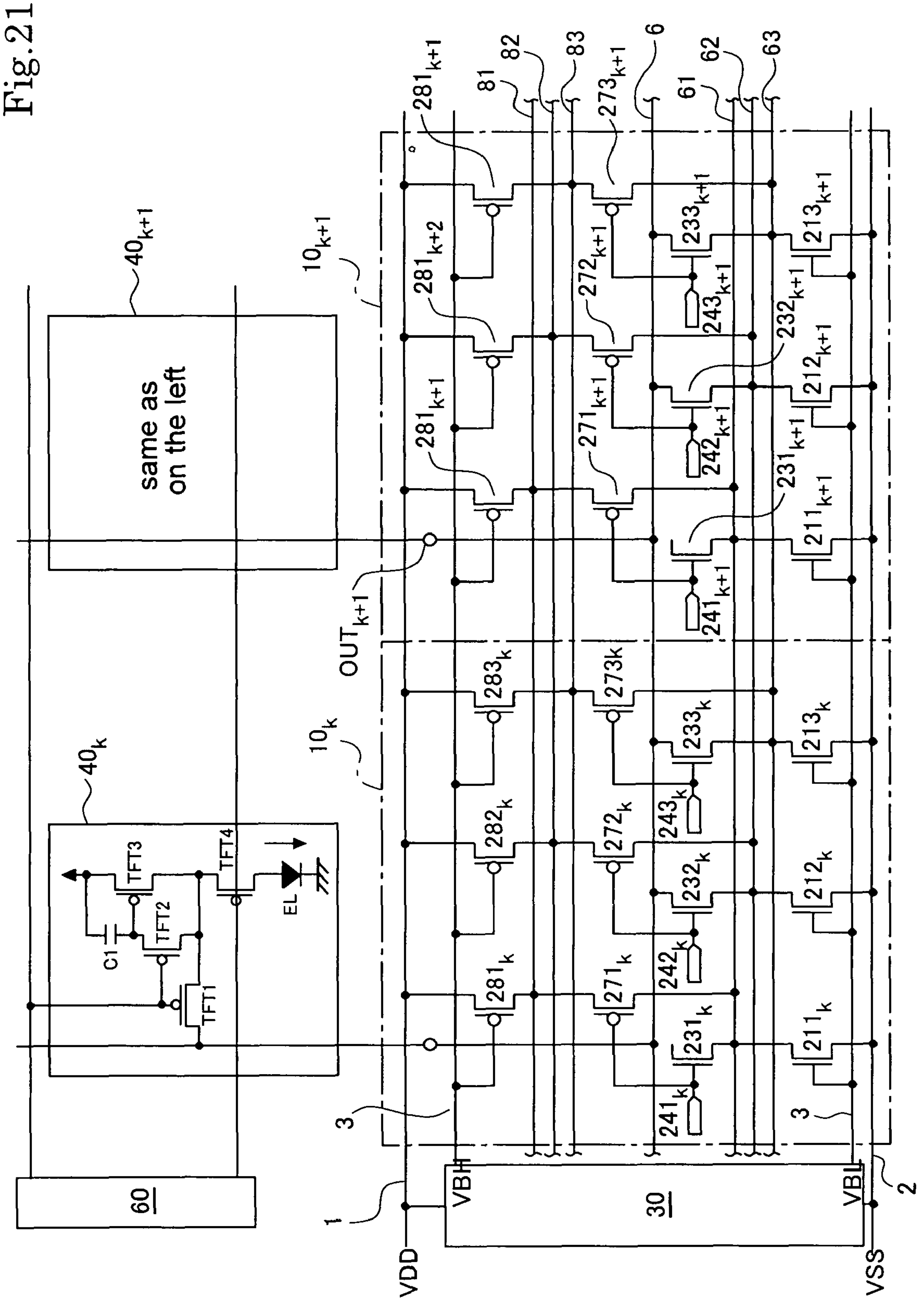
FIG. 21 is a view illustrating an example where a variation of the fifth embodiment of the multichannel drive circuit of the present invention is applied to an organic EL panel.
Figure 22:
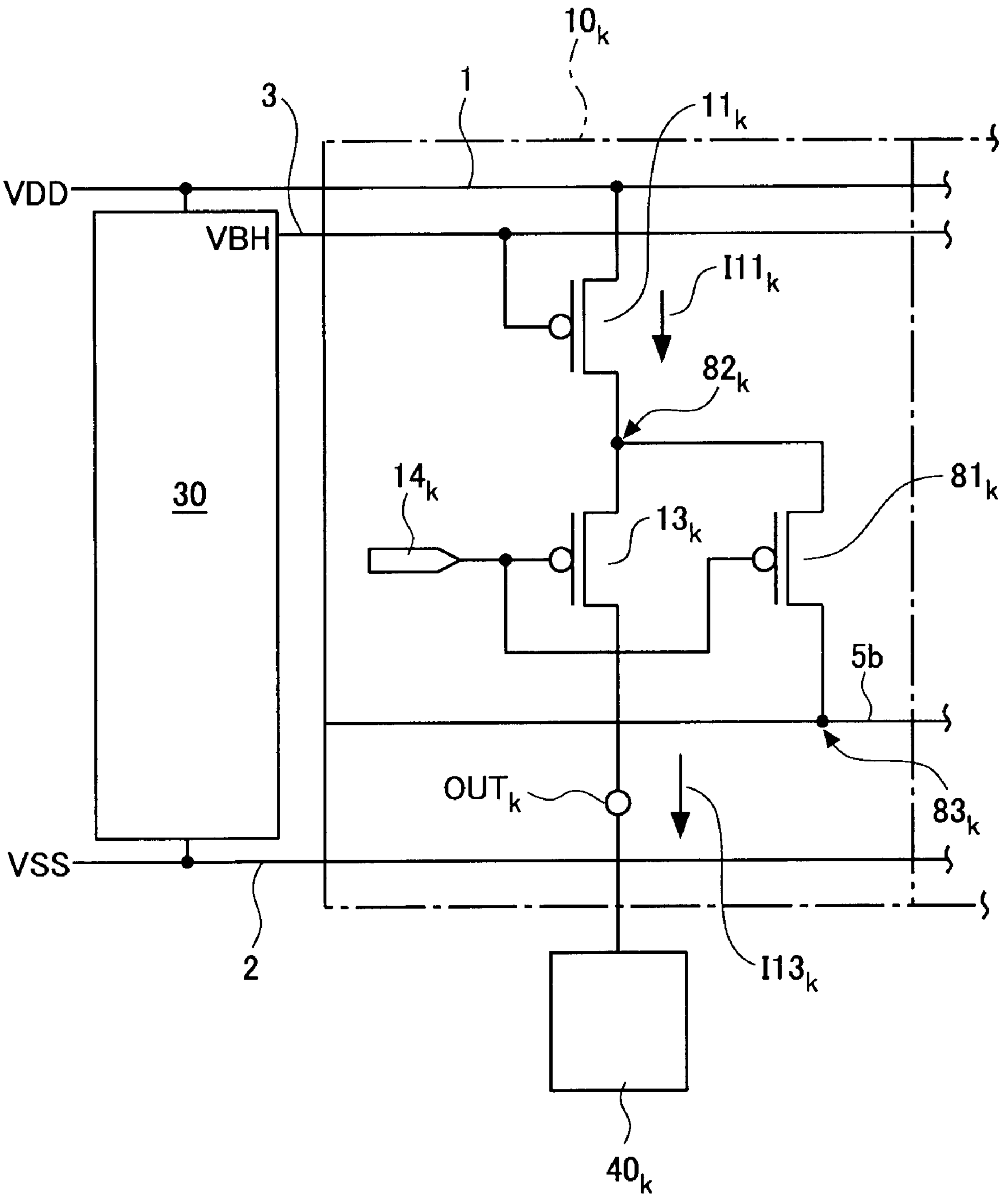
FIG. 22 is a view illustrating a variation of the first embodiment depicted in FIG. 1.
Figure 23:
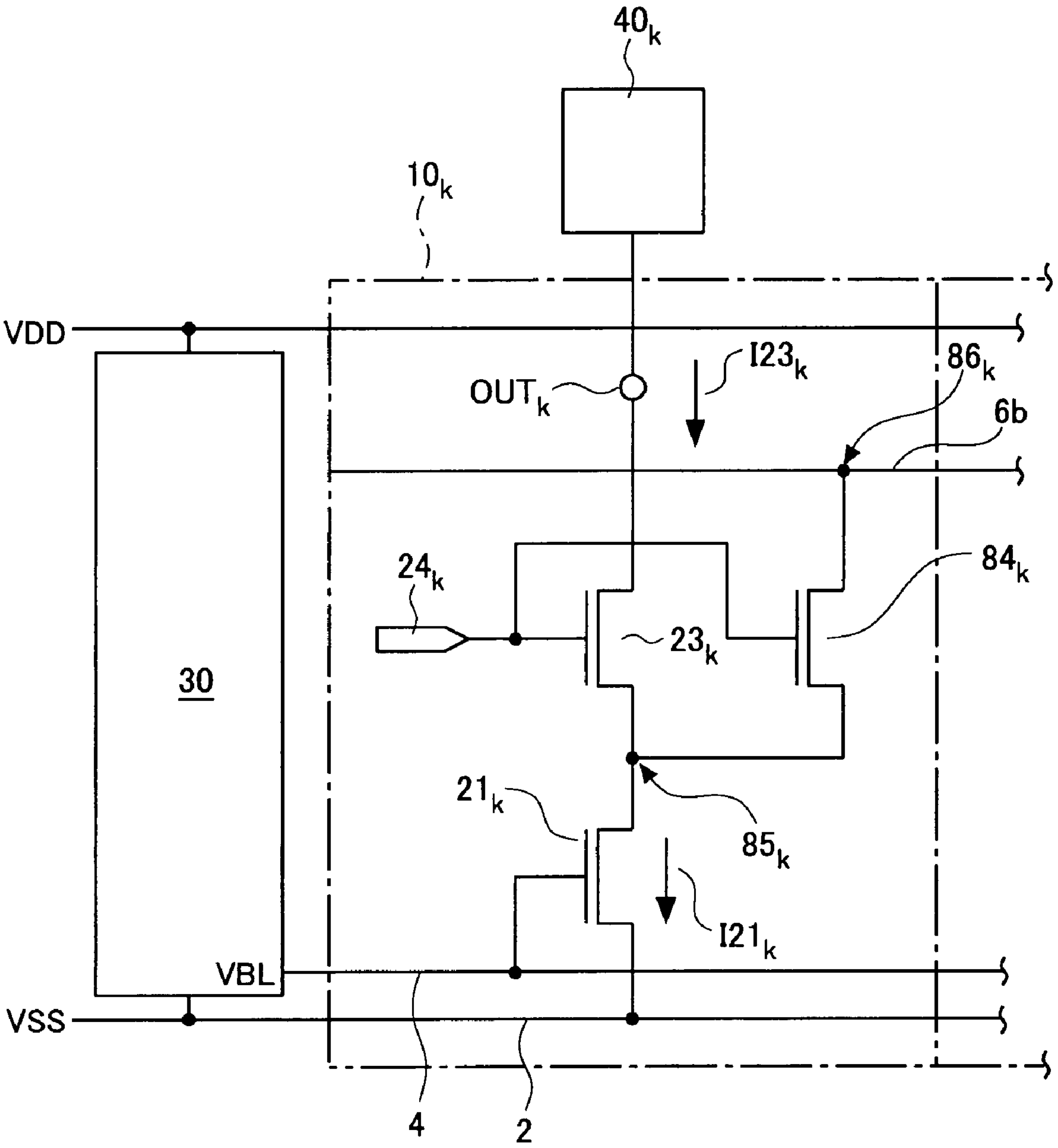
FIG. 23 is a view illustrating a variation of the second embodiment depicted in FIG. 6.
Figure 24:
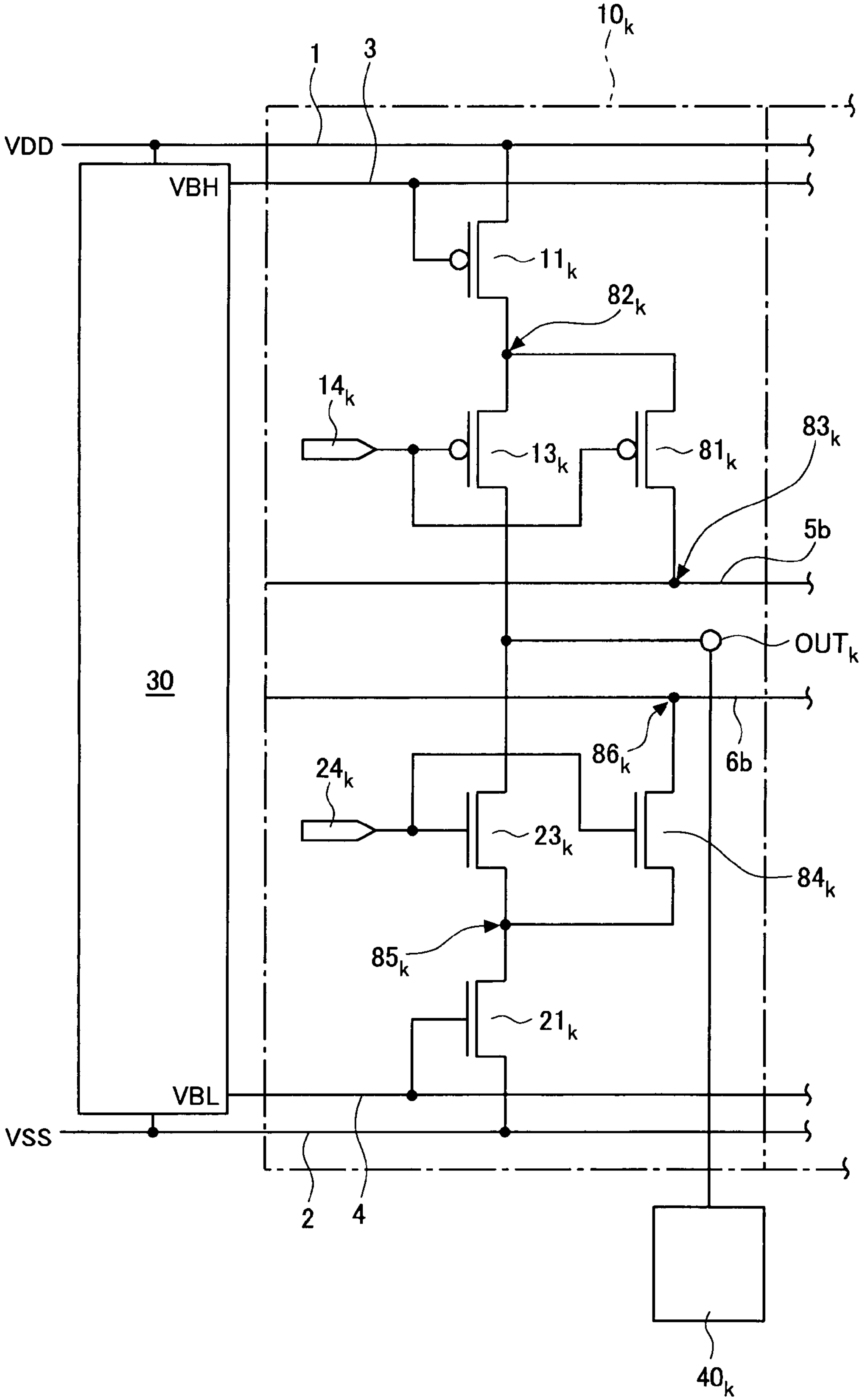
FIG. 24 is a view illustrating a variation of the third embodiment depicted in FIG. 7.
Figure 25:
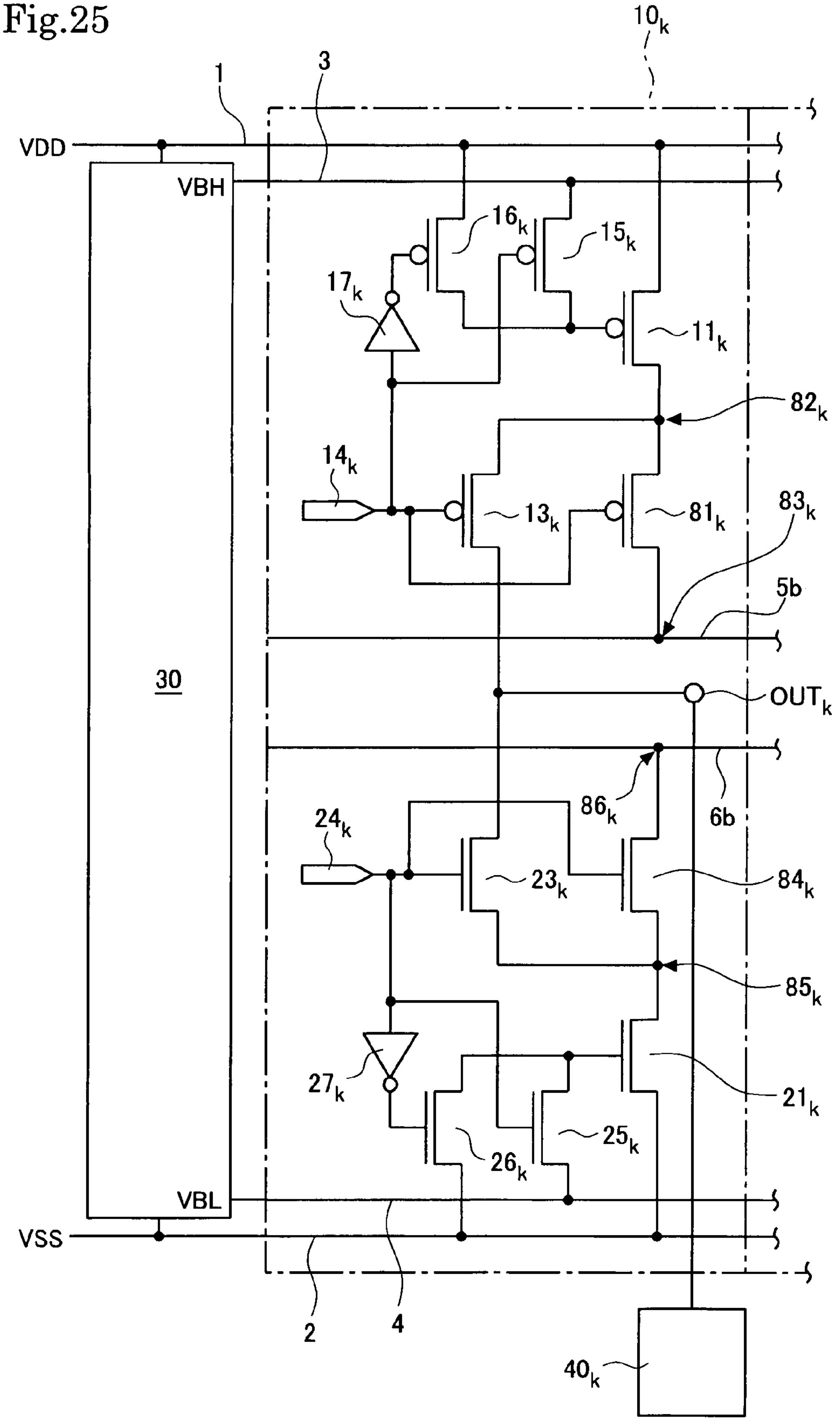
FIG. 25 is a view illustrating a variation of the fourth embodiment depicted in FIG. 8.
Figure 26:
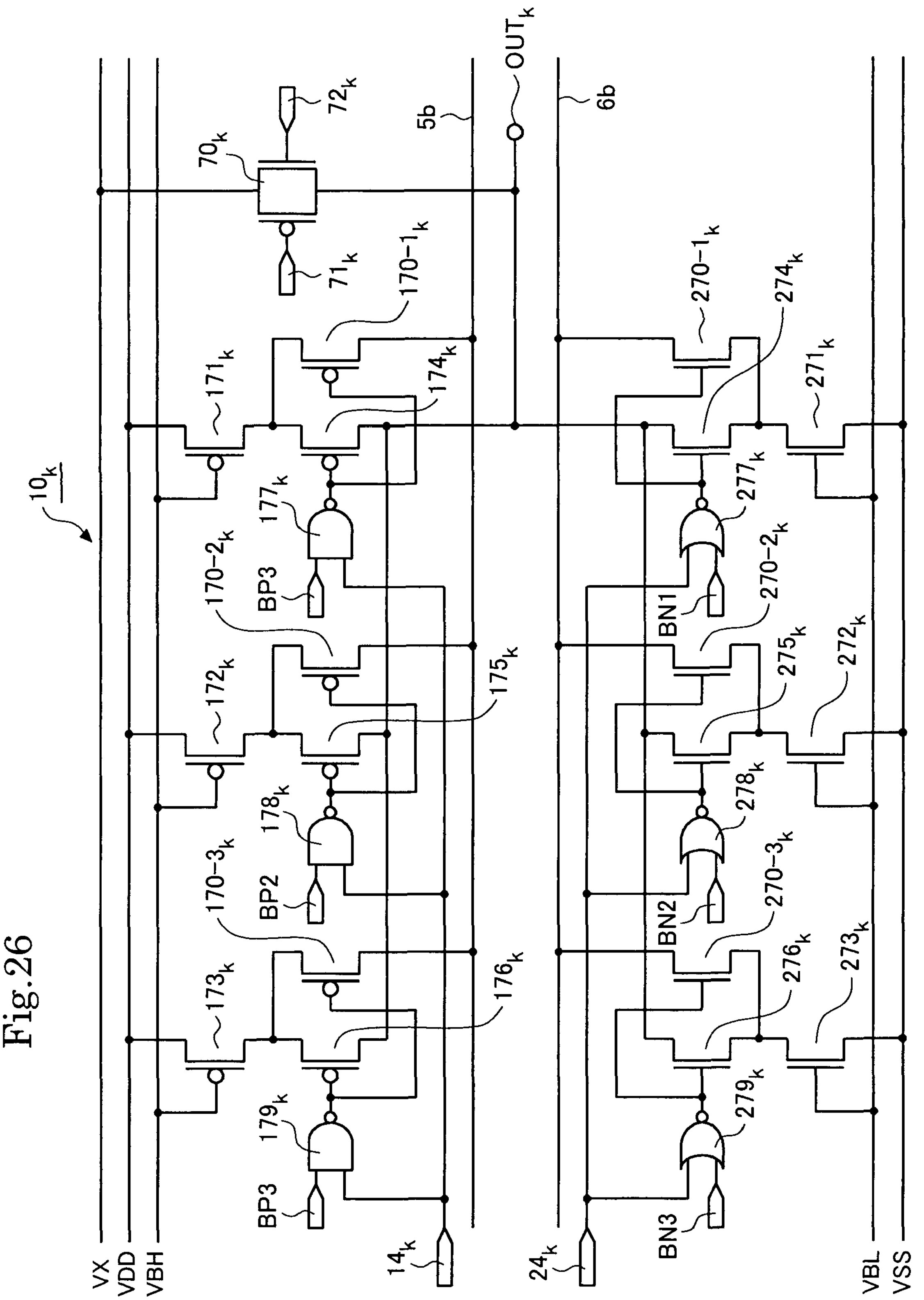
FIG. 26 is a view illustrating a variation of the sixth embodiment depicted in FIG. 10.
Figure 27:
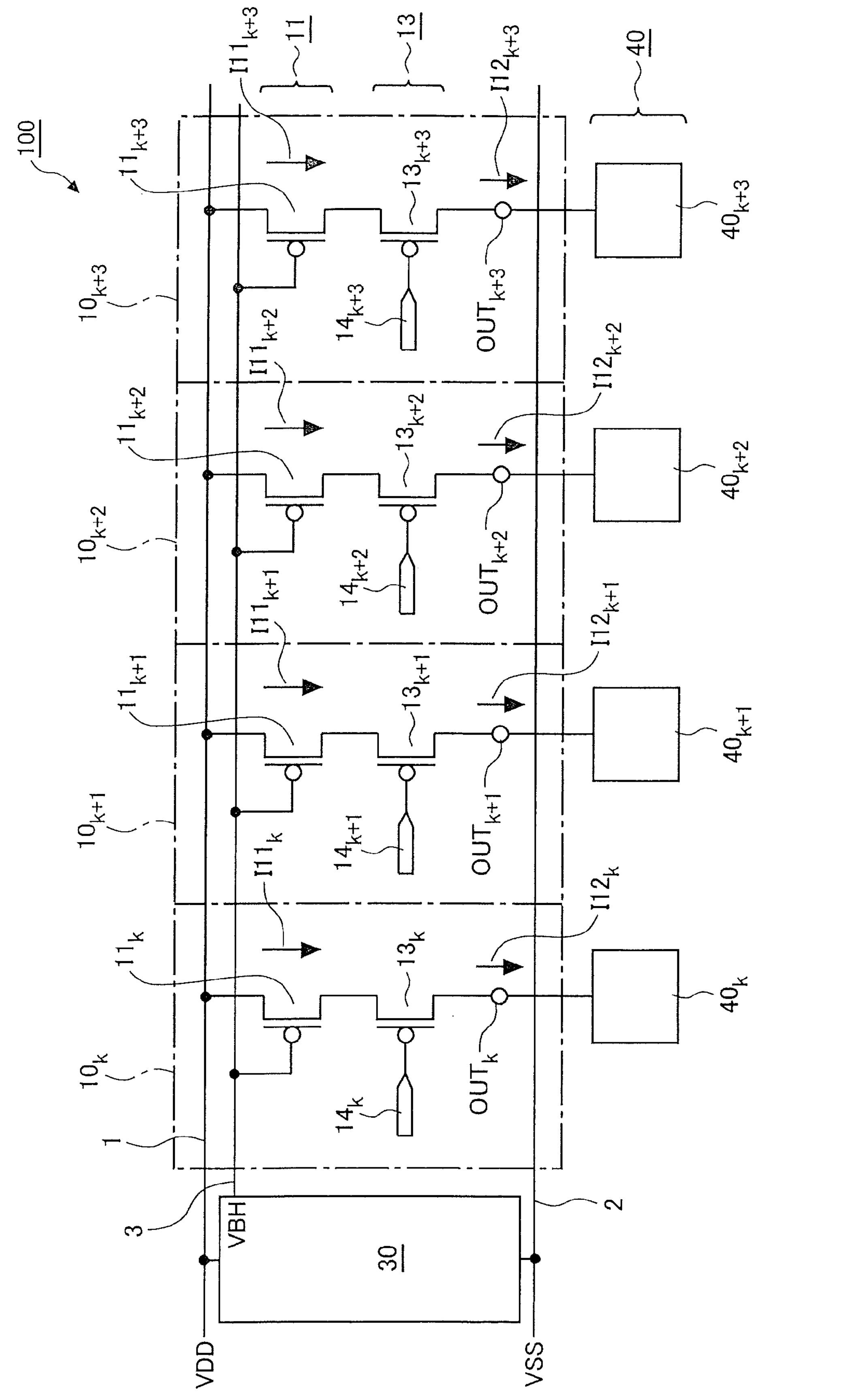
FIG. 27 is a configuration diagram (positive drive type) of a multichannel drive circuit of conventional art.
Figure 28:
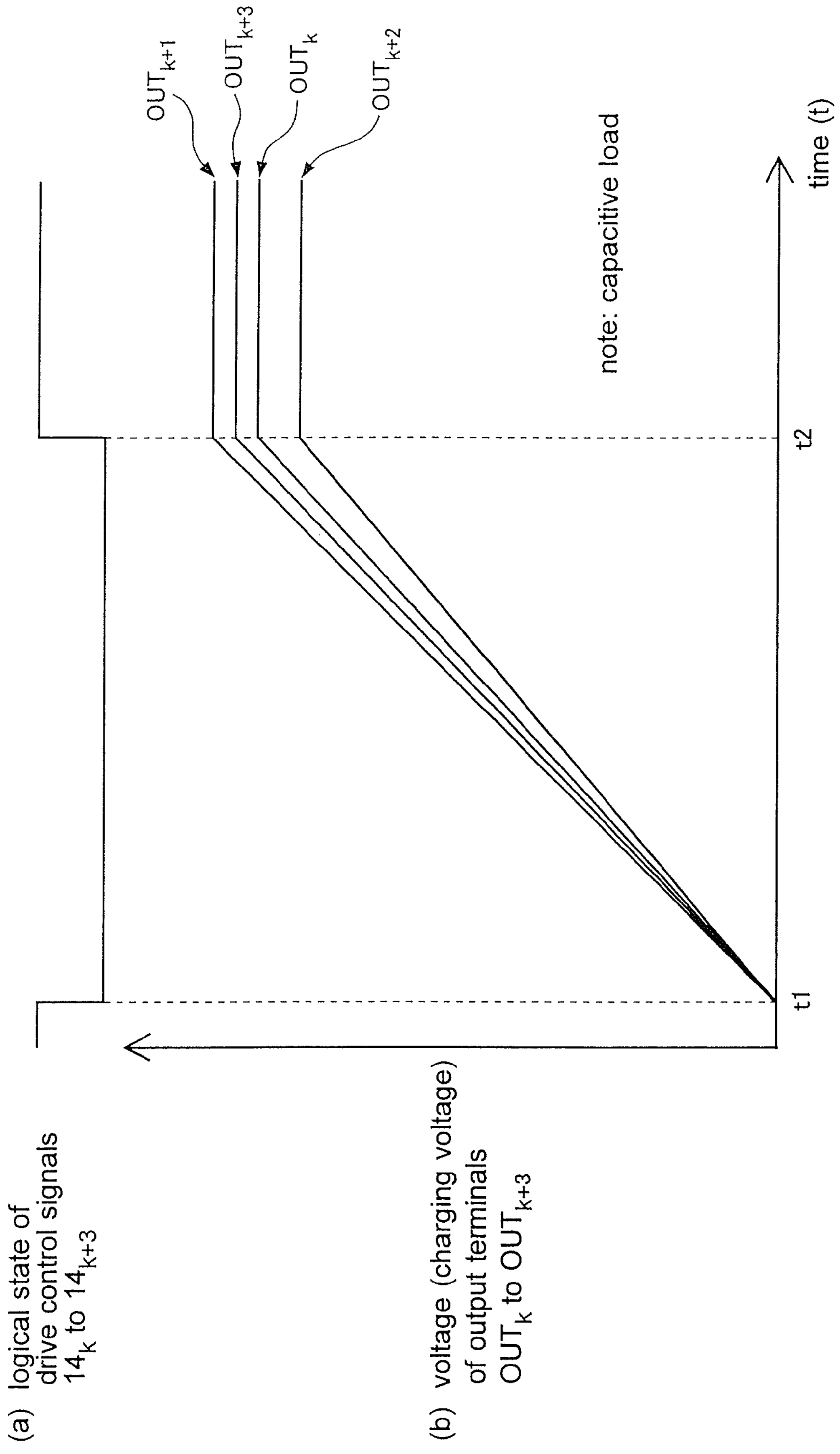
FIG. 28 is a view illustrating output characteristics (ON period being identical for all the channels) of the multichannel drive circuit of conventional art.

1 Positive side power source line
2 Negative side power source line
3 Positive side bias power source line
4 Negative side bias power source line
5 (Positive side) interchannel common connection line
5*a* Positive side interchannel common connection line
$\mathbf{5}_k$ to $\mathbf{5}_{k+3}$, $\mathbf{5}a_k$ to $\mathbf{5}a_{k+3}$ Connection point of (positive side) interchannel common connection line
5R, 5G, 5B Positive side interchannel common connection line arranged for each color of RGB
6 (Negative side) interchannel common connection line
6*a* Negative side interchannel common connection line
$\mathbf{6}_k$ to $\mathbf{6}_{k+3}$, $\mathbf{6}a_k$ to $\mathbf{6}a_{k+3}$ Connection point of (negative side) interchannel common connection line
6R, 6G, 6B Negative side interchannel common connection line arranged for each color RGB
7 Interchannel common connection line for discharge line
8 Pre-charge power source line
$\mathbf{10}_k$ to $\mathbf{10}_{k+3}$ Element circuit
11 (Positive side) current source array
$\mathbf{11}_k$ to $\mathbf{11}_{k+3}$ (Positive side) current source transistor
$\mathbf{12}_k$ to $\mathbf{12}_{k+3}$ (Positive side) current blocking switch transistor
13, 13*a* (Positive side) input switch array
$\mathbf{13}_k$ to $\mathbf{13}_{k+3}$ (Positive side) input switch transistor
$\mathbf{14}_k$ to $\mathbf{14}_{k+3}$ (Positive side) switch control signal
$\mathbf{15}_k$ to $\mathbf{15}_{k+3}$ (Positive side) bias switch transistor
$\mathbf{16}_k$ to $\mathbf{16}_{k+3}$ (Positive side) cutoff switch transistor
17 Positive side modulation type current source array
$\mathbf{17}_k$ to $\mathbf{17}_{k+3}$ Positive side modulation type current source
$\mathbf{18}_k$ to $\mathbf{18}_{k+3}$ Current discharging switch transistor
$\mathbf{19}_k$ to $\mathbf{19}_{k+3}$ Dummy load current source transistor
21, 21*a* (Negative side) current source array
$\mathbf{21}_k$ to $\mathbf{21}_{k+3}$ (Negative side) current source transistor
$\mathbf{22}_k$ to $\mathbf{22}_{k+3}$ (Negative side) current blocking switch transistor
23 (Negative side) input switch array
$\mathbf{23}_k$ to $\mathbf{23}_{k+3}$ (Negative side) input switch transistor
$\mathbf{24}_k$ to $\mathbf{24}_{k+3}$ (Negative side) switch control signal
$\mathbf{25}_k$ to $\mathbf{25}_{k+3}$ (Negative side) bias switch transistor
$\mathbf{26}_k$ to $\mathbf{26}_{k+3}$ (Negative side) cutoff switch transistor
27 Negative side modulation type current source array
$\mathbf{27}_k$ to $\mathbf{27}_{k+3}$ Negative side modulation type current source
30 Bias power source circuit
$\mathbf{37}_k$ to $\mathbf{37}_{k+3}$ Inverter
40 Load array

40$_k$ to 40$_{k+3}$ Load
47$_k$ to 47$_{k+3}$ Inverter
50 Connection conductor
50*n* Negative side connection conductor
50*p* Positive side connection conductor
60 Scanning driver
61, 62, 63 Interchannel common connection line arranged for each weighting value
70$_k$ to 70$_{k+1}$ Pre-charge analog switch
81$_k$ Positive side supplementary transistor
82$_k$, 83$_k$ Connection point
84$_k$ Negative side supplementary transistor
100 Multichannel drive circuit
101, 101$_{k-1}$, 101$_k$, 101$_{k+1}$ IC chip
102 Package
170-1$_k$ to 3$_k$ Positive side supplementary transistor
171$_k$ to 171$_{k+1}$, 172$_k$ to 172$_{k+1}$, 173$_k$ to 173$_{k+1}$ Current source transistor arranged for each weighting value
174$_k$ to 174$_{k+1}$, 175$_k$ to 175$_{k+1}$, 176$_k$ to 176$_{k+1}$ Current blocking switch transistor arranged for each weighting value
177$_k$ to 177$_{k+1}$, 178$_k$ to 178$_{k+1}$, 179$_k$ to 179$_{k+1}$ NAND gate arranged for each weighting value
270-1$_k$ to 3$_k$ Negative side supplementary transistor
271$_k$ to 271$_{k+1}$, 272$_k$ to 272$_{k+1}$, 273$_k$ to 273$_{k+1}$ Current source transistor arranged for each weighting value
274$_k$ to 274$_{k+1}$, 275$_k$ to 275$_{k+1}$, 276$_k$ to 276$_{k+1}$ Current blocking switch transistor arranged for each weighting value
277$_k$ to 277$_{k+1}$, 278$_k$ to 278$_{k+1}$, 279$_k$ to 279$_{k+1}$ NAND gate arranged for each weighting value
511, 512, 513 Positive side connection conductor arranged for each color RGB
521, 522, 523 Negative side connection conductor arranged for each color RGB
BP1 to BP3 Positive side weighting value selection signal
BN1 to BN3 Negative side weighting value selection signal
I11$_k$ to I11$_{k+3}$ Set current of (positive side) current source transistor
I13$_k$ to I13$_{k+3}$ Load current
OUT$_k$ to OUT$_{k+3}$ Output terminal
PDL Left side connection pad
PDL21, PDL22, PDL23 Left side connection pad of negative side
PDR Right side connection pad
PDR11, PDR12, PDR23 Right side connection pad of positive side
Tp Positive side external connection terminal
Tn Negative side external connection terminal
V$_k$ to V$_{k+3}$ Potential of output terminal
VBH Positive side bias power source
VBL Negative side bias power source
VDD Positive side power source
VSS Negative side power source
Vx Pre-charge power source

The invention claimed is:

1. A multichannel drive circuit comprising:
a current source array including a plurality of current sources corresponding respectively to a plurality of channels; and
an input switch array including a plurality of input switches corresponding respectively to the plurality of channels,
wherein electric power is supplied via the respective input switches of each channel constituting the input switch array to respective loads of each channel constituting a load array by the respective current sources of each channel constituting the current source array,
the multichannel drive circuit characterized by including:
an interchannel common connection line for making conduction between respective current paths of each channel for connecting the respective current sources of each channel constituting the current source array with the respective input switches of each channel constituting the input switch array; and
current blocking means for blocking output current of the current source of that channel of the plurality of channels in which the input switch is in an OFF state from flowing into the interchannel common connection line.

2. The multichannel drive circuit according to claim 1, characterized in that:
the current source array includes: a positive side current source array including a plurality of positive side current sources corresponding respectively to the plurality of channels; and a negative side current source array including a plurality of negative side current sources corresponding respectively to the plurality of channels;
the input switch array includes: a positive side input switch array including a plurality of positive side input switches corresponding respectively to the plurality of channels; and a negative side input switch array including a plurality of negative side input switches corresponding respectively to the plurality of channels;
positive side supplying of electric power to the respective loads of each channel constituting the load array is performed via the respective positive side input switches of each channel constituting the positive side input switch array by the respective positive side current sources of each channel constituting the positive side current source array and at the same time, negative side supplying of electric power to the respective loads of each channel constituting the load array is performed via the respective negative side input switches of each channel constituting the negative side input switch by the respective negative side current sources of each channel constituting the negative side current source array;
the interchannel common connection line includes: a positive side interchannel common connection line for making conduction between respective current paths of each channel for connecting the respective positive side current sources of each channel constituting the positive side current source array with the respective positive side input switches of each channel constituting the positive side input switch array; and a negative side interchannel common connection line for making conduction between respective current paths of each channel for connecting the respective negative side current sources of each channel constituting the negative side current source array with the respective negative side input switches of each channel constituting the negative side input switch array; and
the current blocking means includes: positive side current blocking means for blocking output current of the positive side current source of that channel of the plurality of channels in which the positive side input switch is in an OFF state from flowing into the interchannel common connection line; and negative side current blocking means for blocking output current of the negative side current source of that channel of the plurality of channels in which the negative side input switch is in an OFF state from flowing into the interchannel common connection line.

3. The multichannel drive circuit according to claim 2, characterized in that, when the input switch is in an OFF state, the current blocking means is configured to block current from flowing in the current path for connecting the current source with the interchannel common connection line.

4. The multichannel drive circuit according to claim 2, characterized in that, when the input switch is in an OFF state, the current blocking means is configured to cause current flowing in the current source to bypass the input switch to be discharged.

5. The multichannel drive circuit according to claim 1, characterized in that:

the loads of each channel constituting the load array are constituted of three capacitive pixels corresponding respectively to colors R, G and B;

the current sources of each channel constituting the current source array are constituted of a current source for applying gamma correction to the R pixel, a current source for applying gamma correction to the G pixel, and a current source for applying gamma correction to the B pixel; and the interchannel common connection line includes: a first interchannel common connection line for making connection between the current sources for applying gamma correction to the R pixels; a second interchannel common connection line for making connection between the current sources for applying gamma correction to the G pixels; a third interchannel common connection line for making connection between the current sources for applying gamma correction to the B pixels.

6. The multichannel drive circuit according to claim 5, characterized in that, when the input switch is in an OFF state, the current blocking means is configured to block current from flowing in the current path for connecting the current source with the interchannel common connection line.

7. The multichannel drive circuit according to claim 5, characterized in that, when the input switch is in an OFF state, the current blocking means is configured to disable the current source.

8. The multichannel drive circuit according to claim 5, characterized in that, when the input switch is in an OFF state, the current blocking means is configured to cause current flowing in the current source to bypass the input switch to be discharged.

9. The multichannel drive circuit according to claim 1, characterized in that:

the current sources of each channel constituting the current source array are constituted of a plurality of unit current sources having a different weighting value, and unit switches made to lie in respective outputs paths of the unit current sources, and output currents of the unit current sources selected via these unit switches are added to generate a desired set current value and at the same time, each unit switch turns on/off according to a programmed procedure as time passes, whereby there is implemented a modulation type current source in which the set current value varies as time passes, while exhibiting a certain profile; further, the interchannel common connection line is constituted of a plurality of interchannel common connection lines, arranged for each weighting value, and making connection between the unit current sources having the same weighting value.

10. The multichannel drive circuit according to claim 9, characterized in that, when the input switch is in an OFF state, the current blocking means is configured to block current from flowing in the current path for connecting the current source with the interchannel common connection line.

11. The multichannel drive circuit according to claim 9, characterized in that, when the input switch is in an OFF state, the current blocking means is configured to disable the current source.

12. The multichannel drive circuit according to claim 1, characterized in that, when the input switch is in an OFF state, the current blocking means is configured to block current from flowing in the current path for connecting the current source with the interchannel common connection line.

13. The multichannel drive circuit according to claim 2, characterized in that, when the input switch is in an OFF state, the current blocking means is configured to disable the current source.

14. The multichannel drive circuit according to claim 1, characterized in that, when the input switch is in an OFF state, the current blocking means is configured to disable the current source.

15. The multichannel drive circuit according to claim 1, characterized in that, when the input switch is in an OFF state, the current blocking means is configured to cause current flowing in the current source to bypass the input switch to be discharged.

16. A semiconductor integrated device acting as a multichannel drive circuit, the device characterized by comprising:

a current source array including a plurality of current sources corresponding respectively to a plurality of channels;

an external terminal array including a plurality of external terminals for connecting a plurality of loads corresponding respectively to a plurality of channels;

an input switch array including a plurality of input switches, made to lie between the current source array and the external terminal array, and corresponding respectively to the plurality of channels;

an interchannel common connection line for making conduction between respective current paths of each channel for connecting the respective current sources of each channel constituting the current source array with the respective input switches of each channel constituting the input switch array; and current blocking means for blocking output current of the current source of that channel of the plurality of channels in which the input switch is in an OFF state from flowing into the interchannel common connection line, wherein the interchannel common connection line has a sufficiently large width, and a low-resistance metal substance such as aluminum is used as a material thereof.

17. The semiconductor integrated device according to claim 16, characterized in that a semiconductor chip constituting the multichannel load drive circuit is housed in a predetermined package and at the same time, the package is provided with an external terminal for withdrawing the interchannel common connection line to the outside.

* * * * *